United States Patent
Lee et al.

(10) Patent No.: US 9,711,523 B2
(45) Date of Patent: Jul. 18, 2017

(54) SEMICONDUCTOR DEVICES

(71) Applicant: SAMSUNG ELECTRONICS CO., LTD., Suwon-si, Gyeonggi-do (KR)

(72) Inventors: Jeonggil Lee, Hwaseong-si (KR); Yeon-Sil Sohn, Yongin-si (KR); Woonghee Sohn, Seoul (KR); Kihyun Yoon, Hwaseong-si (KR); Myoungbum Lee, Seoul (KR); Tai-Soo Lim, Seoul (KR); Yong Chae Jung, Suwon-si (KR)

(73) Assignee: Samsung Electronics Co., Ltd., Suwon-Si, Gyeonggi-do (KR)

(*) Notice: Subject to any disclaimer, the term of this patent is extended or adjusted under 35 U.S.C. 154(b) by 221 days.

(21) Appl. No.: 14/574,456

(22) Filed: Dec. 18, 2014

(65) Prior Publication Data
US 2015/0249093 A1 Sep. 3, 2015

(30) Foreign Application Priority Data
Mar. 3, 2014 (KR) .................. 10-2014-0025105

(51) Int. Cl.
*H01L 27/11582* (2017.01)
(52) U.S. Cl.
CPC .............. *H01L 27/11582* (2013.01)
(58) Field of Classification Search
CPC ............................. H01L 27/11582
See application file for complete search history.

(56) References Cited

U.S. PATENT DOCUMENTS

| | | | |
|---|---|---|---|
| 7,821,058 B2 | 10/2010 | Kidoh et al. | |
| 7,847,342 B2 | 12/2010 | Fukuzumi et al. | |
| 8,163,617 B2 | 4/2012 | Ahn | |
| 8,309,417 B2 | 11/2012 | Son et al. | |
| 8,426,276 B2 | 4/2013 | Kito et al. | |
| 2002/0020861 A1* | 2/2002 | Ohmi | H01L 21/84 257/268 |
| 2011/0062510 A1 | 3/2011 | Joo | |
| 2012/0012920 A1 | 1/2012 | Shin et al. | |
| 2012/0070944 A1* | 3/2012 | Kim | H01L 27/0688 438/128 |
| 2012/0146122 A1 | 6/2012 | Whang et al. | |

* cited by examiner

*Primary Examiner* — Errol Fernandes
(74) *Attorney, Agent, or Firm* — Lee & Morse, P.C.

(57) ABSTRACT

Provided is a semiconductor device, including gate structures on a substrate, the gate structures extending parallel to a first direction and being spaced apart from each other by a separation trench interposed therebetween, each of the gate structures including insulating patterns stacked on the substrate and a gate electrode interposed therebetween; vertical pillars connected to the substrate through the gate structures; an insulating spacer in the separation trench covering a sidewall of each of the gate structures; and a diffusion barrier structure between the gate electrode and the insulating spacer.

11 Claims, 52 Drawing Sheets

SEMICONDUCTOR DEVICES

CROSS-REFERENCE TO RELATED APPLICATION

Korean Patent Application No. 10-2014-0025105, filed on Mar. 3, 2014, in the Korean Intellectual Property Office, and entitled: "Semiconductor Devices," is incorporated by reference herein in its entirety.

BACKGROUND

1. Field

Example embodiments relate to semiconductor devices, for example, to vertical-type semiconductor devices.

2. Description of the Related Art

Higher integration of semiconductor devices may be desired to satisfy demands for superior performance and inexpensive prices. For example, integration of semiconductor devices may affect product prices. Integration of typical two-dimensional or planar semiconductor memory devices may be determined by the area occupied by a unit memory cell, and integration of the two-dimensional or planar semiconductor devices may be strongly influenced by fine pattern forming technology. Process equipment for increasing pattern fineness may be very expensive, and may set a practical limitation on increasing integration for two-dimensional or planar semiconductor devices.

SUMMARY

Embodiments are directed to a semiconductor device, including gate structures on a substrate, the gate structures extending parallel to a first direction and being spaced apart from each other by a separation trench interposed therebetween, each of the gate structures including insulating patterns stacked on the substrate and a gate electrode interposed therebetween; vertical pillars connected to the substrate through the gate structures; an insulating spacer in the separation trench covering a sidewall of each of the gate structures; and a diffusion barrier structure between the gate electrode and the insulating spacer.

The diffusion barrier structure may include an air gap between the gate electrode and the insulating spacer.

The diffusion barrier structure may include a metal nitride layer.

The metal nitride layer may be on a side surface of the gate electrode facing the insulating spacer.

The gate electrode may include a material containing a first element, and the metal nitride layer includes nitride of the first element.

The diffusion barrier structure may include an insulating layer exhibiting an etch rate lower than a silicon oxide layer in a wet etching process.

The diffusion barrier structure may include a silicon nitride layer, an aluminum oxide layer, or an aluminum nitride layer.

The device may further include a common source region in a portion of the substrate located below the separation trench and a strapping plug in the separation trench extending from the common source region to a top level of the gate structures. The insulating spacer may be between the sidewalls of the gate structures and the strapping plug.

The strapping plug may be a bar-shaped structure extending in the first direction, when viewed in a plan view.

The strapping plug may include a metal nitride layer and a tungsten layer on the metal nitride layer.

The insulating spacer may include a silicon oxide layer, a silicon oxynitride layer, a silicon nitride layer, and/or an aluminum oxide layer.

The gate electrode may include a conductive layer.

The conductive layer may have a side surface that is laterally spaced apart from sidewalls of the insulating patterns.

The conductive layer may include a barrier layer and a layer that is made of metal silicide or tungsten and is in contact with the barrier layer.

The diffusion barrier structure may have a portion that is farther from the sidewalls of the insulating patterns than a side surface of the barrier layer adjacent to the sidewalls of the insulating patterns.

The diffusion barrier structure may be self-aligned with the gate electrode.

Embodiments are directed to a method of fabricating a semiconductor device, including forming gate structures and vertical pillars on a substrate, the gate structures extending parallel to a first direction and being spaced apart from each other by a separation trench formed therebetween, each of the gate structures including insulating patterns stacked on the substrate and a gate electrode interposed between the insulating patterns, the vertical pillars penetrating the gate structures being connected to the substrate; forming an insulating spacer on a sidewall of each of the gate structures; and forming a diffusion barrier structure between the gate electrode and the insulating spacer.

Forming the gate structures may include forming insulating layers stacked on the substrate and a sacrificial layer between the insulating layers; forming the vertical pillars penetrating the insulating layers and the sacrificial layer and being connected to the substrate; patterning the insulating layers and the sacrificial layer to form the separation trench defining the insulating patterns and sacrificial pattern and exposing the substrate; removing the sacrificial pattern exposed by the separation trench to form a gate region; and forming a gate electrode in the gate region.

Forming the gate electrode may include forming a conductive layer in the separation trench and the gate region; and removing the conductive layer from an outside of the gate region.

Forming the conductive layer may include forming a silicon layer in the gate region; forming a metal layer on the silicon layer; performing a first thermal treatment process to form a first metal silicide layer; and forming the insulating spacer on sidewalls of the first metal silicide layer and the separation trench.

Forming the diffusion barrier structure may include performing a second thermal treatment process to transform the first metal silicide layer to a second metal silicide layer, whose volume is smaller than that of the first metal silicide layer, and to form an air gap between the second metal silicide layer and the insulating spacer.

A concentration of a metallic element of the metal layer may be higher in the first metal silicide layer than in the second metal silicide layer.

The metal silicide layers may include a first element, which is one of Ni, Co, Ti, or W.

Forming the first metal silicide layer may include forming a first metal silicide layer on the silicon layer; and forming the second metal silicide layer on the first metal silicide layer.

Forming the diffusion barrier structure may include horizontally etching the gate electrode to form a recessed region that is recessed from a sidewall of the separation trench toward the vertical pillars; forming a silicon oxide layer in the recessed region; and performing a thermal treatment process on the silicon oxide layer to form an air gap between the gate electrode and the silicon oxide layer.

The silicon oxide layer may exhibit a volume-shrinkable property in the thermal treatment process.

Forming the diffusion barrier structure may include horizontally etching the gate electrode to form a recessed region that is recessed from a sidewall of the separation trench toward the vertical pillars; forming a sacrificial layer in the recessed region; forming the insulating spacer on the sacrificial layer; and removing the sacrificial layer through the insulating spacer to form an air gap between the gate electrode and the insulating spacer.

The sacrificial layer may be a spin-on hardmask (SOH) layer or a photoresist layer, and the insulating spacer may be a silicon oxide layer.

Forming the diffusion barrier structure may include performing a nitridation process on selectively a side surface of the gate electrode exposed by the separation trench.

The nitridation process may include performing a thermal treatment in an ambient of ammonia, nitrogen, or nitrous oxide gas.

Forming the diffusion barrier structure may include forming an aluminum oxide layer, a silicon nitride layer, or an aluminum nitride layer on a sidewall of the gate electrode exposed by the separation trench.

Forming the gate structures may include forming doped silicon layers stacked on the substrate and an undoped silicon layer between the doped silicon layers; forming the vertical pillars penetrating the doped silicon layers and the undoped silicon layer and being connected to the substrate; patterning the doped silicon layers and the undoped silicon layer to form the separation trench exposing the substrate; removing the doped silicon layers exposed by the separation trench to form an insulating region; and forming an intergate insulating pattern in the insulating region.

Embodiments are directed to a semiconductor device, including gate structures on a substrate, the gate structures extending parallel to a first direction and being spaced apart from each other by a separation trench interposed therebetween, each of the gate structures including insulating patterns stacked on the substrate and a gate electrode interposed between the insulating patterns; a plurality of cell pillars penetrating the gate structures and being connected to the substrate; an impurity diffusion region in the substrate exposed by the separation trench; a strapping plug in the separation trench extending from the impurity diffusion region to a top level of the gate structures; and an insulating spacer between the strapping plug and sidewalls of the gate structures exposed by the separation trench, the gate electrode being spaced apart from sidewalls of the insulating patterns adjacent to the separation trench.

Embodiments are directed to a semiconductor device, including vertical stacks of alternating insulating patterns and electrodes on a substrate; pillars connected to the substrate through the stacks; a trench interposed horizontally between the stacks; an insulator in the trench covering a sidewall of each of the stacks; and a spacer between each electrode and the insulator.

The spacer may include silicon nitride, aluminum oxide, an aluminum nitride, or may be empty.

The insulator may includes one or more of silicon oxide, silicon oxynitride, silicon nitride, and aluminum oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
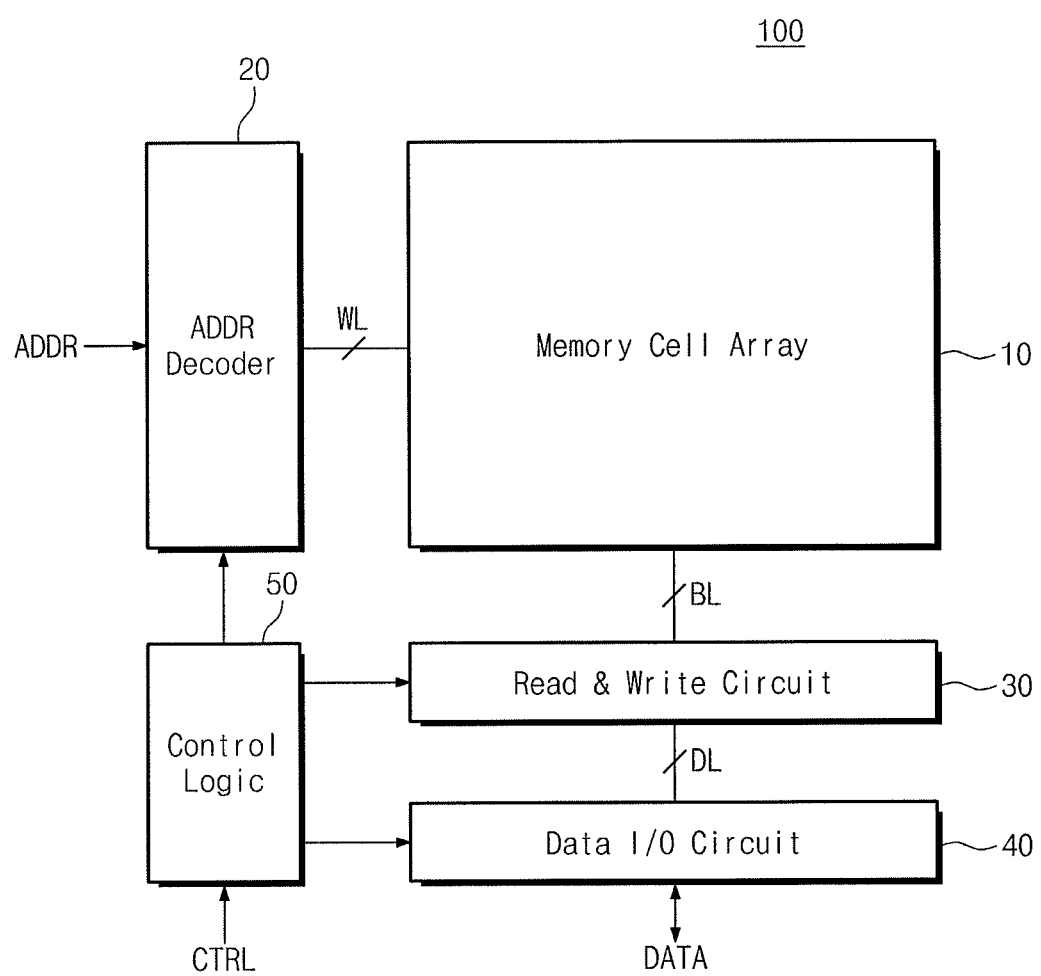
FIG. 1 illustrates a block diagram of a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a block diagram of a semiconductor device according to example embodiments. Referring to FIG. 1, a semiconductor device according to embodiments may include a memory cell array 10, an address decoder 20, a read/write circuit 30, a data input/output circuit 40, and a control logic 50.

The memory cell array 10 may be connected to the address decoder 20 via a plurality of word lines WL, and be connected to the read/write circuit 30 via a plurality of bit lines BL. The memory cell array 10 includes a plurality of memory cells. For example, the memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder and address buffer.

The read/write circuit 30 may be connected to the memory cell array 10 via the bit line BL, and be connected to the data input/output circuit 40 via the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include a sensing amplifier, a write driver and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 controls the operation of a 3D semiconductor device. The control logic 50 may operate in response to a control signal CTRL transferred from the outside.

Figure 2:
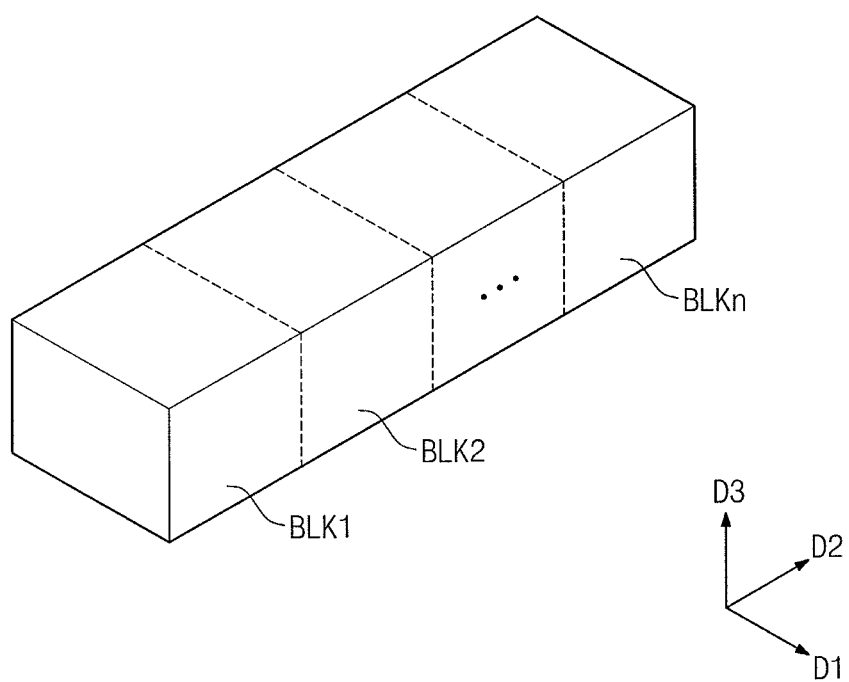
FIG. 2 illustrates a block diagram of an example of a memory cell array of FIG. 1.

FIG. 2 illustrates a block diagram of an example of the memory cell array 10 of FIG. 1. Referring to FIG. 2, the memory cell array 10 may include a plurality of memory blocks BLK1 to BLKn. Each of the memory blocks BLK1 to BLKn may have a 3D structure (or a vertical structure). For example, each of the memory blocks BLK1 to BLKn may include structures that are extended in first to third directions intersecting each other. For example, each of the memory blocks BLK1 to BLKn includes a plurality of cell strings that are extended in the third direction.

Figure 3:
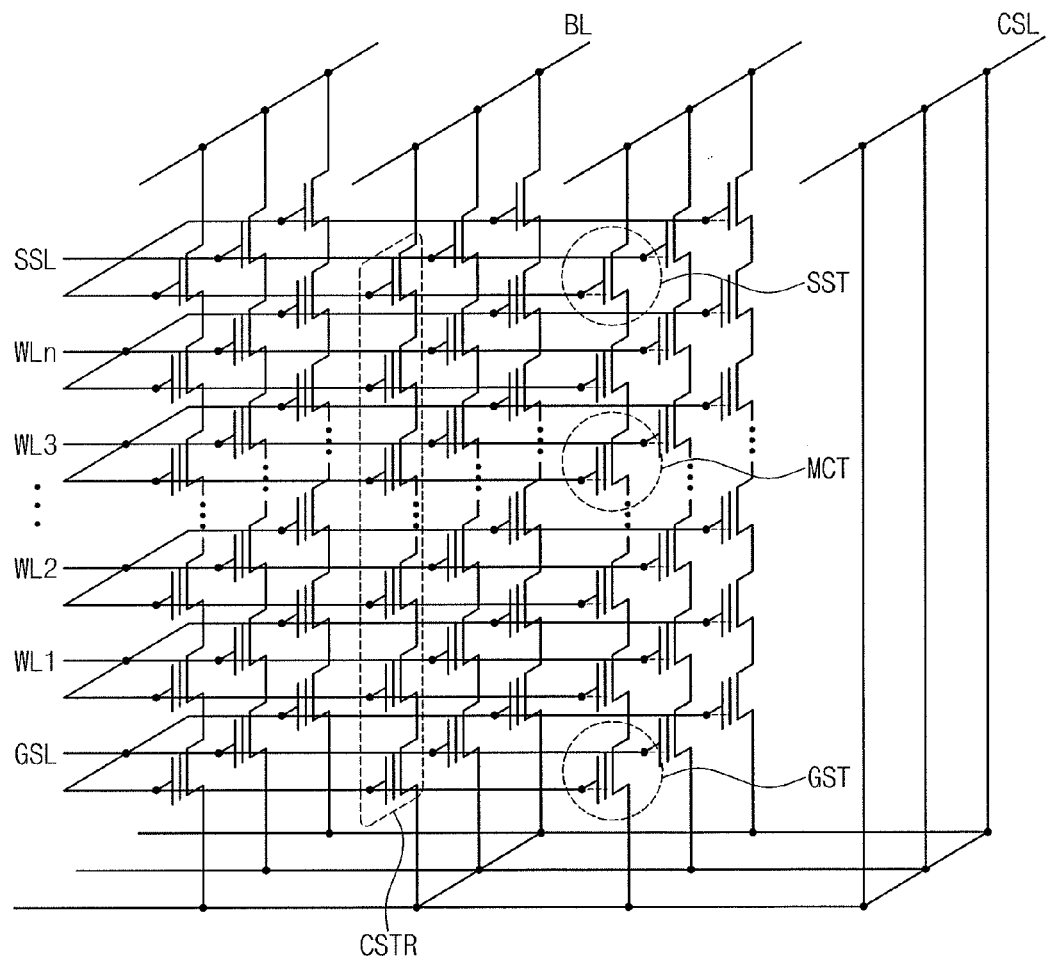
FIG. 3 illustrates a circuit diagram of an example of the semiconductor devices of FIGS. 1 and 2.

FIG. 3 illustrates a circuit diagram of an example of the semiconductor devices of FIGS. 1 and 2. Referring to FIGS. 1 through 3, the semiconductor device may include a common source line CSL, bit lines BL, and a plurality of cell strings CSTR provided between the common source line CSL and the bit lines BL. The cell strings CSTR may be connected in parallel to each of the bit lines BL.

Each of the cell strings CSTR may include a ground selection transistor GST coupled to the common source line CSL, a string selection transistor SST coupled to the bit line BL, and a plurality of memory cell transistors MCT provided between the selection transistors GST and SST. The ground selection transistor GST, the memory cell transistors MCT, and the string selection transistor SST may be connected in series between the common source line CSL and the bit line BL. The semiconductor device may include a ground selection line GSL, a plurality of word lines WL1-WLn, and a string selection line SSL, which may be used as gate electrodes of the ground selection transistor GST, the memory cell transistors MCT, and the string selection transistor SST.

Figure 4A:
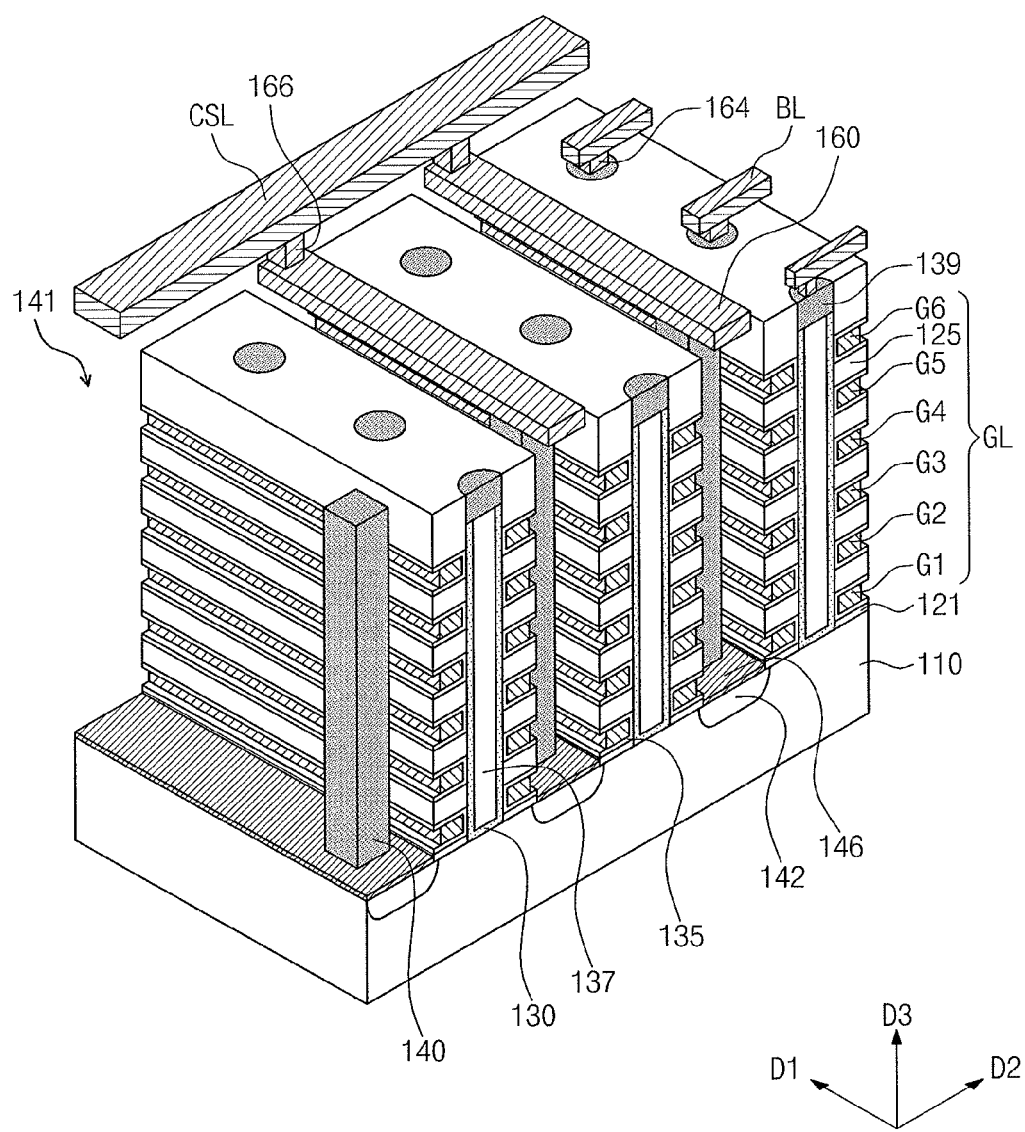
FIGS. 4A and 4B illustrate perspective and plan views of a semiconductor device according to example embodiments.
Figure 4B:
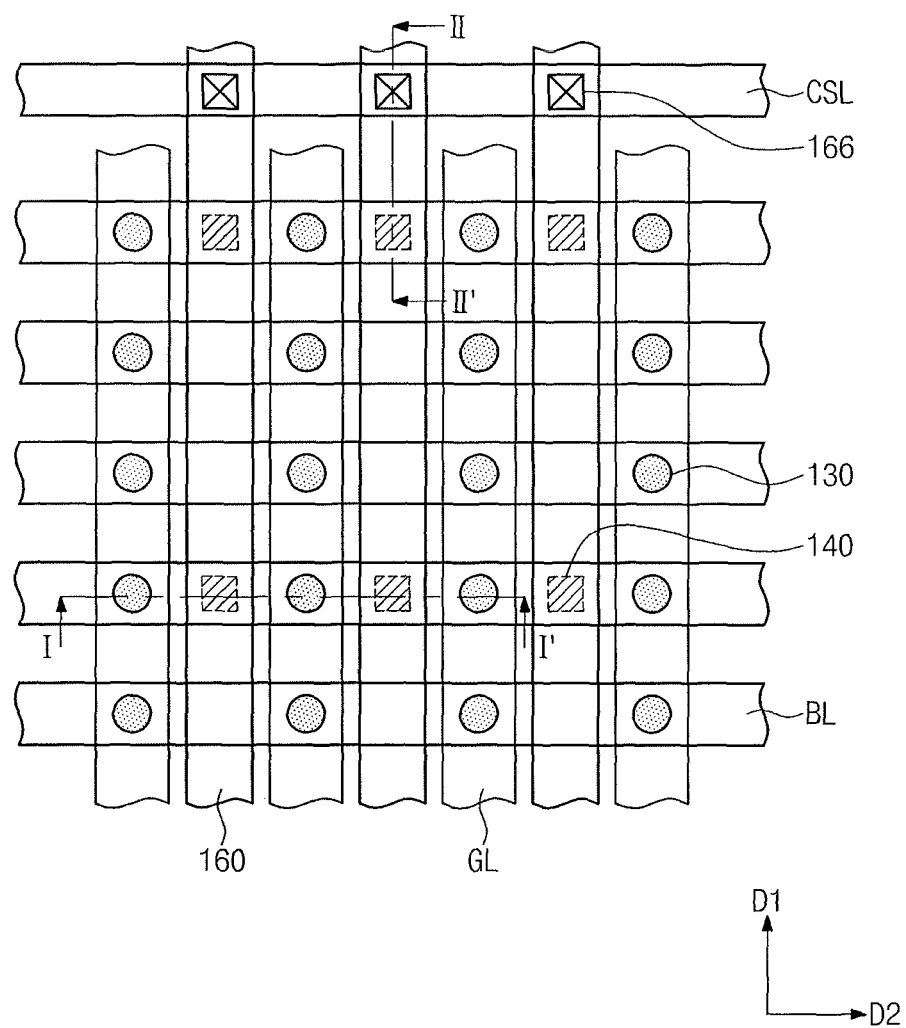
Figure 4C:
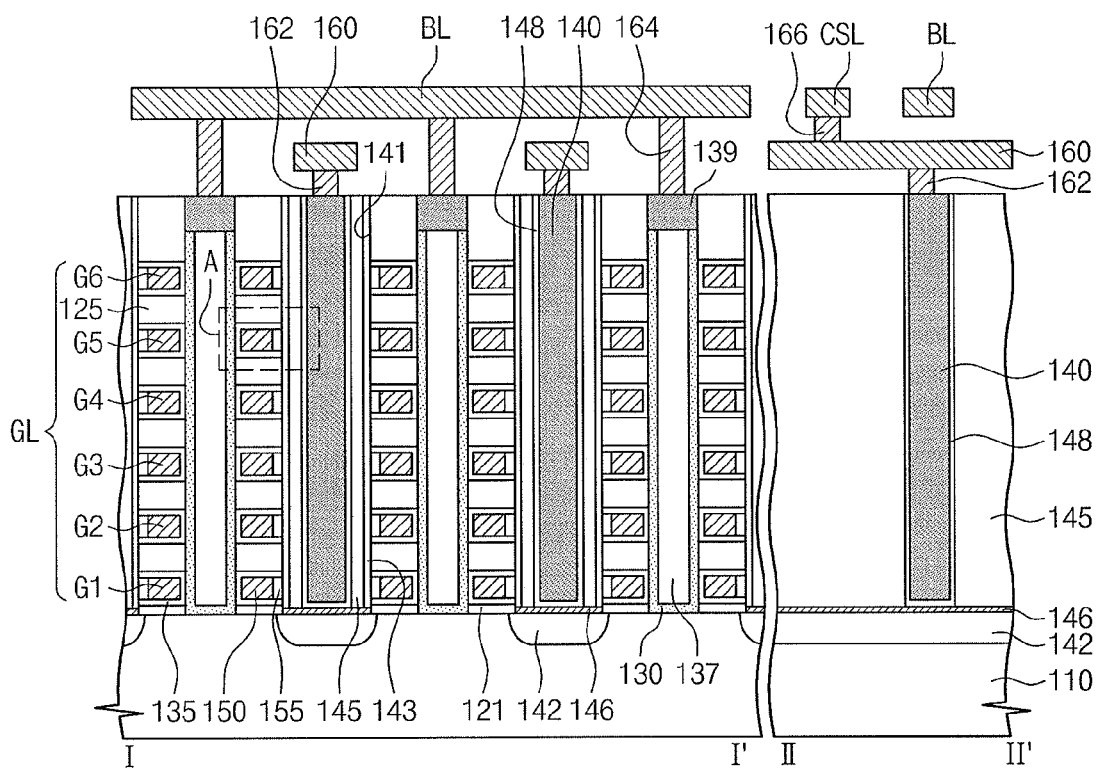
FIG. 4C illustrates a sectional view taken along lines I-I' and II-II' of FIG. 4B.

FIGS. 4A and 4B illustrate perspective and plan views of a semiconductor device according to example embodiments, and FIG. 4C illustrates a sectional view taken along lines I-I' and II-II' of FIG. 4B. A portion A of FIG. 4C may be configured to have a section illustrated in the enlarged view of FIG. 14B, as will be described in more detail below.

Referring to FIGS. 4A through 4C, a substrate 110 is provided. The substrate 110 may have a first conductivity type (for example, of p-type). Gate structures GL may be provided on the substrate 110. A buffer dielectric layer 121 may be provided between the substrate 110 and the gate structures GL. The buffer dielectric layer 121 may be a silicon oxide layer.

Each of the gate structures GL may have a structure extending along a first direction D1. The gate structures GL may face each other in a second direction D2 that is across from or perpendicular to the first direction. Each of the gate structures GL may include inter-gate insulating patterns 125 and gate electrodes spaced apart from each other with the insulating patterns interposed therebetween. The gate electrodes may include first to sixth gate electrodes G1-G6 sequentially stacked on the substrate 110. The inter-gate insulating patterns 125 may be formed of or include a silicon oxide layer. The buffer dielectric layer 121 may be thinner than the inter-gate insulating patterns 125. Each of the gate electrodes G1-G6 may include a gate pattern 150. The gate pattern 150 may include at least one of doped silicon, metals (e.g., tungsten), metal nitrides, metal silicides, or any combinations thereof. Although six gate electrodes are illustrated, the number of the gate electrodes constituting the gate structure GL may be greater than or smaller than six.

A plurality of vertical pillars 130 may be coupled with the gate structures GL. The vertical pillars 130 may be connected to the substrate 110 through the gate electrodes G1-G6. Each of the vertical pillars 130 may have a longitudinal axis extending upward from the substrate 110 (i.e., parallel to the third direction). Each of the vertical pillars 130 may have an end connected to the substrate 110 and an opposite end connected to first and second bit lines BL extending in the second direction. In example embodiments, each of the vertical pillars 130 may be a pillar-shaped structure including a semiconductor material. The vertical pillars 130 may be used as active channels of the cell strings. Each of the vertical pillars 130 may be shaped like a solid cylinder, a hollow cylinder, or a macaroni. The vertical pillars may have the hollow cylindrical or macaroni-like structure, and insulating gap-fill layer 137 may be provided to fill an internal space thereof. The insulating gap-fill layer 137 may be formed of a silicon oxide layer. Conductive patterns 139 may be provided on the vertical pillars 130, respectively. The conductive patterns 139 or portions of the vertical pillars 130 adjacent thereto may be used as drain regions of the cell strings. In other embodiments, each of the vertical pillars 130 may be a conductive pillar-shaped structure. For example, the vertical pillars 130 may include at least one of conductive materials, e.g., doped semiconductors, metals, conductive metal nitrides, silicides, or nano-structures (such as carbon nanotube or graphene).

A data storing element 135 may be provided between the gate electrodes G1-G6 and the vertical pillars 130. As shown in FIG. 4C, the data storing element 135 may be extended into regions between the gate electrodes G1-G6 and the inter-gate insulating patterns 125 and between the gate electrodes G1-G6 and the vertical pillars 130. Modified embodiments will be described in more detail with reference to FIGS. 23A through 23I.

A plurality of cell strings constituting a FLASH memory device may be provided between the bit lines BL and the common source line CSL. Each cell string may include a string selection transistor connected to a corresponding one of the bit lines BL, a ground selection transistor connected to common source regions 142, and a plurality of memory cells provided between the string selection transistor and the ground selection transistor. Each of the vertical pillars 130 may be used to realize the selection transistors and the plurality of memory cells. The first gate electrode G1 may serve as the ground selection line GSL for controlling the ground selection transistor. The second to fifth gate electrodes G2-G5 may serve as the word lines WL1-WLn for controlling the plurality of memory cells. The sixth gate electrode G6 may serve as the string selection gate line SSL for controlling the string selection transistor.

Separation trenches 141 may be provided between the gate structures GL to extend parallel to the first direction D1. The common source regions 142 may be provided in the substrate 110 exposed by the separation trenches 141. For example, the common source regions 142 may be spaced apart from each other in the substrate 110 and may extend parallel to the first direction. The common source regions 142 may have a second conductivity type (e.g., n-type) that is different from the first conductivity type. Device isolation patterns 145 may be provided on the common source regions 142 to fill the separation trenches 141. The device isolation patterns 145 may include a silicon oxide layer. Common contact layers 146 may be provided between the device isolation pattern 145 and the common source regions 142. The common contact layers 146 may be a metal-semiconductor compound layer. For example, the common contact layers 146 may be a metal silicide layer. An insulating spacer 143 may be provided on sidewalls of the gate structures GL.

The insulating spacer 143 may be provided between the gate structures GL and the device isolation pattern 145. The insulating spacer 143 may include a silicon oxide layer, a silicon oxynitride layer, a silicon nitride layer, and/or an aluminum oxide layer.

Strapping plugs 140 may be electrically connected to the common source regions 142 through the device isolation pattern 145. In each separation trench 141, the strapping plugs 140 may be arranged along the first direction D1. A second barrier layer 148 may be provided between the strapping plugs 140 and the device isolation pattern 145. The strapping plugs 140 may include a metal layer (e.g., of tungsten, copper, or aluminum). The second barrier layer 148 may include a conductive metal nitride layer (e.g., of titanium nitride or tantalum nitride). The common contact layers 146 may be provided between the strapping plugs 140 and the common source regions 142.

A strapping line 160 may be provided on the device isolation pattern 145 to extend parallel to the first direction D1. The strapping line 160 may be electrically connected to the strapping plugs 140 via first contacts 162. The strapping line 160 and the first contacts 162 may include at least one of metals (e.g., tungsten, copper, or aluminum), conductive metal nitrides (e.g., titanium nitride or tantalum nitride), or transition metals (e.g., titanium or tantalum).

The bit lines BL may be provided on the strapping line 160 to extend parallel to the second direction D2. The bit lines BL may be electrically connected to the vertical pillars 130 via second contacts 164. The bit lines BL and the second contacts 164 may include at least one of metals (e.g., tungsten, copper, or aluminum), conductive metal nitrides (e.g., titanium nitride or tantalum nitride), or transition metals (e.g., titanium or tantalum).

In certain embodiments, the common source line CSL may be provided on the strapping line 160 to extend parallel to the second direction D2. The common source line CSL may be electrically connected to the strapping line 160 via third contacts 166. The common source line CSL and the third contacts 166 may include at least one of metals (e.g., tungsten, copper, or aluminum), conductive metal nitrides (e.g., titanium nitride or tantalum nitride), or transition metals (e.g., titanium or tantalum).

According to vertical-type VNAND (Vertical NAND) technology, a conductive material (e.g., metal or metal silicide) may diffuse from the gate electrodes G1-G6 into the device isolation pattern 145, which may cause deterioration in electric isolation between the gate electrodes G1-G6. Further, the conductive material may be further diffused into the strapping plugs 140. The inter-gate insulating patterns 125 and/or the device isolation pattern 145 may exhibit deteriorated insulating properties, and a leakage current between or through the gate electrodes G1-G6 may result. In addition, the inter-gate insulating patterns 125 and/or the device isolation pattern 145 may suffer from a drop in breakdown voltage.

According to example embodiments, a diffusion barrier structure 155 may be provided between the gate electrodes G1-G6 and the insulating spacer 143 to prevent a conductive material (e.g., metal or metal silicide) in the gate electrodes G1-G6 from being diffused into the device isolation pattern 145. The diffusion barrier structure 155 may be provided in the form of an air gap or include an insulating barrier layer (e.g., of silicon nitride, aluminum oxide, or aluminum nitride), a metal nitride layer, or a metal silicon nitride layer, as will be described below.

A method of fabricating the semiconductor device of FIGS. 4A through 4C, according to example embodiments, will be described with reference to FIGS. 5A through 14A and 5B through 14B. FIGS. 5A through 14A illustrate sectional views of sections corresponding to the lines I-I' and II-II' of FIG. 4B, and FIGS. 5B through 14B illustrate enlarged sectional views of portions A of FIGS. 5A through 14A, respectively.

Figure 5A:
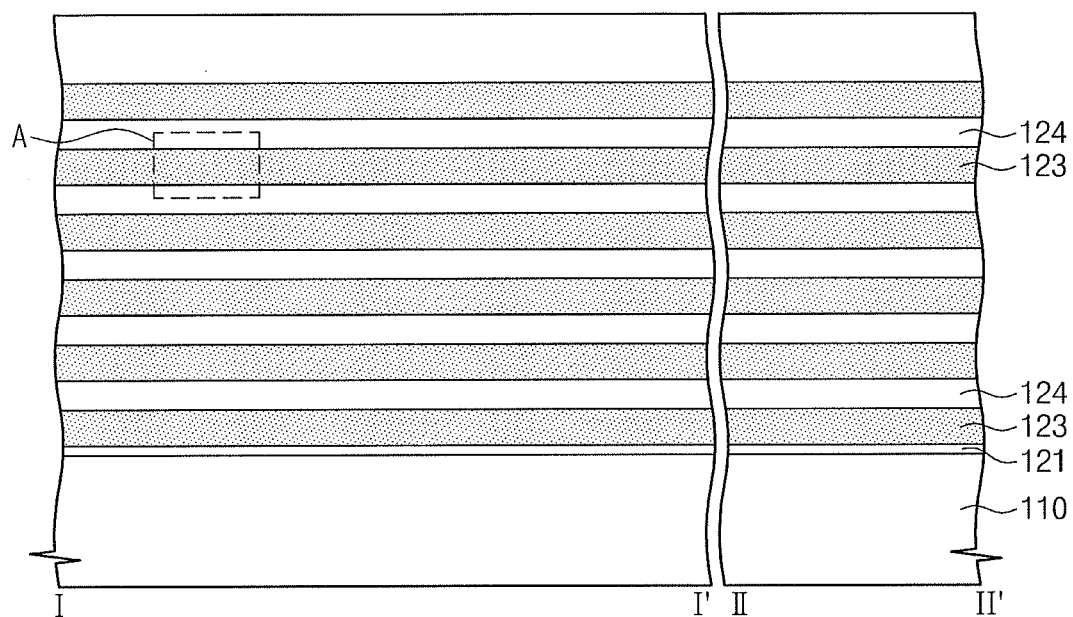
FIGS. 5A through 14A illustrate a method of fabricating a semiconductor device, according to example embodiments and are sectional views of sections corresponding to the lines I-I' and II-II' of FIG. 4B, and FIGS. 5B through 14B illustrate enlarged sectional views of portions A of FIGS. 5A through 14A, respectively.
Figure 5B:
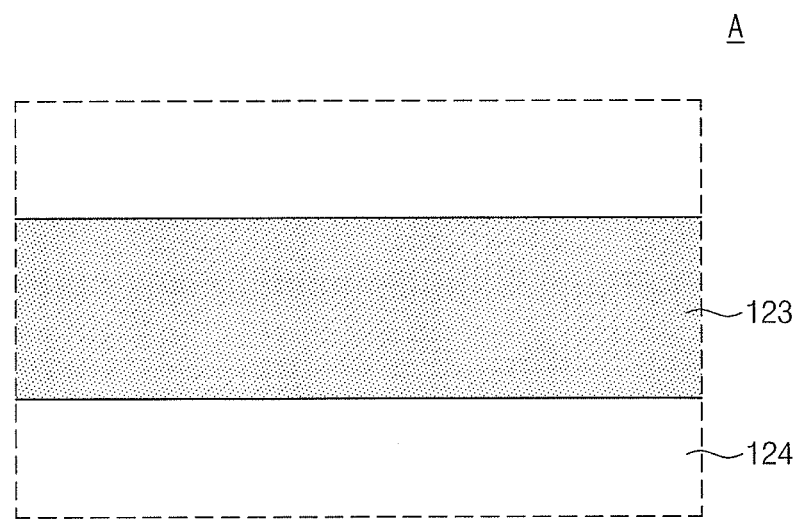

Referring to FIGS. 5A and 5B, the substrate 110 may be provided. The substrate 110 may have a first conductivity type (e.g., p-type). The buffer dielectric layer 121 may be formed on the substrate 110. The buffer dielectric layer 121 may be, for example, a silicon oxide layer. In certain embodiments, the buffer dielectric layer 121 may be formed by a thermal oxidation process. Sacrificial layers 123 and insulating layers 124 may be alternately stacked on the buffer dielectric layer 121. The uppermost one of the insulating layers 124 may be thicker than the others. The insulating layers 124 may be, for example, a silicon oxide layer. The sacrificial layers 123 may include a material exhibiting an etching property different from the buffer dielectric layer 121 and the insulating layers 124, when they are etched using a wet etching process. The sacrificial layers 123 may include, for example, a silicon nitride layer, a silicon oxynitride layer, a poly-silicon layer, or a polysilicon germanium layer. The sacrificial layers 123 and the insulating layers 124 may be formed using, for example, a chemical vapor deposition (CVD) process.

Figure 6A:
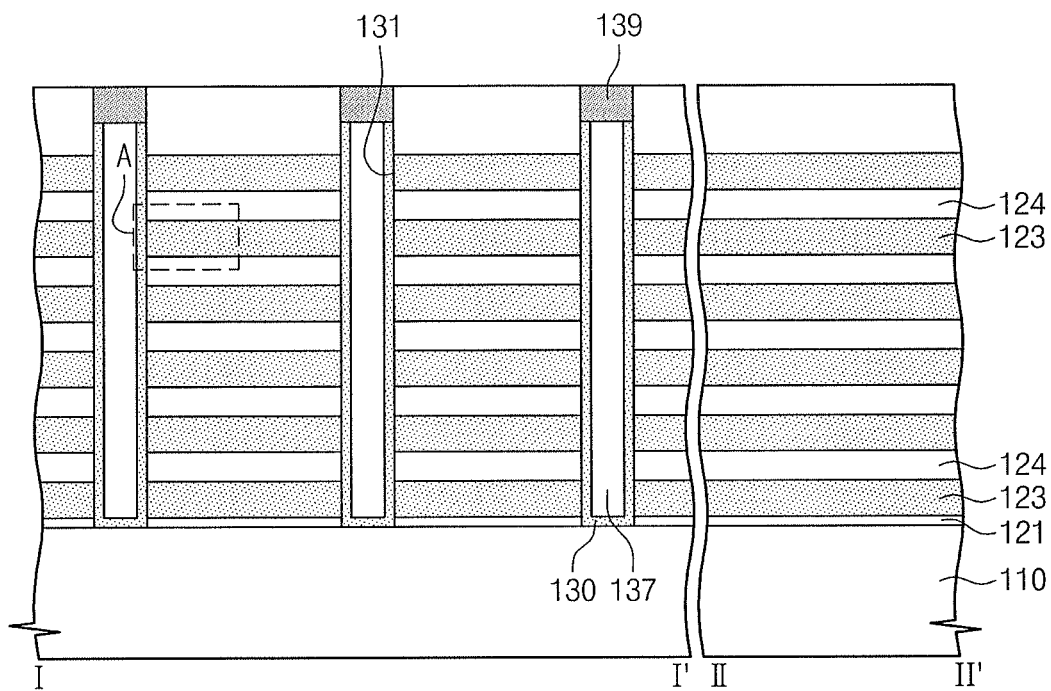
Figure 6B:
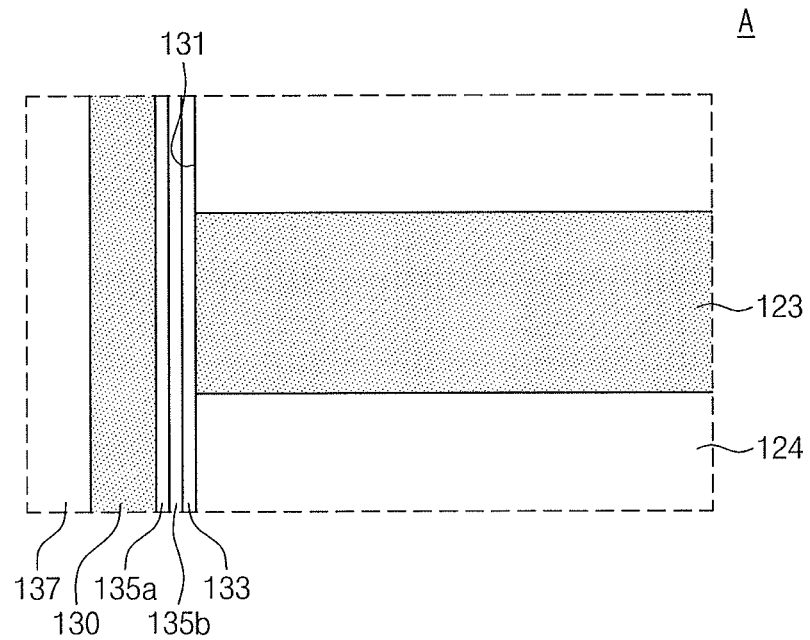

Referring to FIGS. 6A and 6B, vertical holes 131 may be formed to penetrate the buffer dielectric layer 121, the sacrificial layers 123 and the insulating layers 124, and the substrate 110 may be exposed. A protection layer 133 may be formed on sidewalls of the vertical holes 131. The protection layer 133 may be a silicon oxide layer. A charge storing layer 135b may be formed on the protection layer 133. The charge storing layer 135b may be a charge trap layer or an insulating layer containing conductive nano particles. The charge trap layer may include, for example, a silicon nitride layer. A tunnel insulating layer 135a may be formed on the charge storing layer 135b. The tunnel insulating layer 135a may be a silicon oxide layer. The protection layer 133, the charge storing layer 135b, and the tunnel insulating layer 135a may be formed using a CVD or atomic layer deposition (ALD) method.

The vertical pillars 130 may be formed in the vertical holes 131 to cover the tunnel insulating layer 135a. A process of forming the vertical pillars 130 will be exemplarily described below. First, a first semiconductor layer may be formed on the tunnel insulating layer 135a and then anisotropically etched to form a semiconductor spacer. The semiconductor spacer may be locally formed on a sidewall of the tunnel insulating layer 135a to expose the substrate 110. A second semiconductor layer may be formed on the semiconductor spacer. The first and second semiconductor layers may be formed using a CVD or ALD process. The first and second semiconductor layers may be amorphous silicon layers. Thereafter, a thermal treatment process may be performed to transform the first and second semiconductor layers to a poly- or single-crystalline semiconductor layer (e.g., poly or crystalline silicon layer). The vertical pillar 130 or the semiconductor layer thereof may be doped to have the first conductivity type.

The semiconductor layer may be formed to partially or incompletely fill the vertical holes 131, and an insulating material may be formed on the semiconductor layer to fill the remaining regions of the vertical holes 131. The semiconductor layer and the insulating material may be planarized to expose the uppermost layer of the insulating layers 124. The vertical pillars 130 may be formed in the vertical holes 131 to have a cylindrical structure, and the inside of each of the vertical pillars 130 may be filled with the insulating gap-fill layer 137. In an embodiment, the semiconductor layer may be formed to fill the vertical holes 131, and the insulating gap-fill layer may not be provided in the vertical holes 131. Upper portions of the vertical pillars 130 may be recessed in such a way that its top surfaces are lower than that of the uppermost insulating layer. Thereafter, the conductive patterns 139 may be formed in the vertical holes 131 with the recessed vertical pillars 130. The conductive patterns 139 may be formed of a conductive material, for example, doped polysilicon or metals. Drain regions may be formed by injecting impurities of second conductivity type into the conductive patterns 139 and upper portions of the vertical pillars 130. The second conductivity type may be N-type.

In other embodiments, the vertical pillars 130 may include at least one of conductive materials, for example, doped semiconductors, metals, conductive metal nitrides, silicides, or nanostructures (such as carbon nanotube or graphene).

Figure 7A:
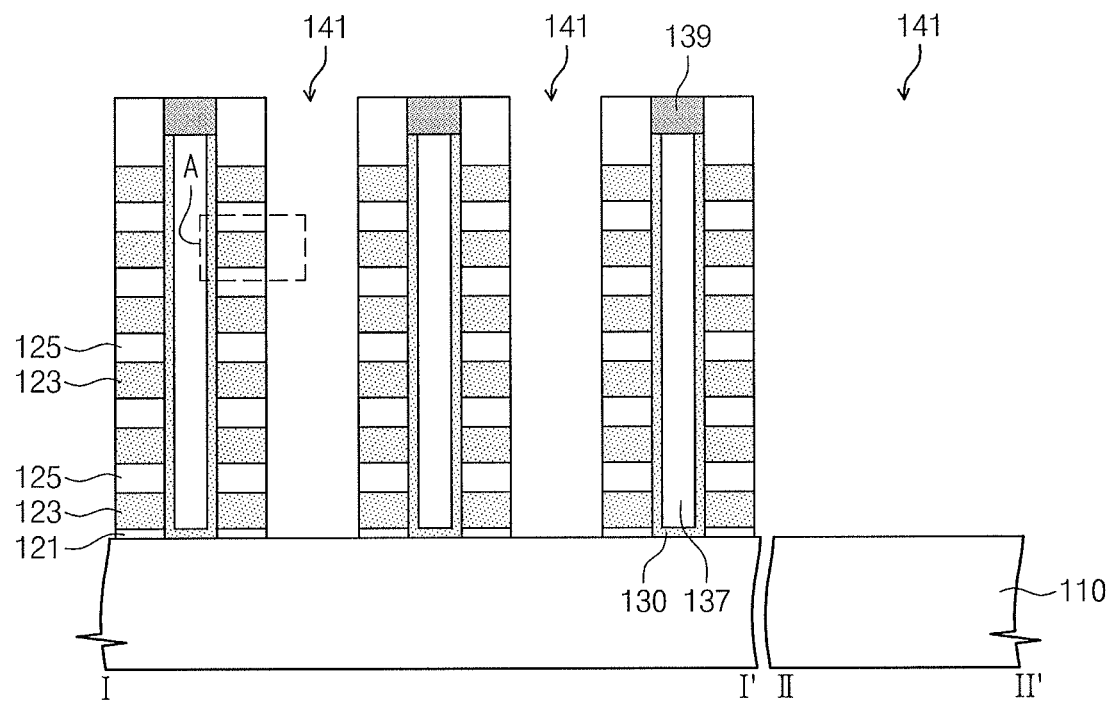
Figure 7B:
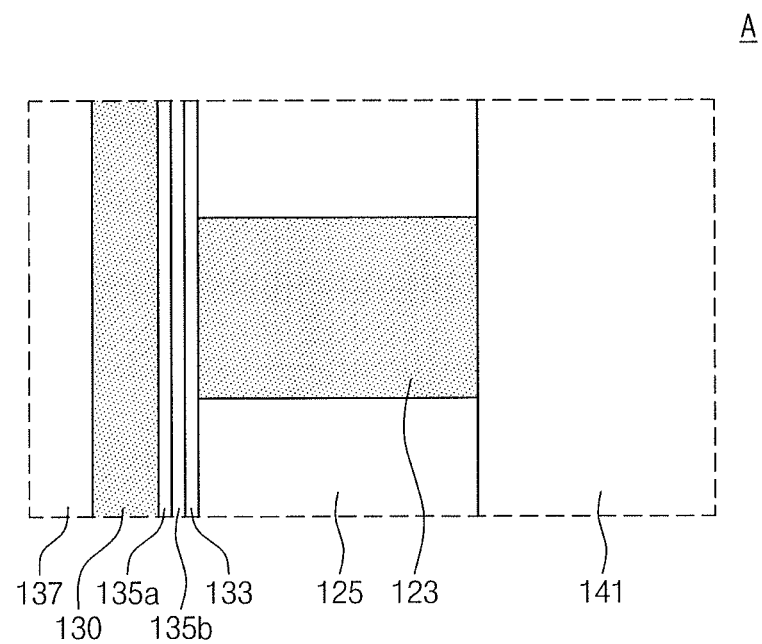

Referring to FIGS. 7A and 7B, the buffer dielectric layer 121, the sacrificial layers 123, and the insulating layers 124 may be successively patterned to form separation trenches 141, which are spaced apart from each other to expose the substrate 110, and each of which extends parallel to the first direction. As the result of the patterning of the insulating layers 124, the inter-gate insulating patterns 125 may be formed between the sacrificial layers 123.

Figure 8A:
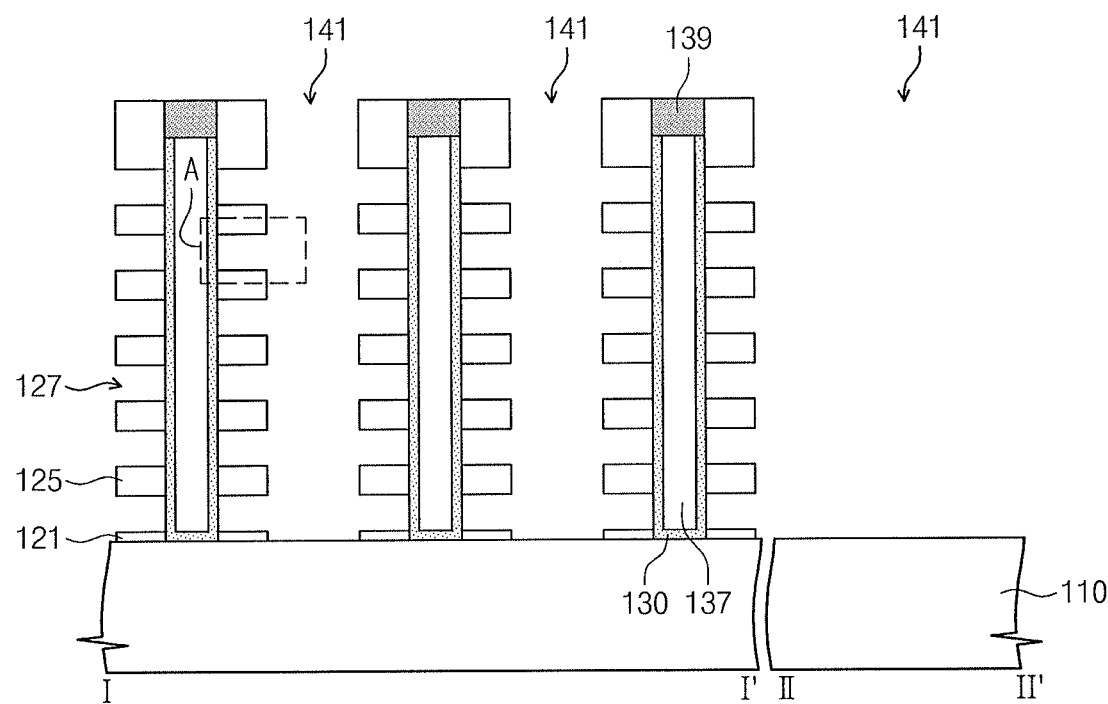
Figure 8B:
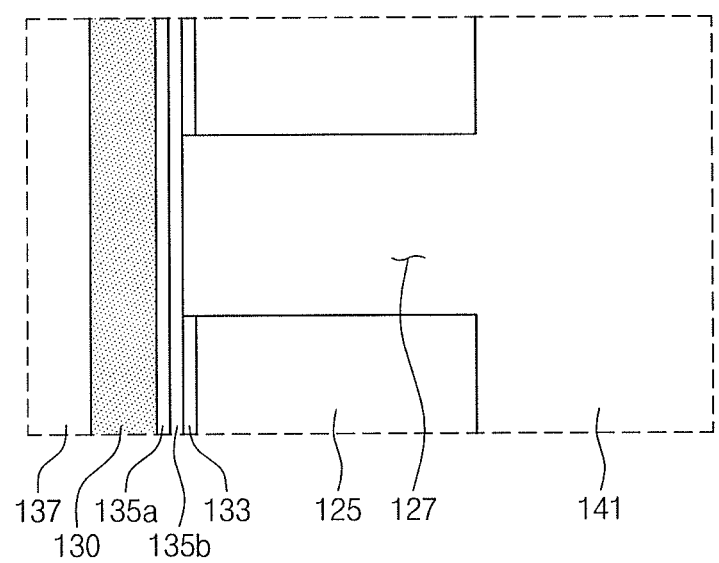

Referring to FIGS. 8A and 8B, the sacrificial layers 123 exposed by the separation trenches 141 may be selectively removed to form gate regions 127. The gate regions 127 may be regions that are formed by removing the sacrificial layers 123 and are delimited by the vertical pillars 130 and the inter-gate insulating patterns 125. The sacrificial layers 123 may include a silicon nitride layer or a silicon oxynitride layer, and the removal process of the sacrificial layers may be performed by etching solution containing phosphoric acid. Each of the gate regions 127 may be formed to partially expose the sidewalls of the vertical pillars 130.

The protection layer 133 may prevent the charge storing layer 135b from being damaged by the etching solution for removing the sacrificial layers 123. The protection layer 133 exposed by the gate region 127 may be selectively removed. For example, the protection layer 133 may be formed of silicon oxide, the protection layer 133 may be removed by etching solution containing hydrofluoric acid, and the gate region 127 may expose a portion of the charge storing layer 135b.

Figure 9A:
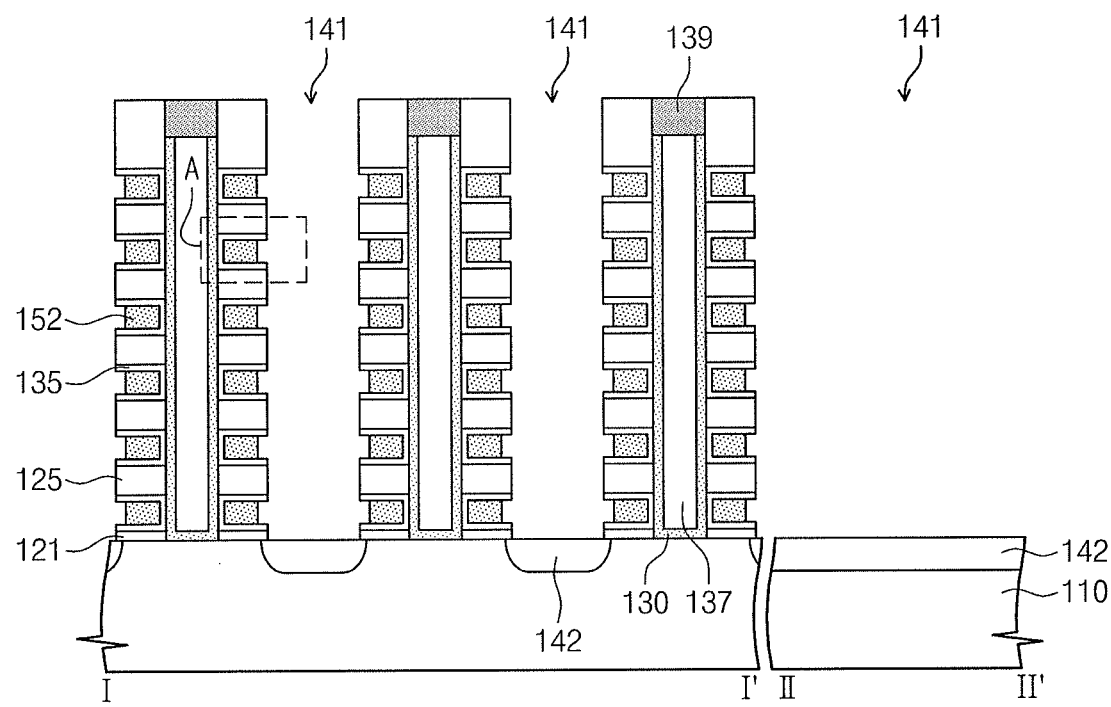
Figure 9B:
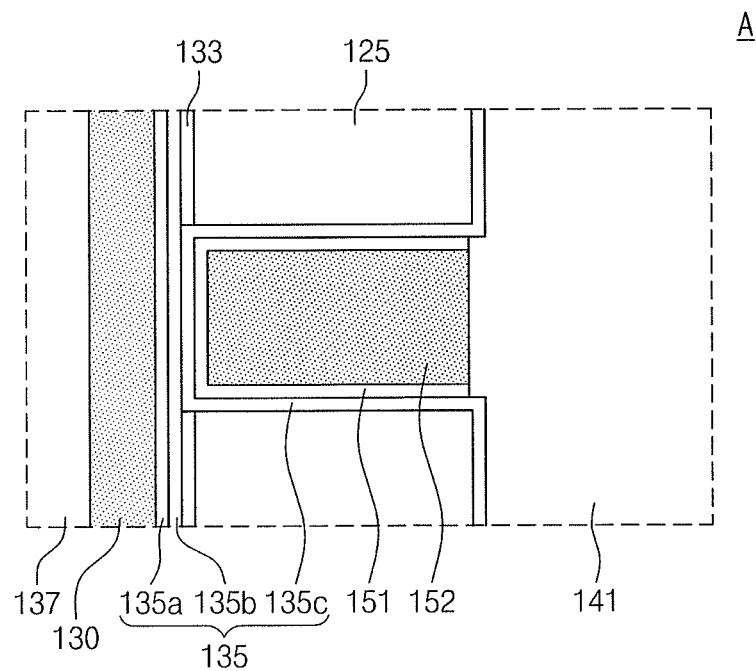

Referring to FIGS. 9A and 9B, a blocking insulating layer 135c may be formed on the inter-gate insulating patterns 125 and the charge storing layer 135b exposed by the separation trenches 141 and the gate region 127. The blocking insulating layer 135c may be a multi-layered structure including a plurality of thin-films. For example, the blocking insulating layer 135c may include an aluminum oxide layer and a silicon oxide layer, and a stacking order or position of the aluminum oxide layer and the silicon oxide layer may be variously changed. The blocking insulating layer 135c may be formed using an ALD process.

A silicon layer 152 may be formed in the gate region 127 through the separation trench 141. The silicon layer 152 may be a poly-silicon layer or an amorphous silicon layer. The silicon layer 152 may be formed by a CVD or ALD process. In certain embodiments, a first barrier layer 151 may be additionally formed between the silicon layer 152 and the blocking insulating layer 135c. The first barrier layer 151 may include a conductive metal nitride layer (e.g., of titanium nitride or tantalum nitride). The first barrier layer 151 may prevent a conductive material in the gate electrodes G1-G6 from being diffused to other layers or patterns adjacent thereto. The first barrier layer 151 may be formed using a CVD or ALD process.

The silicon layer 152 and the first barrier layer 151 may be removed from other regions, except for the gate regions 127. The removal of the silicon layer 152 and the first barrier layer 151 may be performed by an anisotropic etching process. The silicon layer 152 and the first barrier layer 151 may be locally formed in each of the gate regions 127, and outer side surfaces of the silicon layer 152 and the first barrier layer 151 may be recessed from the sidewalls of the inter-gate insulating patterns 125. In certain embodiments, the silicon layer 152 may be more deeply recessed than the first barrier layer 151.

The common source regions 142 may be formed in the substrate 110 exposed by the separation trenches 141. In example embodiments, the common source regions 142 may be formed, for example, by an ion implantation process, to have the second conductivity type and a high impurity concentration.

Figure 10A:
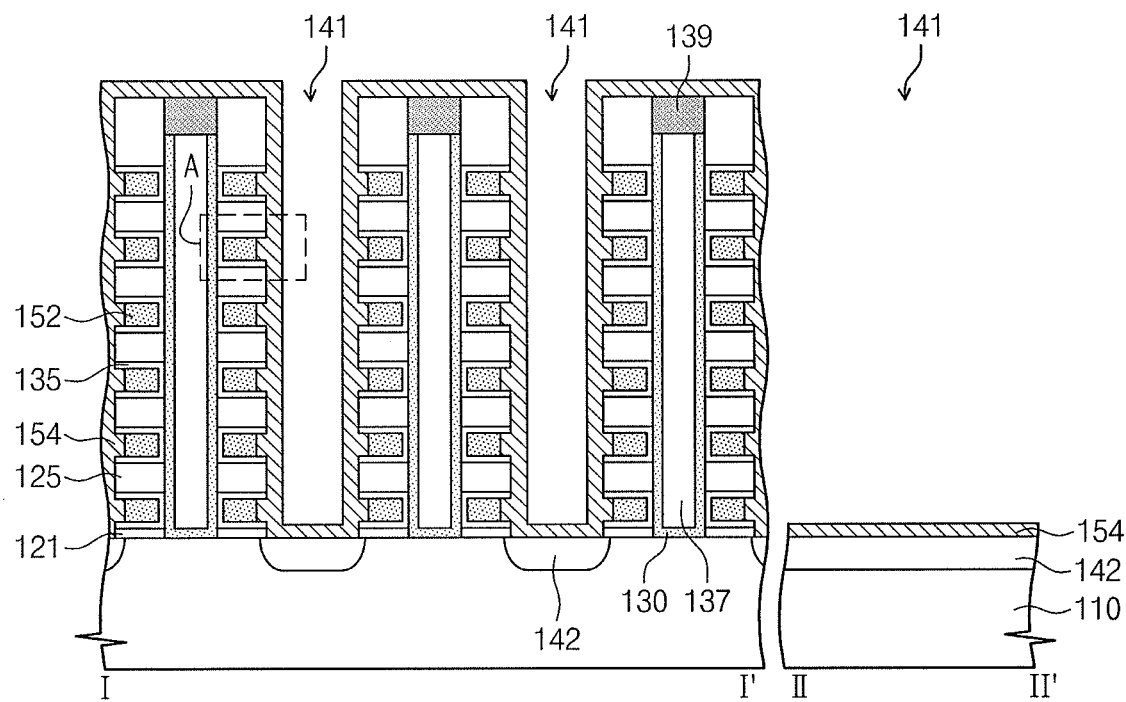
Figure 10B:
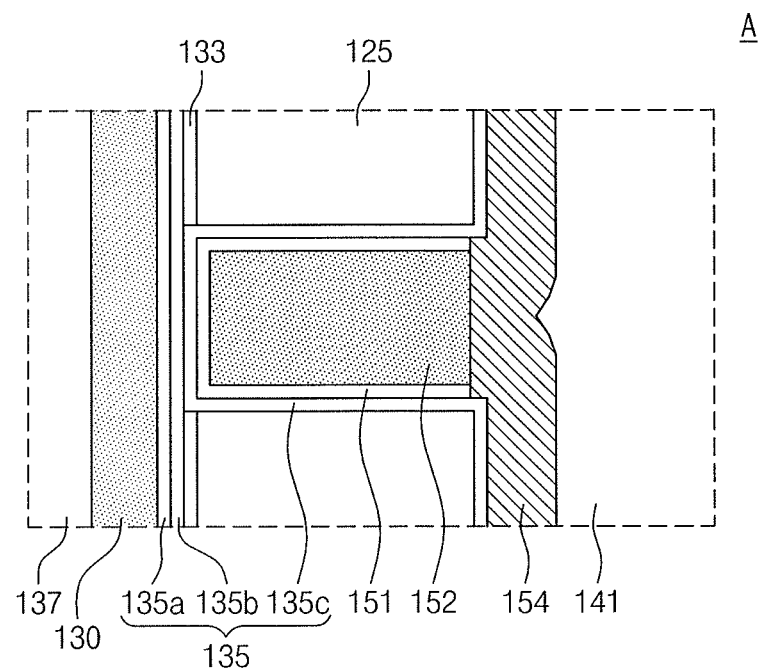

Referring to FIGS. 10A and 10B, a first metal layer 154 may be formed on the top surfaces of the common source regions 142 and on the sidewalls of the inter-gate insulating patterns 125 and the silicon layer 152. The first metal layer 154 may include a first element M (e.g., nickel, cobalt, titanium, or tungsten). The first metal layer 154 may be formed using a CVD, ALD, or sputtering process.

Figure 11A:
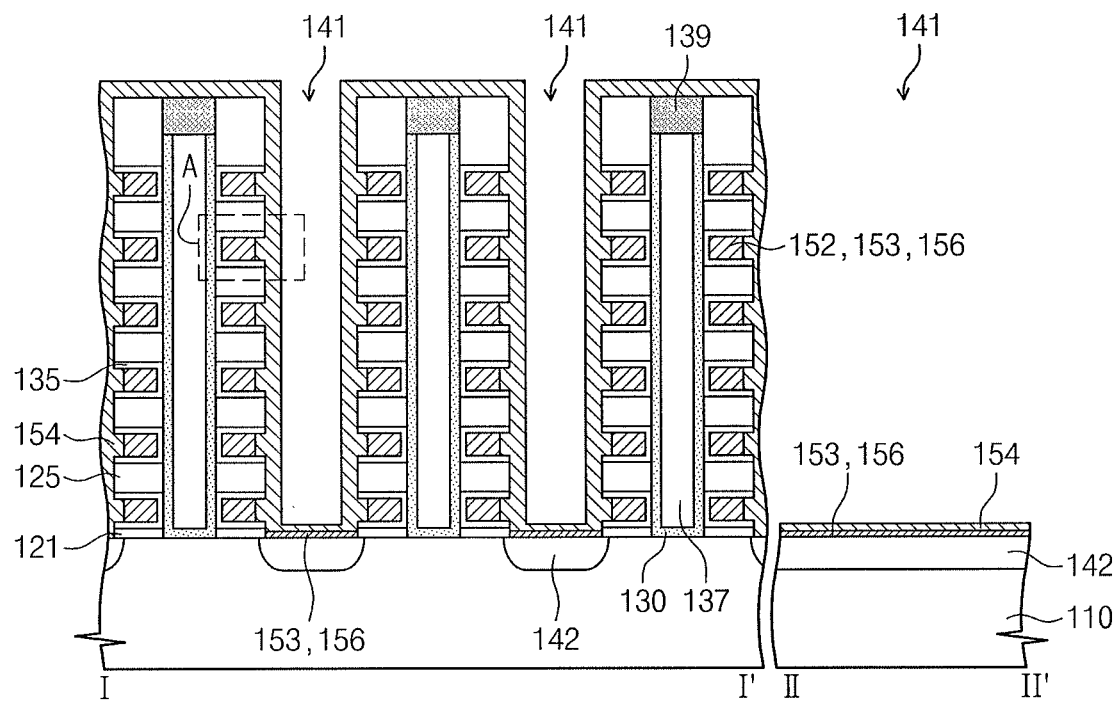
Figure 11B:
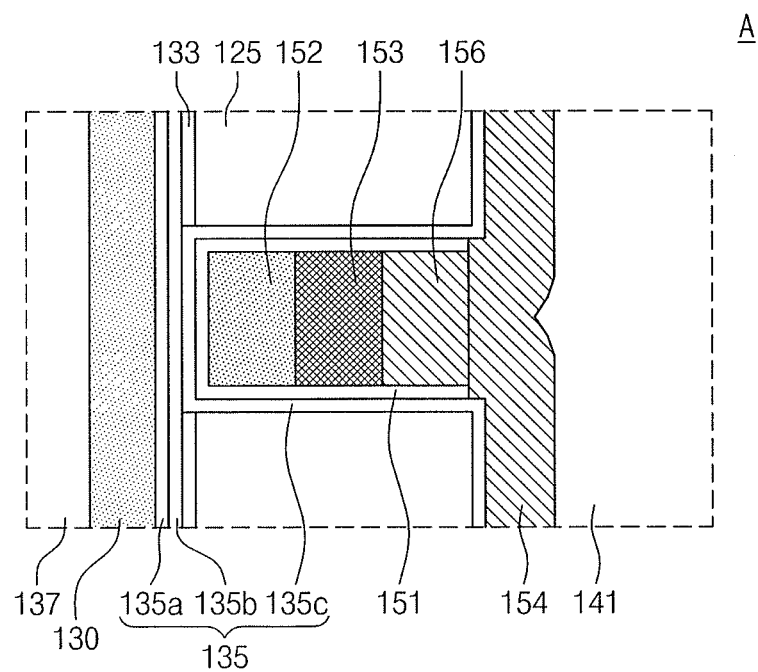

Referring to FIGS. 11A and 11B, a first thermal treatment process may be performed. The first thermal treatment process may be performed at a temperature of 250-600° C. The first thermal treatment process may be a furnace annealing process. A portion of the silicon layer 152 may be reacted with the first metal layer 154 during the first thermal treatment process, and a first silicide layer 153 and a second silicide layer 156 may be formed. The first silicide layer 153 may be adjacent to the silicon layer 152, and the second silicide layer 156 may be adjacent to the first metal layer 154. The first silicide layer 153 may be a mono metal silicide layer (MSi) having a fully transformed phase, and the second silicide layer 156 may be a metal silicide layer having a partially transformed phase ($M_xSi$ and x>1, for example, $M_2Si$). Thicknesses of the first and second silicide layers 153 and 156 may be changed by controlling a diffusion property (e.g., diffusion length) of metallic element constituting the first metal layer 154. For example, the diffusion property of metallic element constituting the first metal layer 154 may be controlled by adjusting process conditions of temperature and reaction duration in the first thermal treatment process.

Figure 12A:
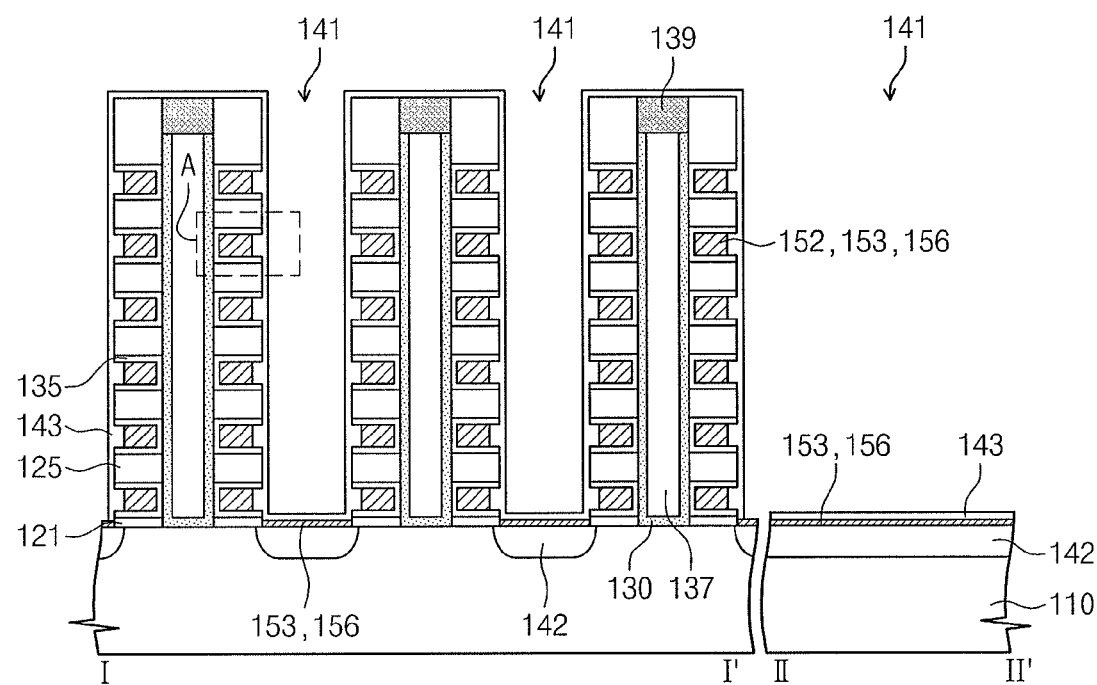
Figure 12B:
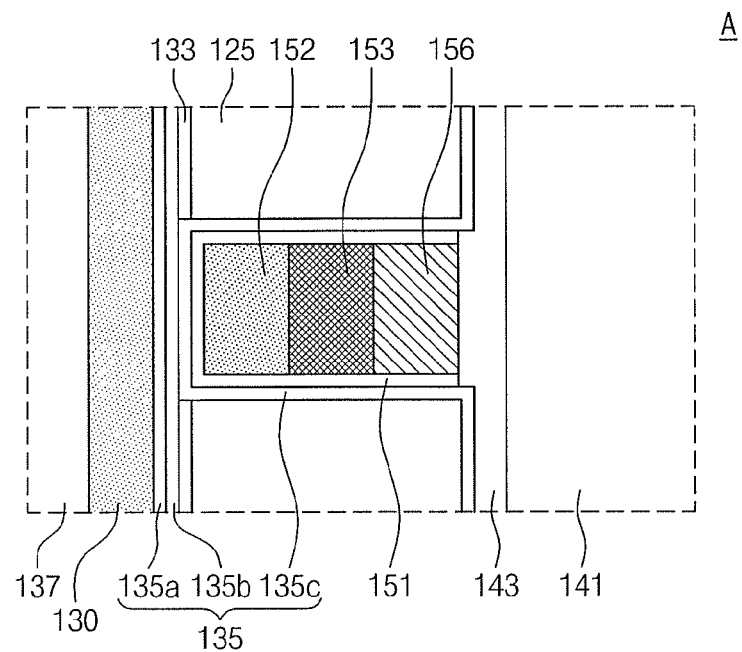

Referring to FIGS. 12A and 12B, the other portion of the first metal layer 154 may not be participated in the reaction with the silicon layer and may remain as a residue. The residue of the first metal layer 154 may be removed using, for example, aqua regia (containing nitric and hydrochloric acid) or sulfuric acid solution.

Thereafter, the insulating spacer 143 may be formed on the sidewall of the separation trenches 141. The formation of the insulating spacer 143 may include depositing a silicon oxide layer or a silicon nitride layer on an inner surface of the separation trenches 141 and then anisotropically etching the same.

Figure 13A:
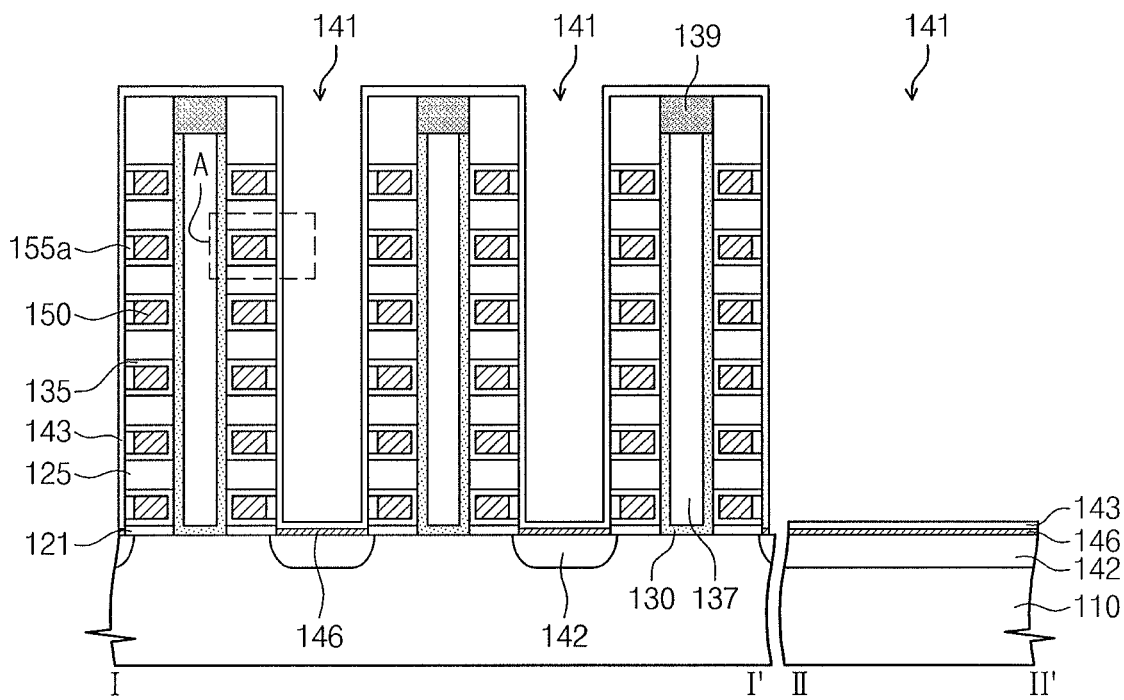
Figure 13B:
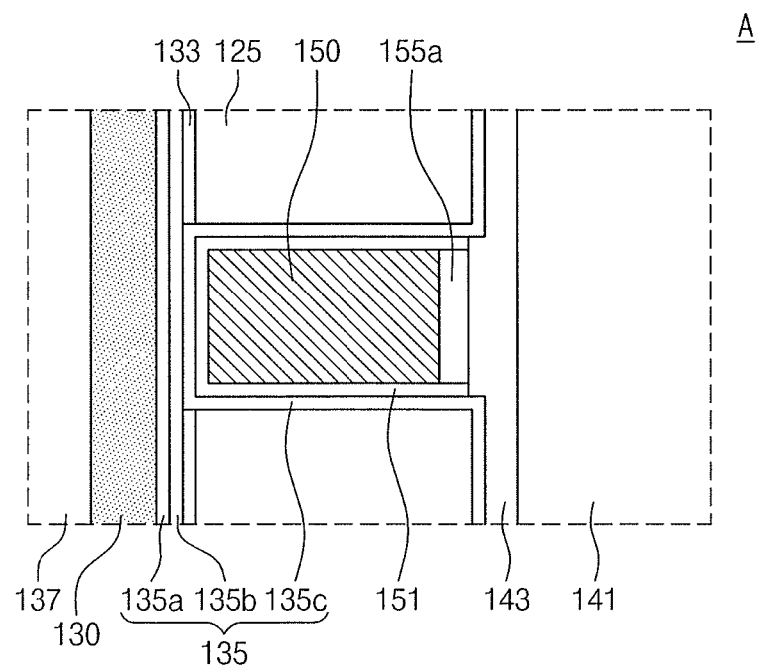

Referring to FIGS. 13A and 13B, a second thermal treatment process may be performed. The second thermal treatment process may be performed at a temperature of 300° C. or higher. The second thermal treatment process may be a furnace annealing process, and the silicide layers may be transformed to a mono metal silicide layer (MSi), and may have a reduced volume. The following Table 1 shows volumes of Ni-containing materials.

TABLE 1

|  | Ni | $Ni_2Si$ | NiSi | $NiSi_2$ |
|---|---|---|---|---|
| Volume (Relative Value) | 1 | 1.58 | 1.18 | 0.93 |

In the second thermal treatment process, the process conditions of temperature and reaction duration may be adaptively controlled to consume the whole portion of the silicon layer 152, and silicide layers of mono metal silicide phase (MSi) may be formed, which will be referred to as the gate pattern 150. In an embodiment, the silicide layer may not be wholly transformed to have the mono metal silicide phase. Volume of the silicide layer may be reduced, and an empty space may be created in the second thermal treatment process. For example, an air gap 155a may be formed between the gate pattern 150 and the insulating spacer 143. The air gap 155a may be a space filled with air, but not with any solid material, or a vacuum-like space. The gate pattern 150 may be spaced apart from the insulating spacer 143 by the air gap 155a interposed therebetween. Each of the gate electrodes G1-G6 may include the gate pattern 150.

As the result of the silicidation process, the common contact layers 146 may be formed in the substrate 110 exposed by the separation trenches 141. The common contact layers 146 may be silicide layers having the mono metal silicide phase.

Figure 14A:
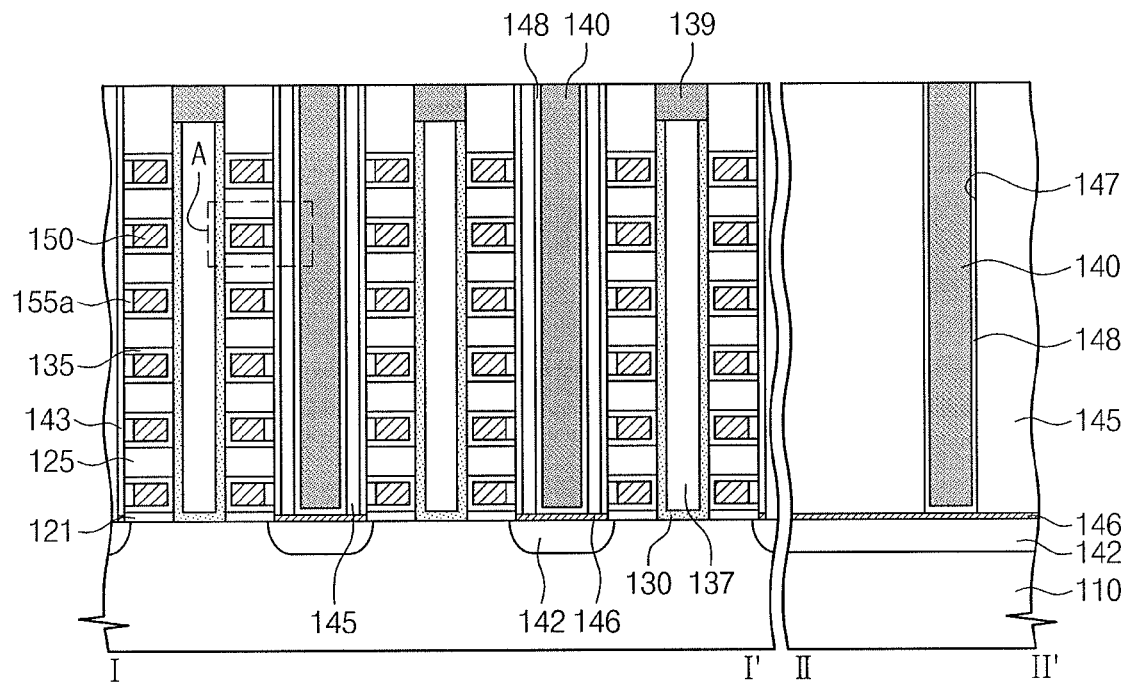
Figure 14B:
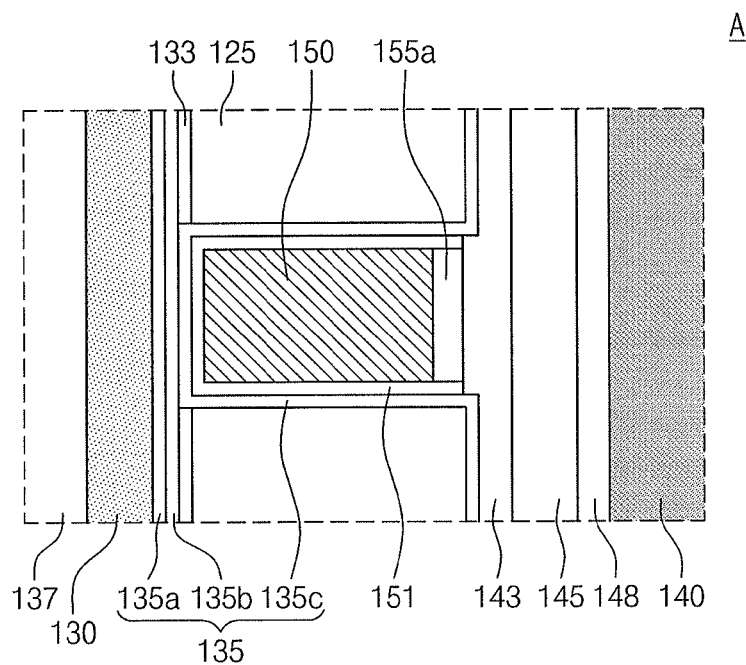
FIG. 14C illustrates a method of fabricating a semiconductor device according to other example embodiments and is an enlarged sectional view of the portion A of FIG. 14A.

Referring to FIGS. 14A and 14B, the device isolation pattern 145 may be formed to fill the separation trenches 141. The device isolation pattern 145 may be formed to extend parallel to the first direction. The device isolation pattern 145 may include a silicon oxide layer. In certain embodiments, the device isolation pattern 145 may be formed to have a top surface coplanar with the uppermost one of the inter-gate insulating patterns 125.

Referring back to FIGS. 4A and 4B in conjunction with FIGS. 14A and 14B, strapping holes 147 may be formed through the device isolation pattern 145. The strapping holes 147 may be formed to expose the common contact layers 146. The strapping plugs 140 may be formed in the strapping holes 147. The second barrier layer 148 may be formed between the strapping plugs 140 and the strapping holes 147. The strapping plugs 140 may include a metal layer (e.g., of tungsten, copper, or aluminum). The second barrier layer 148 may include a conductive metal nitride layer (e.g., of titanium nitride or tantalum nitride). The strapping plugs 140 may be electrically connected to the common source regions 142 via the common contact layers 146.

Referring back to FIGS. 4A through 4C, the first contacts 162 may be formed on and connected to the strapping plugs 140. The strapping line 160 may be formed on the first contacts 162 to connect the first contacts 162 to each other. The strapping line 160 may extend parallel to the first direction D1. The strapping line 160 may be electrically connected to the strapping plugs 140 via the first contacts 162. The strapping line 160 and the first contacts 162 may include at least one of metals (e.g., tungsten, copper, or aluminum), conductive metal nitrides (e.g., titanium nitride or tantalum nitride), or transition metals (e.g., titanium or tantalum).

The second contacts 164 may be formed on and connected to the vertical pillars 130. The bit lines BL may be formed on the second contacts 164 to connect the second contacts 164 to each other. The bit lines BL may extend parallel to the second direction D2. The bit lines BL may be electrically connected to the vertical pillars 130 via the second contacts 164. The bit lines BL and the second contacts 164 may include at least one of metals (e.g., tungsten, copper, or aluminum), conductive metal nitrides (e.g., titanium nitride or tantalum nitride), or transition metals (e.g., titanium or tantalum).

The third contacts 166 may be formed on and connected to the strapping line 160. The common source line CSL may be formed on the third contacts 166 to connect the third contacts 166 to each other. In certain embodiments, the common source line CSL may be electrically connected to the strapping line 160 via the third contact 166. The common source line CSL and the third contacts 166 may include at least one of metals (e.g., tungsten, copper, or aluminum), conductive metal nitrides (e.g., titanium nitride or tantalum nitride), or transition metals (e.g., titanium or tantalum).

Another example of the semiconductor devices according to example embodiments will be described with reference to FIGS. 4C and 14B. The data storing element 135 may include the blocking insulating layer 135c adjacent to the gate pattern 150, the tunnel insulating layer 135a adjacent to the vertical pillars 130, and the charge storing layer 135b therebetween. The blocking insulating layer 135c may include a high-k dielectric (e.g., aluminum oxide or hafnium oxide). The blocking insulating layer 135c may be a multi-layered structure including a plurality of thin-films. For example, the blocking insulating layer 135c may include an aluminum oxide layer and/or a hafnium oxide layer, and a stacking order or position of the aluminum oxide layer and the hafnium oxide layer may be variously changed. The charge storing layer 135b may be a charge trap layer or an insulating layer containing conductive nano particles. The charge trap layer 135b may include, for example, a silicon nitride layer. The tunnel insulating layer 135a may include a silicon oxide layer. The tunnel insulating layer 135a and the charge storing layer 135b may be extended into a region between the vertical pillars 130 and the inter-gate insulating patterns 125. The blocking insulating layer 135c may be extended into a region between the gate pattern 150 and the inter-gate insulating patterns 125.

The gate pattern 150 may be provided in the gate region 127 between the inter-gate insulating patterns 125. The gate region 127 may be a space delimited by the inter-gate insulating patterns 125 and the vertical pillars 130. The gate pattern 150 may include a metal silicide layer (e.g., a nickel silicide layer, a cobalt silicide layer, a titanium silicide layer, or a tungsten silicide layer). The first barrier layer 151 may be provided between the gate pattern 150 and the inter-gate insulating patterns 125. The first barrier layer 151 may include a conductive metal nitride layer (e.g., of titanium nitride or tantalum nitride).

The gate pattern 150 and the first barrier layer 151 may be recessed from the sidewalls of the gate structures GL (i.e., of the inter-gate insulating patterns 125). In certain embodiments, the gate pattern 150 may be more deeply recessed than the first barrier layer 151.

The insulating spacer 143 may be provided on the sidewalls of the gate structures GL. The insulating spacer 143 may be a silicon oxide layer or a silicon nitride layer.

The air gap 155a may be provided between the gate pattern 150 and the insulating spacer 143. The air gap 155a may be a space filled with air, but not with any solid material, or a vacuum-like space. The gate pattern 150 may be spaced apart from the insulating spacer 143 by the air gap 155a interposed therebetween. The first barrier layer 151 may be formed to expose one of side surfaces of the gate pattern 150, and as described above, the conductive material may diffuse from the gate pattern 150 to the device isolation pattern 145 or the strapping plugs 140.

According to example embodiments, the air gap 155a, which is an example of a diffusion barrier structure, may prevent the conductive material from diffusing. Insulating properties of the inter-gate insulating patterns 125, the insulating spacer 143, and the device isolation pattern 145 may be improved, and the leakage current properties between the gate electrodes G1-G6 and between the gate electrodes G1-G6 and the strapping plugs 140 may be improved.

Figure 14C:
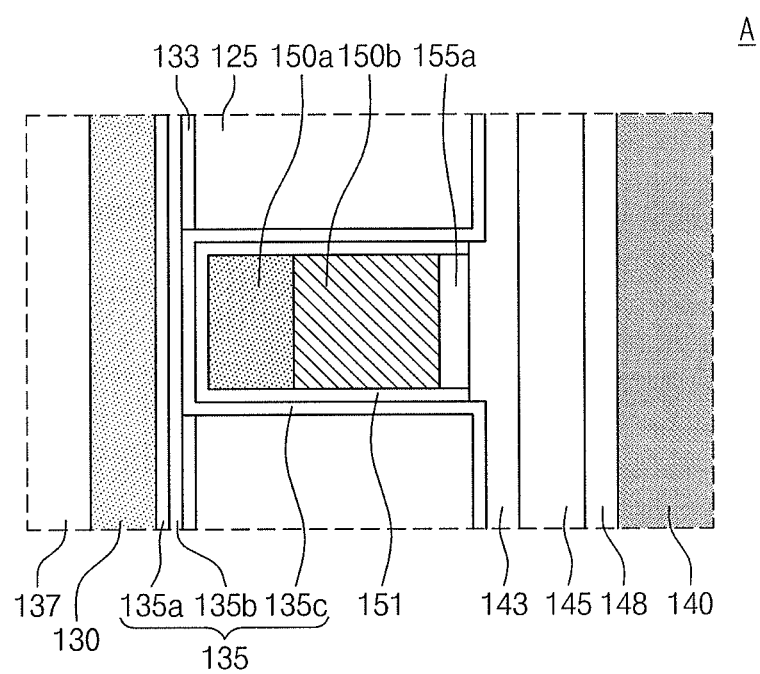

FIG. 14C illustrates an enlarged sectional view of the portion A of FIG. 14A. A method of fabricating a semiconductor device, according to other example embodiments, will be described with reference to FIG. 14C. For concise description, an element previously described with reference to FIG. 14B may be identified by a similar or identical reference number without repeating an overlapping description thereof.

In certain embodiments, the silicidation process may be performed in such a way that a portion of the silicon layer 152 and the first metal layer 154 are participated in the reaction for forming the metal silicide layer, and the other portion of the silicon layer 152 may remain. As shown in FIG. 14C, the gate pattern 150 may include a first sub-gate pattern 150a and a second sub-gate pattern 150b. The first sub-gate pattern 150a may be adjacent to the vertical pillars 130, and the second sub-gate pattern 150b may be adjacent to the air gap 155a. The first sub-gate pattern 150a may be a silicon layer, and the second sub-gate pattern 150b may be a metal silicide layer.

Figure 15A:
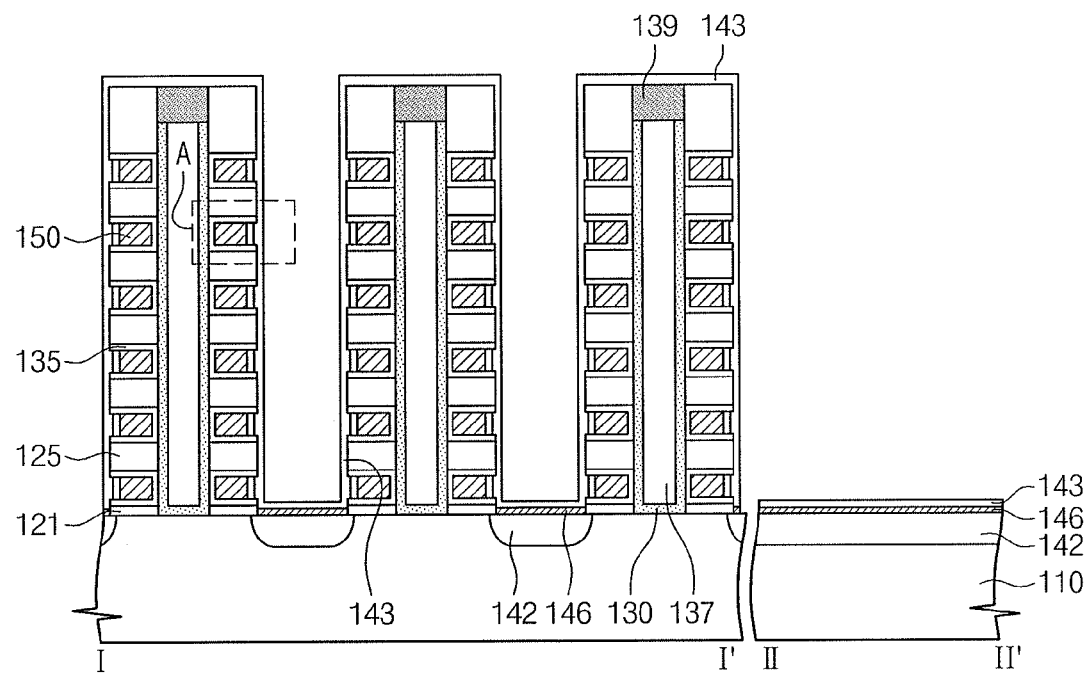
FIGS. 15A and 16A illustrate a method of fabricating a semiconductor device according to still other example embodiments and are sectional views of sections corresponding to the lines I-I' and II-II' of FIG. 4B, and FIGS. 15B and 16B illustrate enlarged sectional views of portions A of FIGS. 15A and 16A, respectively.
Figure 15B:
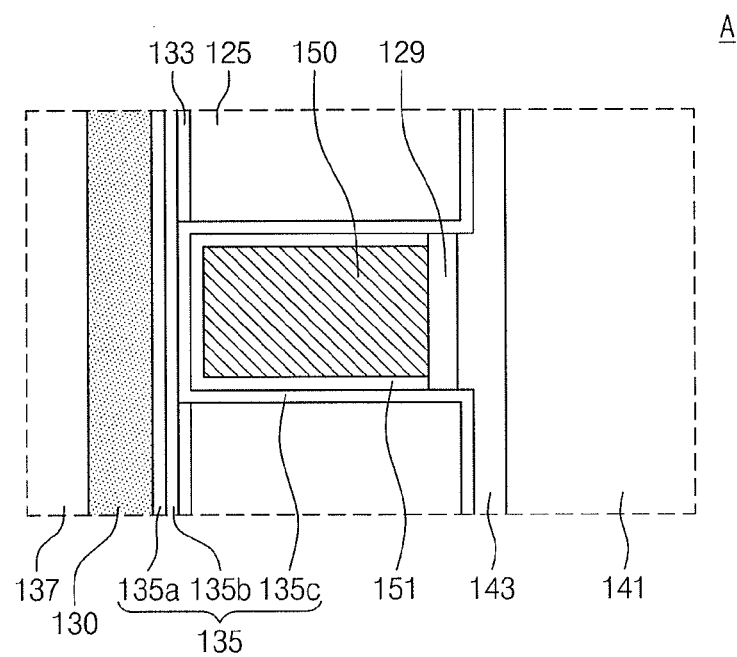
Figure 16A:
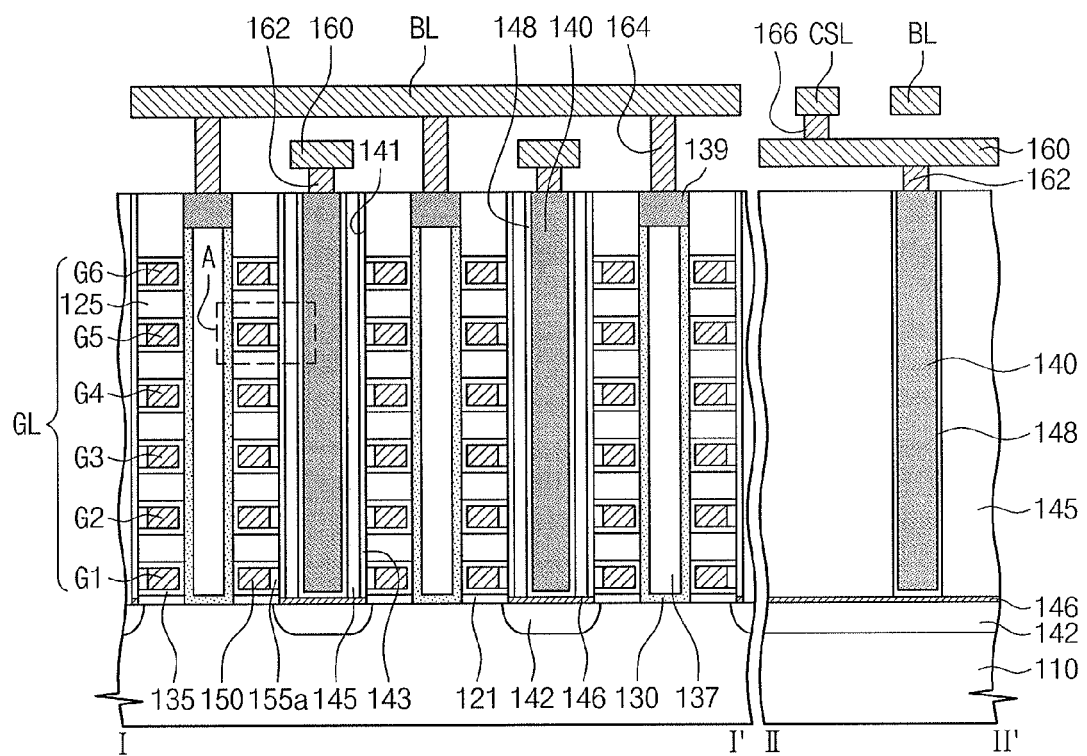
Figure 16B:
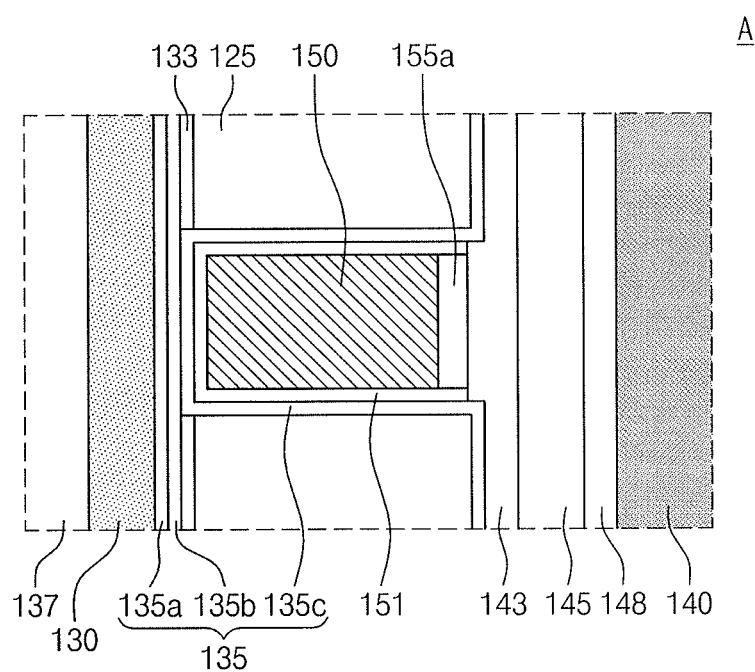

A method of fabricating a semiconductor device, according to still other example embodiments, will be described with reference to FIGS. 15A, 15B, 16A, and 16B. FIGS. 15A and 16A illustrate sectional views of sections corresponding to the lines I-I' and II-II' of FIG. 4B, and FIGS. 15B and 16B illustrate enlarged sectional views of portions A of FIGS. 15A and 16A, respectively. For concise description, a previously described element may be identified by a similar or identical reference number without repeating an overlapping description thereof.

Referring to FIGS. 15A and 15B, the gate pattern 150 may be formed in the gate region 127 described with reference to FIGS. 8A and 8B. The gate pattern 150 may be or include a silicon layer, a stack of a silicon layer and a metal silicide layer, or a metal silicide layer. In an embodiment, the gate pattern 150 may be a metal layer (e.g., a tungsten layer). The gate pattern 150 may be the silicon layer, and the formation of the first barrier layer 151 of FIG. 9B may be omitted.

The gate pattern 150 may be locally formed in the gate region 127 and may have a recessed side surface that is spaced apart from the sidewalls of the inter-gate insulating patterns 125 toward the vertical pillars 130. A sacrificial layer 129 may be formed in the gate region 127 to cover the recessed side surface of the gate pattern 150. The sacrificial layer 129 may be a spin-on hardmask (SOH) layer or a photoresist layer. The sacrificial layer 129 may be locally formed in the gate region 127 by, for example, a patterning process including an anisotropic etching step.

The insulating spacer 143 may be formed on the sidewalls of the sacrificial layer 129 and the separation trenches 141. The formation of the insulating spacer 143 may include depositing a silicon oxide layer or a silicon nitride layer on an inner surface of the separation trench 141 and then anisotropically etching the same.

Referring to FIGS. 16A and 16B, the sacrificial layer 129 may be removed through the insulating spacer 143 to form the air gap 155a between the gate pattern 150 and the insulating spacer 143. The removal of the sacrificial layer 129 may be performed by an ashing process using oxygen, ozone, and/or ultraviolet (UV) light or a wet cleaning process. The air gap 155a may serve as a diffusion barrier structure in the present embodiments.

Thereafter, the strapping plugs 140, the strapping line 160, and the bit lines BL may be formed through the process of the previous embodiments described above.

Figure 17A:
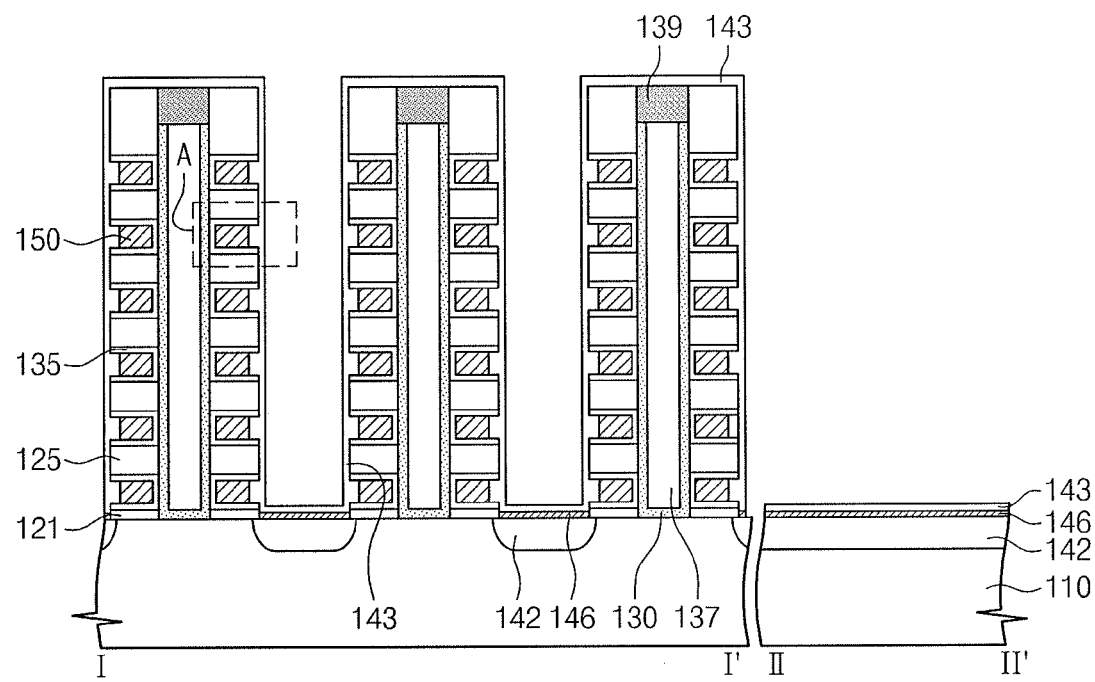
FIGS. 17A and 18A illustrate a method of fabricating a semiconductor device according to even other example embodiments and are sectional views of sections corresponding to the lines I-I' and II-II' of FIG. 4B, and FIGS. 17B and 18B illustrate enlarged sectional views of portions A of FIGS. 17A and 18A, respectively.
Figure 17B:
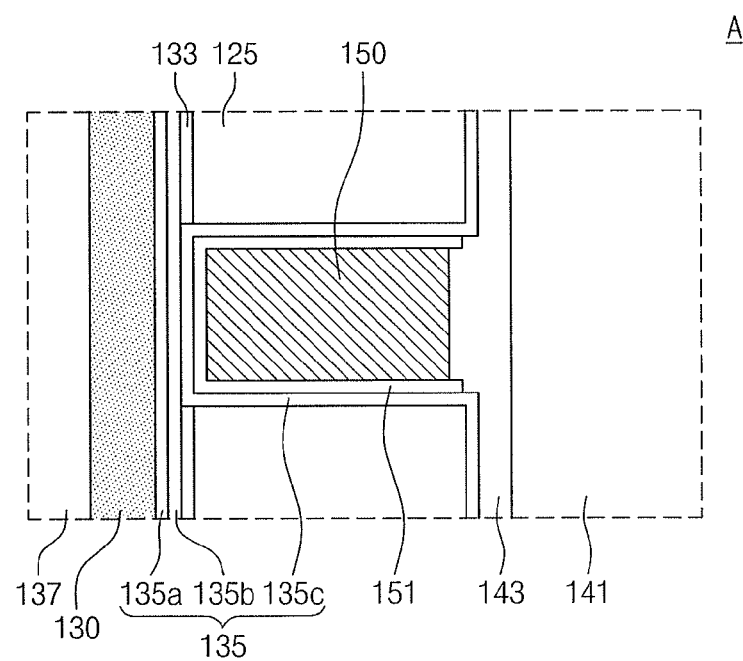
Figure 18A:
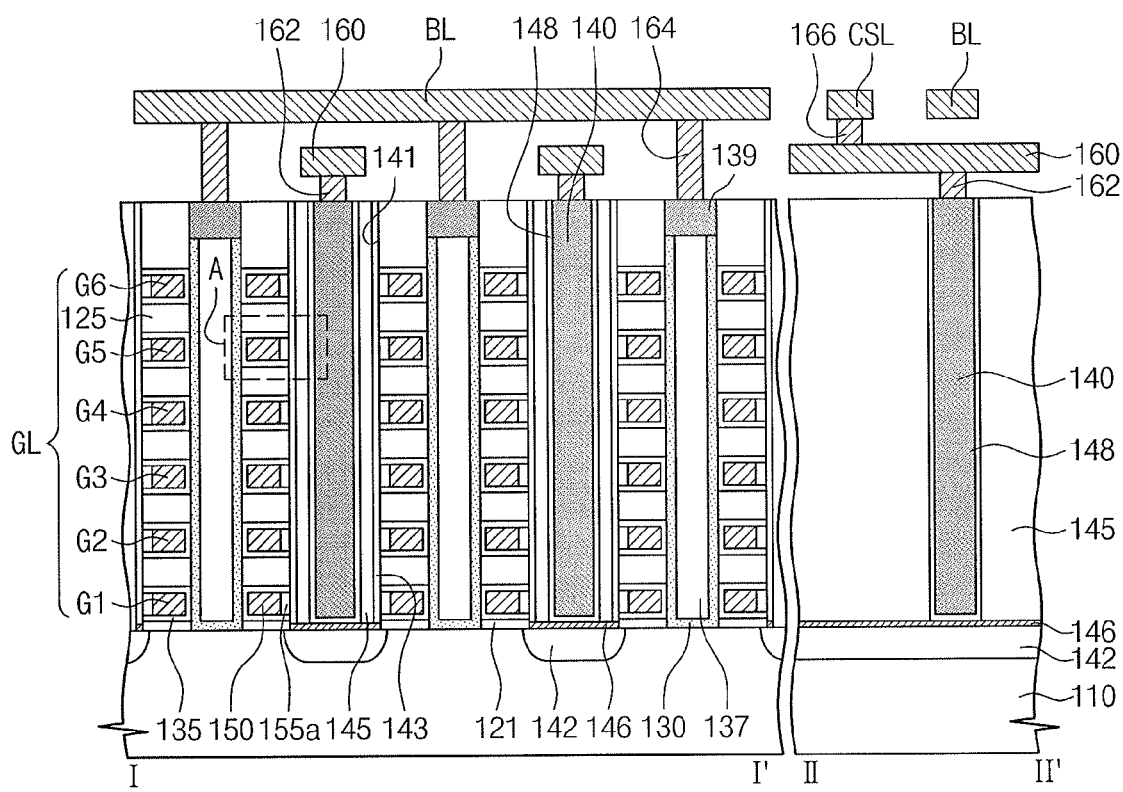
Figure 18B:
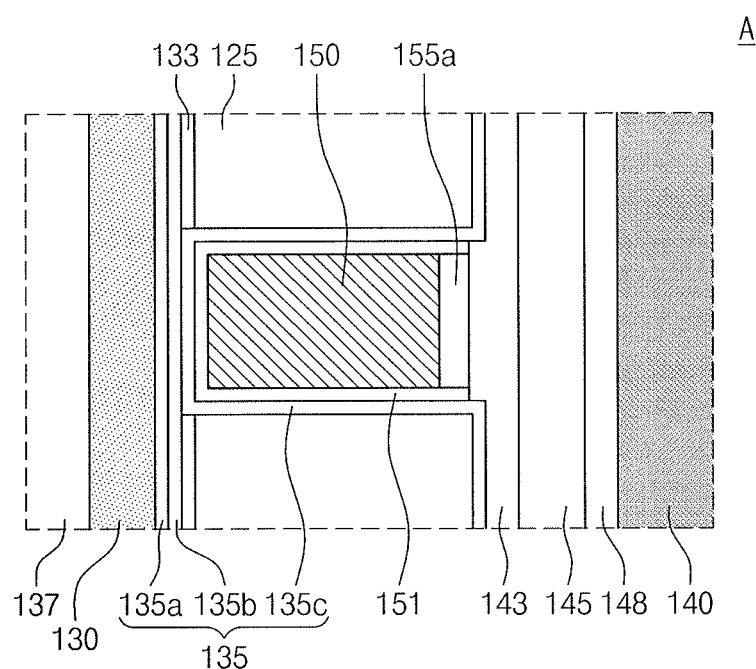

A method of fabricating a semiconductor device, according to even other example embodiments, will be described with reference to FIGS. 17A, 17B, 18A, and 18B. FIGS. 17A and 18A illustrate sectional views of sections corresponding to the lines I-I' and II-II' of FIG. 4B, and FIGS. 17B and 18B illustrate enlarged sectional views of portions A of FIGS. 17A and 18A, respectively. For concise description, a previously described element may be identified by a similar or identical reference number without repeating an overlapping description thereof.

Referring to FIGS. 17A and 17B, the gate pattern 150 may be formed in the gate region 127 described with reference to FIGS. 8A and 8B. The gate pattern 150 may be or include a silicon layer, a stack of a silicon layer and a metal silicide layer, or a metal silicide layer. In an embodiment, the gate pattern 150 may be a metal layer (e.g., a tungsten layer). The gate pattern 150 may be the silicon layer, and the formation of the first barrier layer 151 of FIG. 9B may be omitted.

The gate pattern 150 may be locally formed in the gate region 127 and may have a recessed side surface that is spaced inward apart from the sidewalls of the inter-gate insulating patterns 125. The insulating spacer 143 may be formed in the gate region 127 and on the sidewall of the separation trenches 141. The formation of the insulating spacer 143 may include depositing a silicon oxide layer on an inner surface of the separation trenches 141 and then anisotropically etching the same. The silicon oxide layer may be a layer, whose volume may be reduced by, for example, a thermal treatment process. For example, a spin-on-glass (SOG) layer may be used as the silicon oxide layer for the insulating spacer 143.

Referring to FIGS. 18A and 18B, a thermal treatment process may be performed on the structure with the insulating spacer 143, the insulating spacer 143 may be shrunk and be spaced apart from the gate pattern 150, and the air gap 155a may be formed between the gate pattern 150 and the insulating spacer 143. The air gap 155a may serve as a diffusion barrier structure in the present embodiments.

Thereafter, the strapping plugs 140, the strapping line 160, and the bit lines BL may be formed through the process of the previous embodiments described above.

Figure 19A:
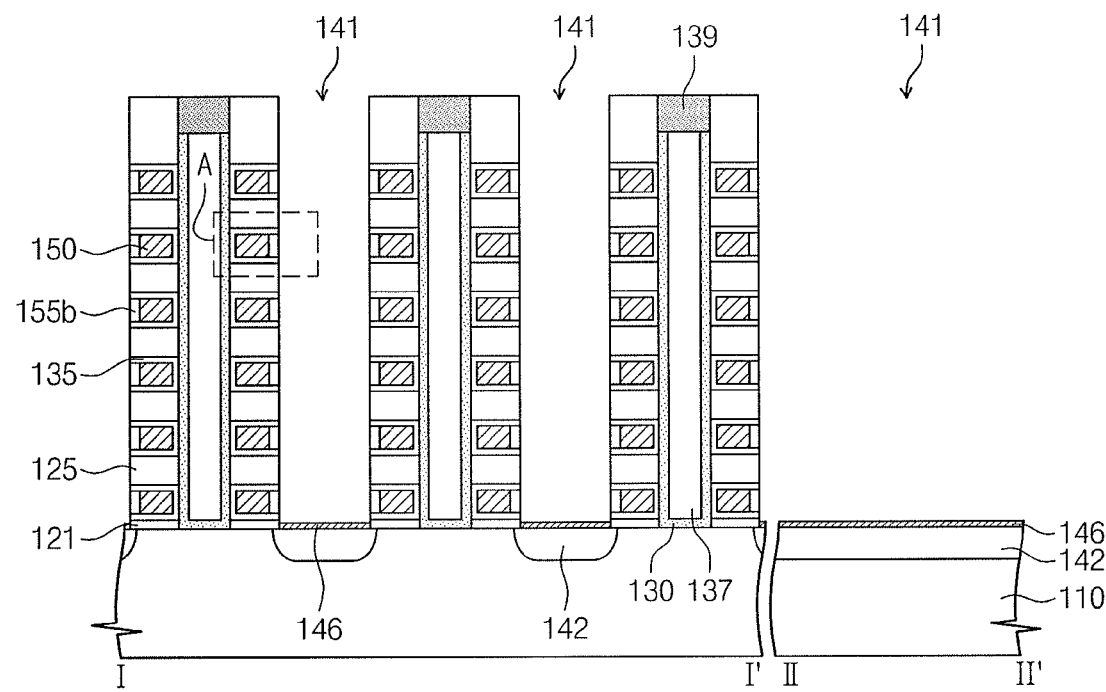
FIGS. 19A and 20A illustrate a method of fabricating a semiconductor device according to yet other example embodiments and are sectional views of sections corresponding to the lines I-I' and II-II' of FIG. 4B, and FIGS. 19B and 20B illustrate enlarged sectional views of portions A of FIGS. 19A and 20A, respectively.
Figure 19B:
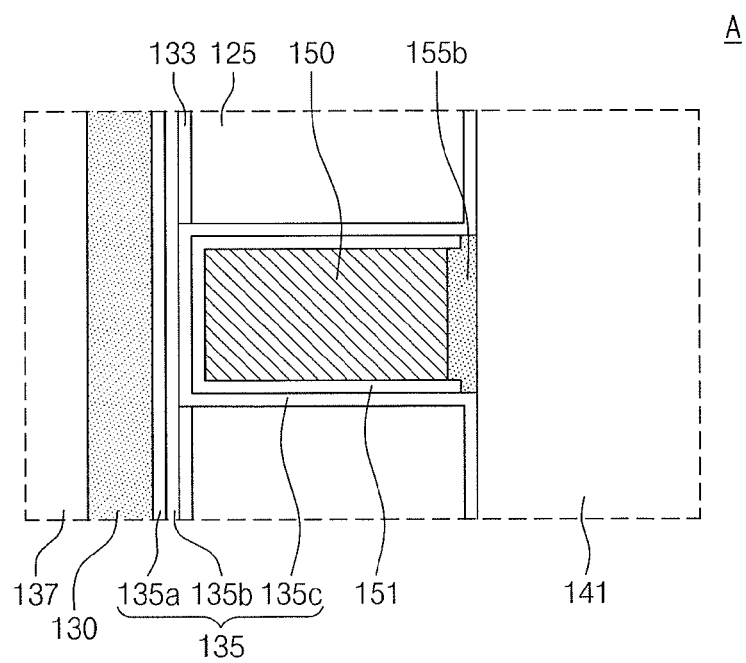
Figure 20A:
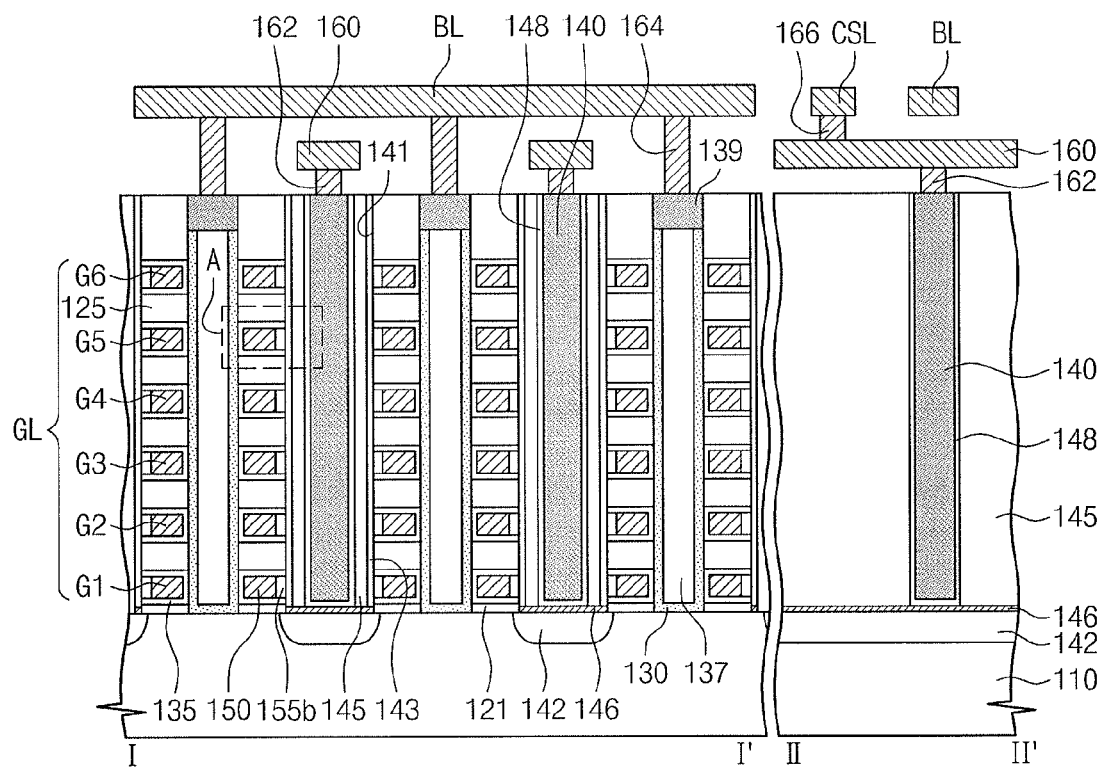
Figure 20B:
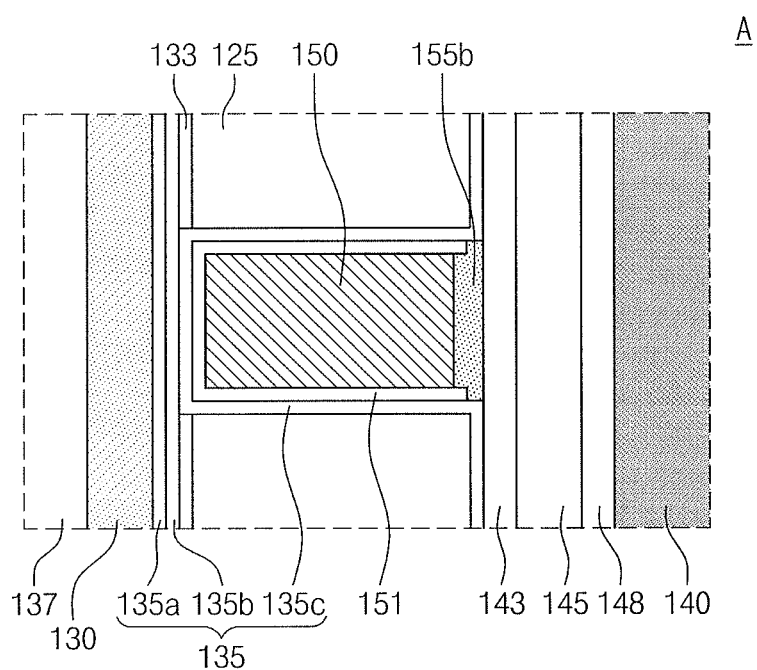

A method of fabricating a semiconductor device, according to yet other example embodiments, will be described with reference to FIGS. 19A, 19B, 20A, and 20B. FIGS. 19A and 20A illustrate sectional views of sections corresponding to the lines I-I' and II-II' of FIG. 4B, and FIGS. 19B and 20B illustrate enlarged sectional views of portions A of FIGS. 19A and 20A, respectively. For concise description, a previously described element may be identified by a similar or identical reference number without repeating an overlapping description thereof.

Referring to FIGS. 19A and 19B, the gate pattern 150 may be formed in the gate region 127 described with reference to FIGS. 8A and 8B. The gate pattern 150 may be or include a silicon layer, a stack of a silicon layer and a metal silicide layer, or a metal silicide layer. In an embodiment, the gate pattern 150 may be a metal layer (e.g., a tungsten layer). The gate pattern 150 may be the silicon layer, and the formation of the first barrier layer 151 of FIG. 9B may be omitted.

The gate pattern 150 may be formed to have a side surface exposed by the separation trenches 141. A nitridation process may be selectively performed on the exposed side surface of the gate pattern 150. The nitridation process may include thermally treating the structure with the gate pattern 150 in the ambient of ammonia, nitrogen, or nitrous oxide gas. As the result of the nitridation process, the diffusion barrier structure 155 may be selectively formed on the exposed side surface of the gate pattern 150. For example, a metal nitride layer 155b, which serves as the diffusion barrier structure 155, may be formed to cover the exposed side surface of the gate pattern 150. The gate pattern 150 may include a first element M, and the metal nitride layer 155b may include nitride of the first element M. The first element M may include, for example, nickel, cobalt, titanium, or tungsten, and the metal nitride layer 155b may include a layer of nickel nitride, cobalt nitride, titanium nitride, or tungsten nitride. Further, the metal nitride layer 155b may include a layer of nickel silicon nitride, cobalt silicon nitride, titanium silicon nitride, or tungsten silicon nitride.

Referring to FIGS. 20A and 20B, the strapping plugs 140, the strapping line 160, and the bit lines BL may be formed through the process of the previous embodiments described above.

Figure 21A:
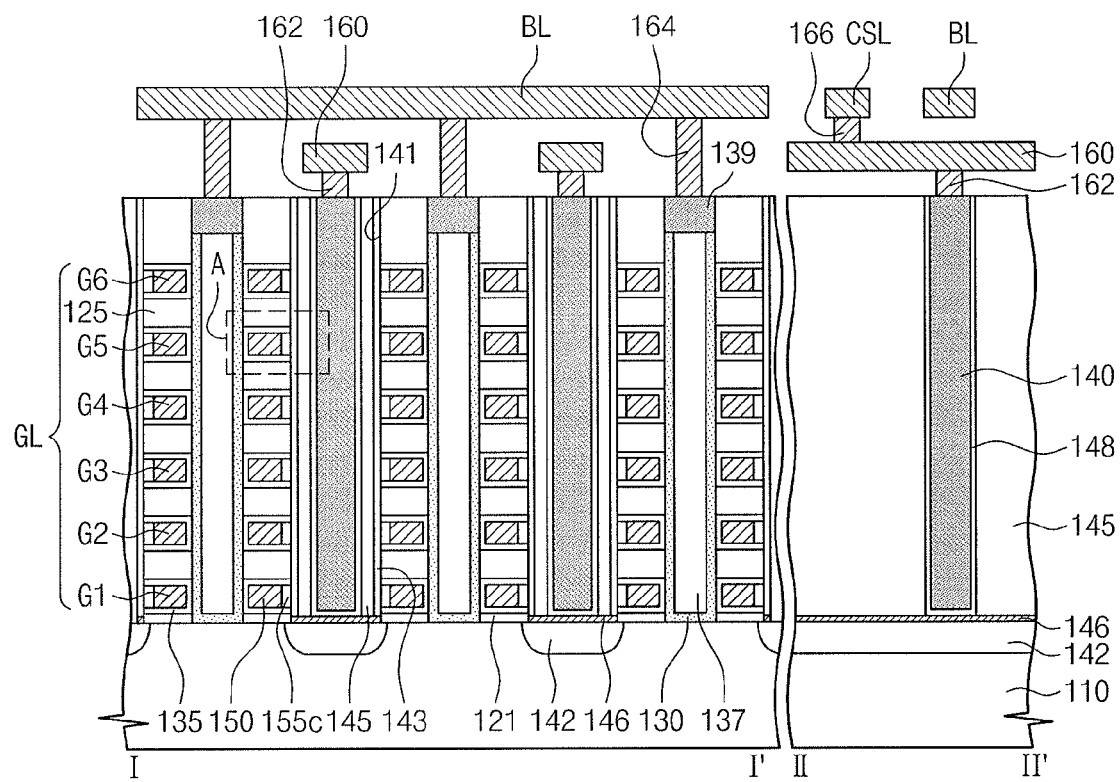
FIG. 21A illustrates a method of fabricating a semiconductor device according to further example embodiments and is a sectional view of sections corresponding to the lines I-I' and II-II' of FIG. 4B.
Figure 21B:
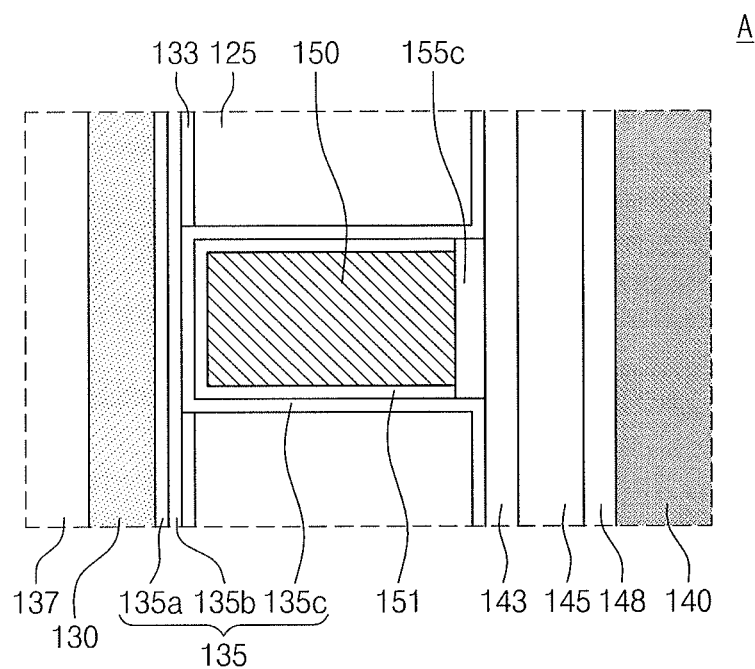
FIG. 21B illustrates an enlarged sectional view of a portion A of FIG. 21A.

A method of fabricating a semiconductor device, according to further example embodiments, will be described with reference to FIGS. 21A and 21B. FIG. 21A illustrates a sectional view of sections corresponding to the lines I-I' and II-II' of FIG. 4B, and FIG. 21B illustrates an enlarged sectional view of a portion A of FIG. 21A. For concise description, a previously described element may be identified by a similar or identical reference number without repeating an overlapping description thereof.

Referring to FIGS. 21A and 21B, the gate pattern 150 may be formed in the gate region 127 described with reference to FIGS. 8A and 8B. In the present embodiments, the gate pattern 150 may be or include a silicon layer, a stack of a silicon layer and a metal silicide layer, or a metal silicide layer. In an embodiment, the gate pattern 150 may be a metal layer (e.g., a tungsten layer). The gate pattern 150 may be the silicon layer, and the formation of the first barrier layer 151 of FIG. 9B may be omitted.

The gate pattern 150 may be locally formed in the gate region 127 and may have a recessed side surface that is spaced inward apart from the sidewalls of the inter-gate insulating patterns 125. A barrier dielectric layer 155c may be formed on the sidewalls of the gate pattern 150 and the separation trench 141. The barrier dielectric layer 155c may include an insulating layer having a density higher than the silicon oxide layer, and exhibiting an etch rate lower than the silicon oxide layer. For example, the barrier dielectric layer 155c may include a silicon nitride layer, an aluminum oxide layer, or an aluminum nitride layer. The barrier dielectric layer 155c may be locally formed in the gate region 127, for example, using an anisotropic etching process. In certain embodiments, the insulating spacer 143 may be further formed on the barrier dielectric layer 155c. The formation of the insulating spacer 143 may include forming a silicon oxide layer or a silicon nitride layer. Barrier dielectric layer 155c may remain on the sidewall of the separation trench 141, and the formation of the insulating spacer 143 may be omitted. The barrier dielectric layer 155c may serve as the diffusion barrier structure in the present embodiments.

Thereafter, the strapping plugs 140, the strapping line 160, and the bit lines BL may be formed through the process of the previous embodiments described above.

Figure 22A:
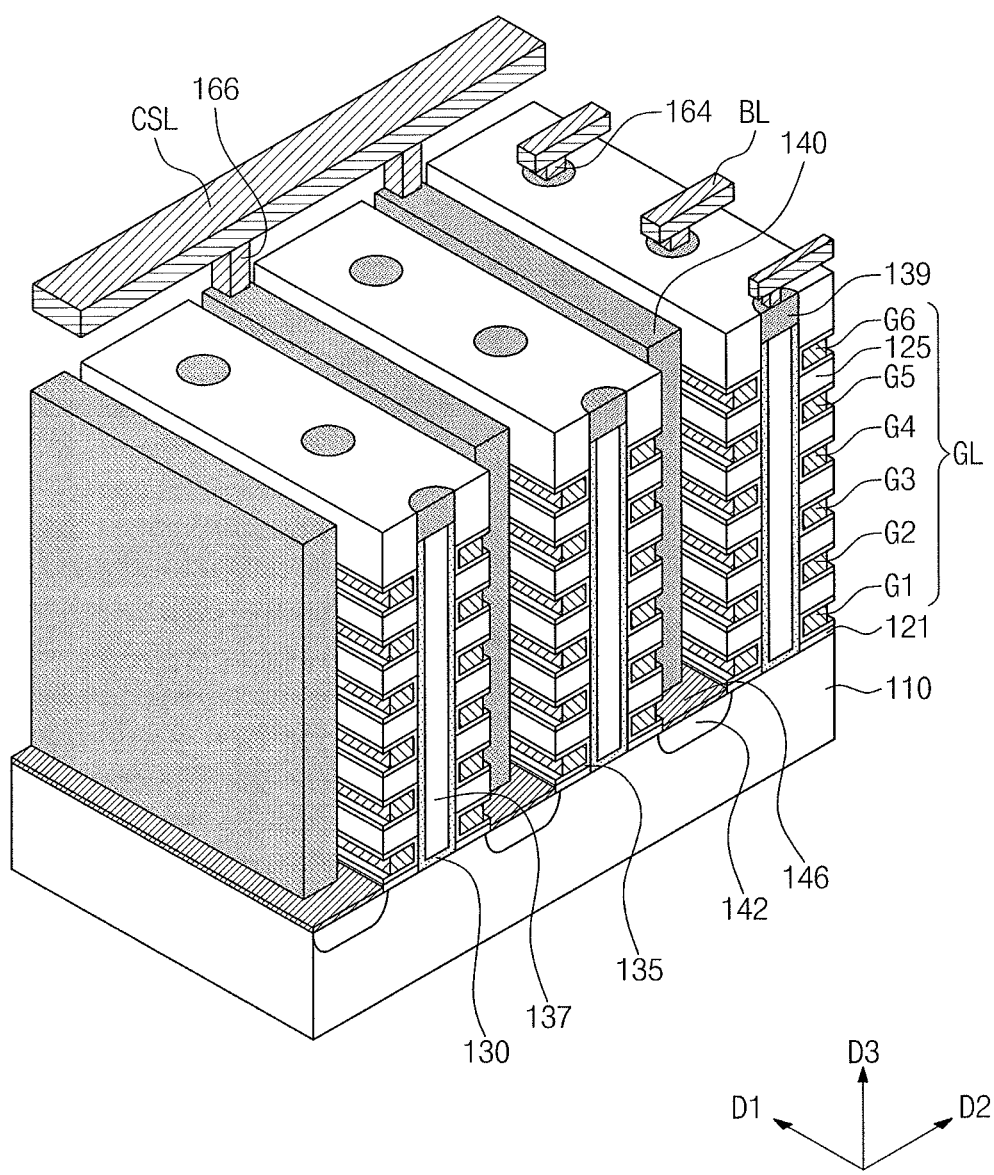
FIGS. 22A and 22B illustrate perspective and plan views of a semiconductor device according to other example embodiments.
Figure 22B:
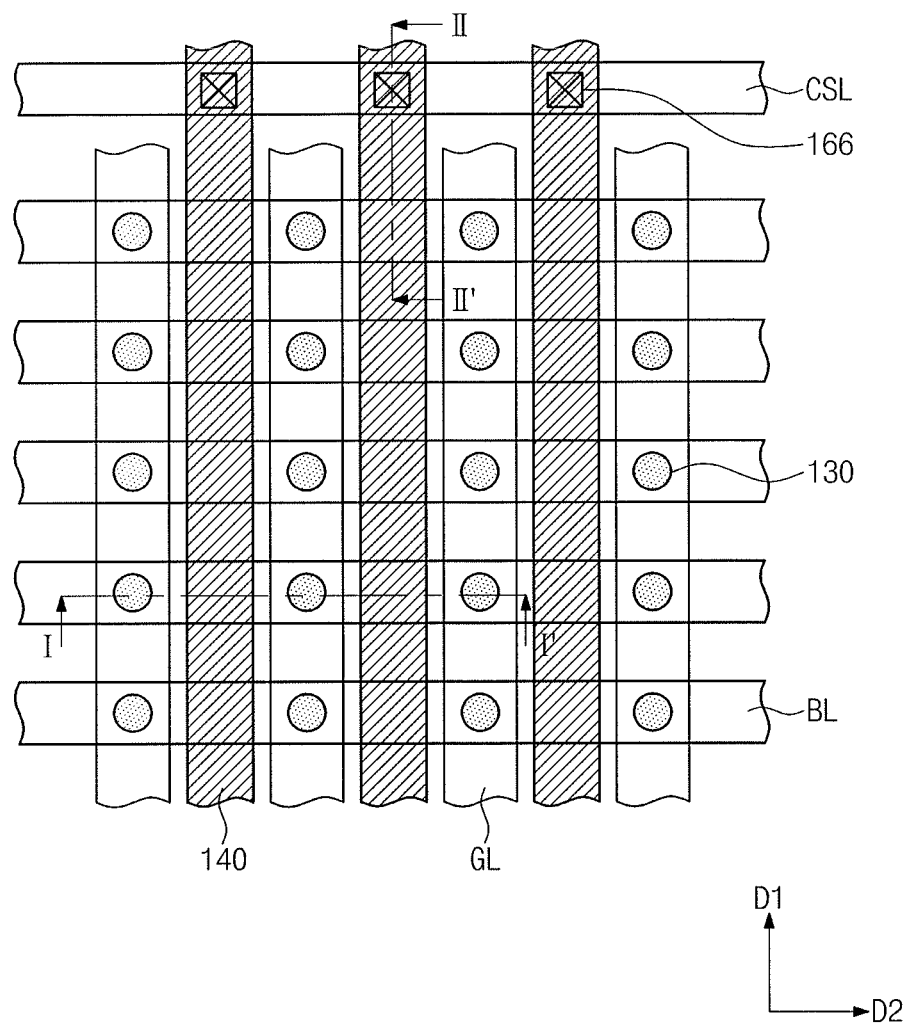
Figure 22C:
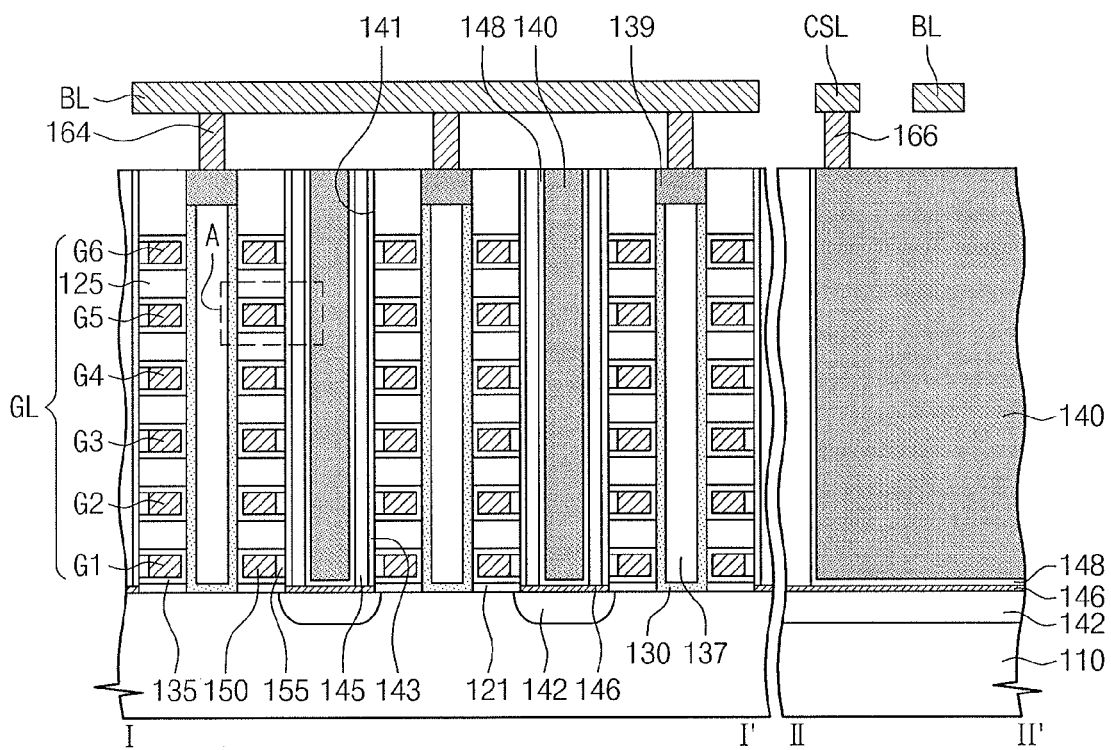
FIG. 22C illustrates a sectional view taken along lines I-I' and II-II' of FIG. 22B.

FIGS. 22A and 22B illustrate perspective and plan views of a semiconductor device according to other example embodiments, and FIG. 22C illustrates a sectional view taken along lines I-I' and II-II' of FIG. 22B. For concise description, a previously described element may be identified by a similar or identical reference number without repeating an overlapping description thereof.

Referring to FIGS. 22A through 22C, unlike the previous embodiments of FIGS. 4A through 4C, one strapping plug 140 may be provided on each of the common source regions 142. The strapping plug 140 may be electrically connected to the common source region 142 through the device isolation pattern 145. The strapping plug 140 may extend parallel to the first direction D1. The second barrier layer 148 may be provided between the strapping plug 140 and the device isolation pattern 145. The strapping plug 140 may include a metal (e.g., tungsten, copper, or aluminum). The second barrier layer 148 may include a conductive metal nitride (e.g., titanium nitride or tantalum nitride). The common contact layers 146 may be provided between the strapping plug 140 and the common source regions 142.

Figure 23A:
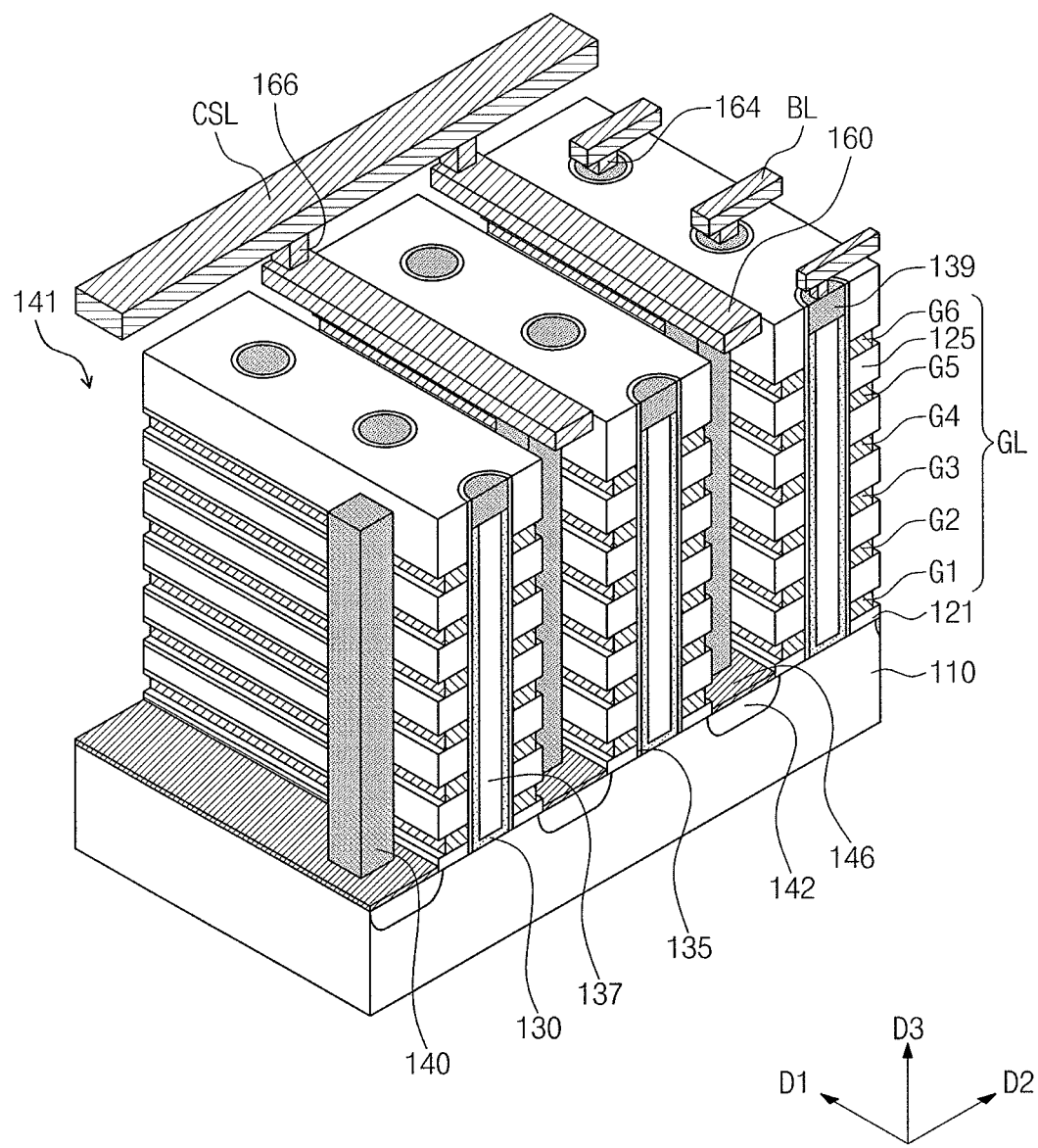
FIGS. 23A and 23B illustrate perspective and plan views of a semiconductor device according to still other example embodiments.
Figure 23B:
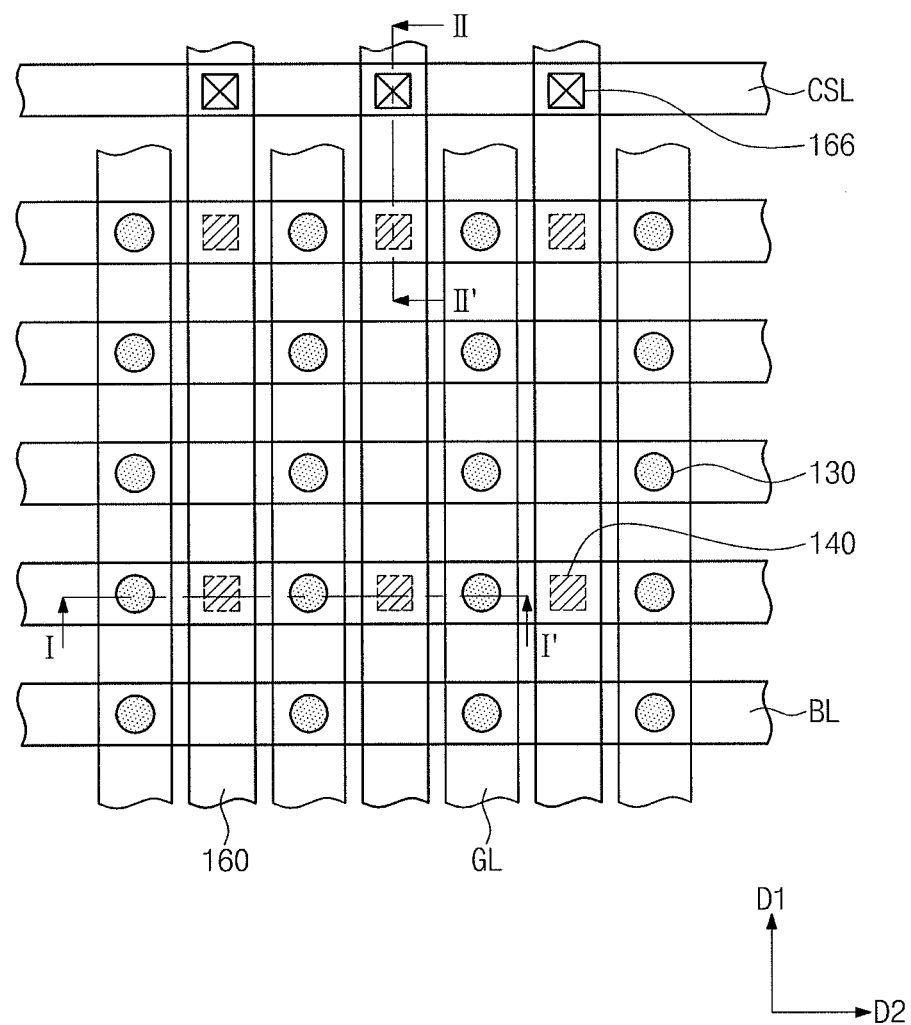
Figure 23C:
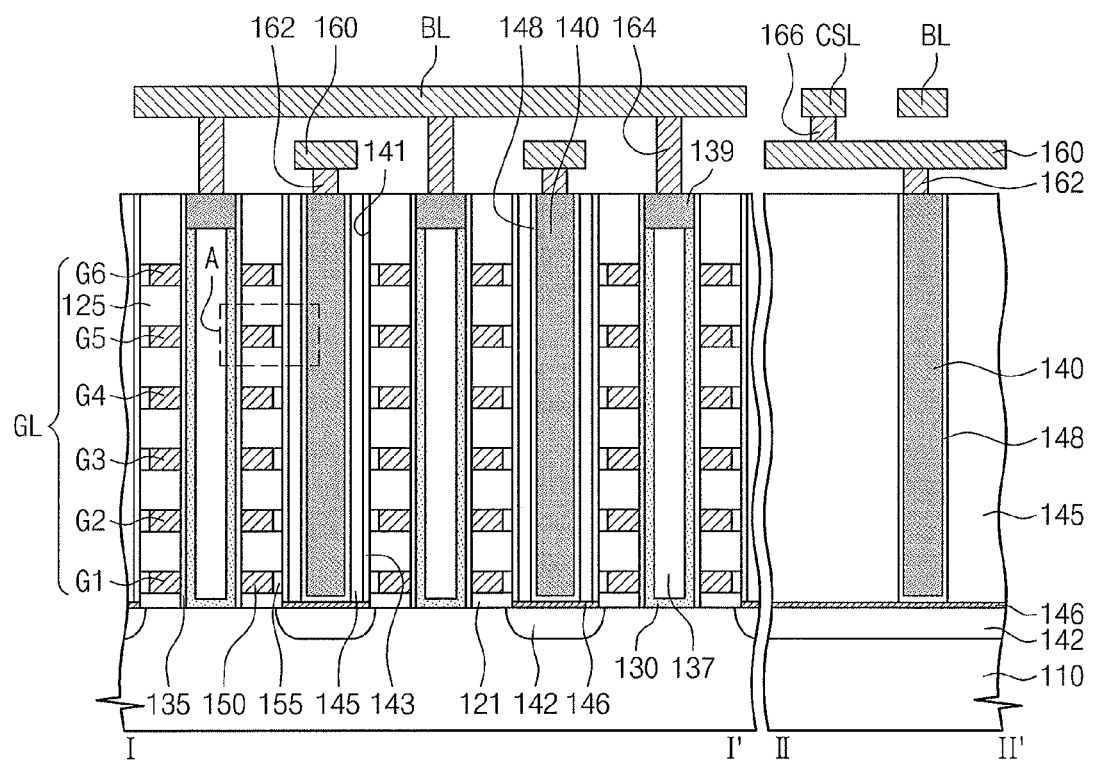
FIG. 23C illustrates a sectional view taken along lines I-I' and II-II' of FIG. 23B.

FIGS. 23A and 23B illustrate perspective and plan views of a semiconductor device according to still other example embodiments, and FIG. 23C illustrates a sectional view taken along lines I-I' and II-II' of FIG. 23B. A portion A of FIG. 23C may be configured to have a section illustrated in the enlarged view of FIG. 33B, as will be described in more detail below. For concise description, a previously described element may be identified by a similar or identical reference number without repeating an overlapping description thereof.

Referring to FIGS. 23A through 23C, the data storing element 135 disposed between the gate electrodes G1-G6 and the vertical pillars 130 may extend between the inter-gate insulating patterns 125 and the vertical pillars 130. In the present embodiments, the data storing element 135 may not be provided between the inter-gate insulating patterns 125 and the gate electrodes G1-G6.

In the present embodiments, as shown in FIG. 23A, the strapping plug 140 may have the same structure as that described with reference to FIGS. 4A through 4C. In an embodiment, the strapping plug 140 may have the same structure as that described with reference to FIGS. 22A through 22C.

A method of fabricating the semiconductor device of FIGS. 23A through 23C, according to further example embodiments, will be described with reference to FIGS. 24A through 33A and 24B through 33B. FIGS. 24A through 33A illustrate sectional views of sections corresponding to the lines I-I' and II-II' of FIG. 23B, and FIGS. 24B through 33B illustrate enlarged sectional views of portions A of FIGS. 24A through 33A, respectively.

Figure 24A:
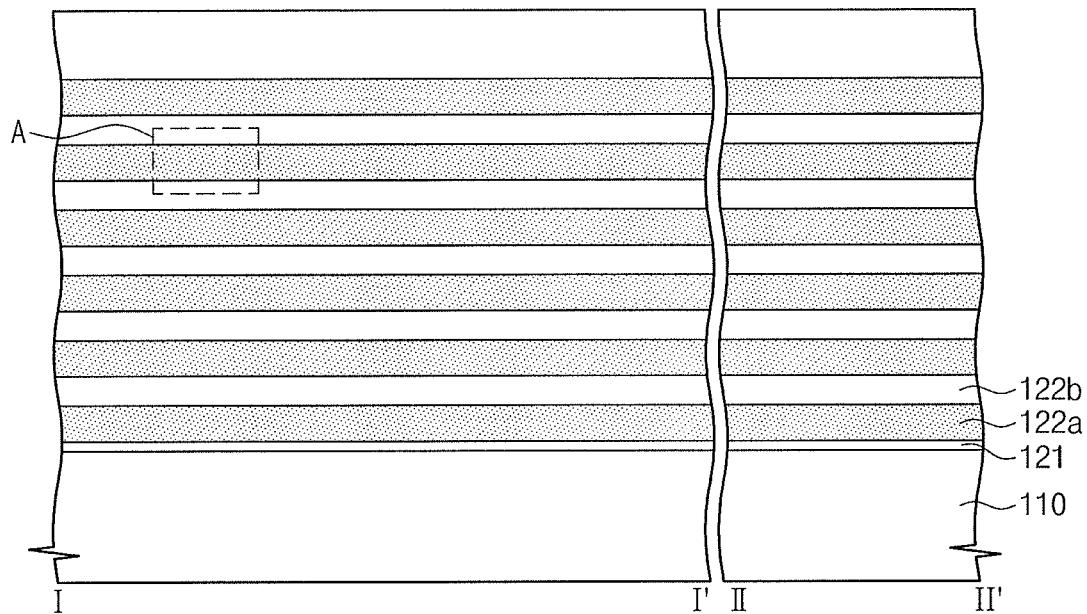
FIGS. 24A through 33A illustrate a method of fabricating a semiconductor device according to further example embodiments and illustrate sectional views of sections corresponding to the lines I-I' and II-II' of FIG. 23B, and FIGS. 24B through 33B illustrate enlarged sectional views of portions A of FIGS. 24A through 33A, respectively.
Figure 24B:
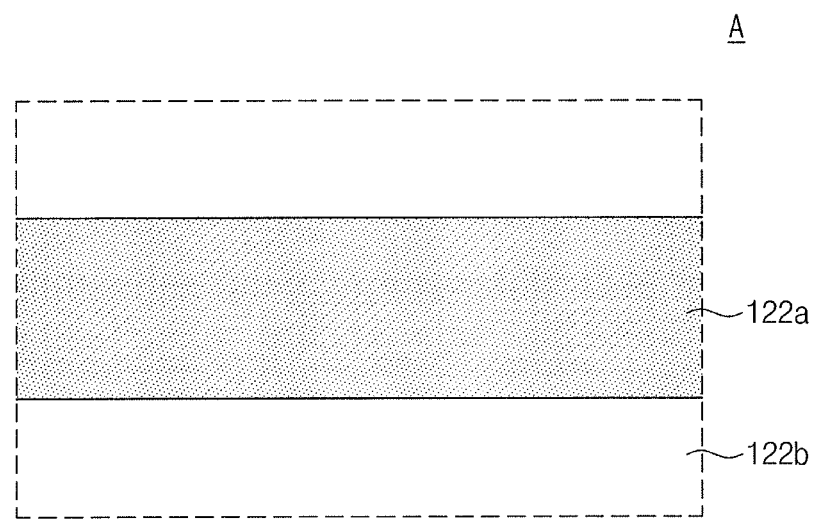

Referring to FIGS. 24A and 24B, the substrate 110 may be provided. The substrate 110 may have the first conductivity type (e.g., p-type). The buffer dielectric layer 121 may be formed on the substrate 110. The buffer dielectric layer 121 may be, for example, a silicon oxide layer. In certain embodiments, the buffer dielectric layer 121 may be formed by a thermal oxidation process. First mold layers 122a and second mold layers 122b may be alternately stacked on the buffer dielectric layer 121. The first and second mold layers 122a and 122b may be formed of materials having substantially the same chemical composition and exhibiting different etching properties in a wet etching process. The difference in etching properties between the first and second mold layers 122a and 122b may make it easy to form vertical holes penetrating the first mold layers 122a and second mold layers 122b. The first and second mold layers 122a and 122b may have different chemical compositions, and it may be difficult to etch the first and second mold layers 122a and 122b at once, due to a difference in etch rate therebetween in a dry etching process. In example embodiments, the first and second mold layers 122a and 122b may be poly-silicon layers with different doping concentrations. For example, the first mold layers 122a may be formed of undoped poly-silicon, and the second mold layers 122b may be formed of doped poly-silicon. For example, the second mold layers 122b may be poly-silicon layers that are doped with P, B, or As. The first and second mold layers 122a and 122b may be formed by, for example, a CVD process. In the afore-described example, the poly-silicon layers are used for the first and second mold layers 122a and 122b. In an embodiment, the first and second mold layers 122a and 122b may be amorphous silicon layers.

Figure 25A:
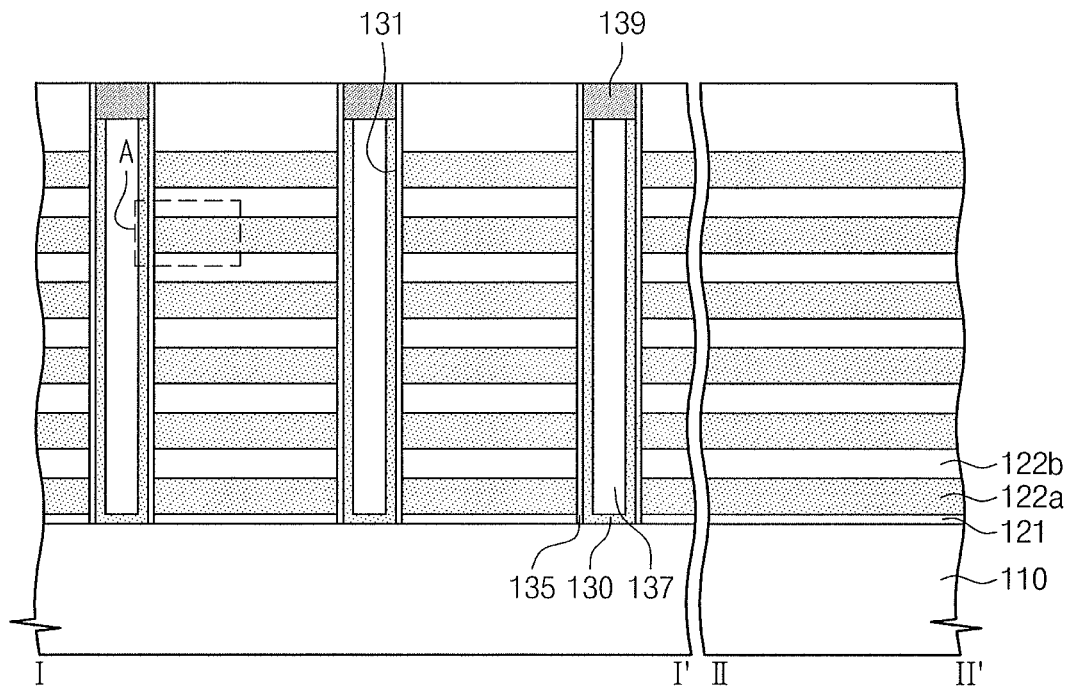
Figure 25B:
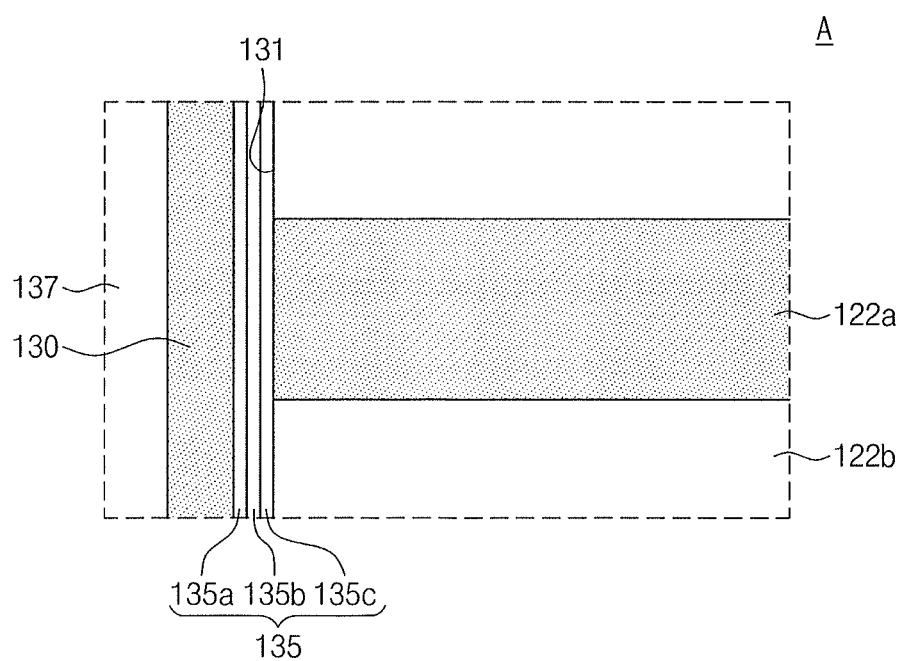

Referring to FIGS. 25A and 25B, the vertical holes 131 may be formed to penetrate the buffer dielectric layer 121 and the first and second mold layers 122a and 122b and expose the substrate 110. The data storing element 135 may be formed on the sidewalls of the vertical holes 131. The data storing element 135 may include the blocking insulating layer 135c, the charge storing layer 135b, and the tunnel insulating layer 135a that are sequentially stacked on the sidewalls of the vertical holes 131. The blocking insulating layer 135c may be a multi-layered structure including a plurality of thin-films. For example, the blocking insulating layer 135c may include an aluminum oxide layer and a silicon oxide layer, and a stacking order or position of the aluminum oxide layer and the silicon oxide layer may be variously changed. The charge storing layer 135b may be a charge trap layer or an insulating layer containing conductive nano particles. The charge trap layer may include, for example, a silicon nitride layer. The tunnel insulating layer 135a may be a silicon oxide layer. The blocking insulating layer 135c, the charge storing layer 135b, and the tunnel insulating layer 135a may be formed using a CVD or ALD process.

The vertical pillars 130 may be formed in the vertical holes 131 to cover the tunnel insulating layer 135a. Each of the vertical pillars 130 may be formed using a similar method to that of FIGS. 6A and 6B, and may have a structure similar to that of FIGS. 6A and 6B.

Figure 26A:
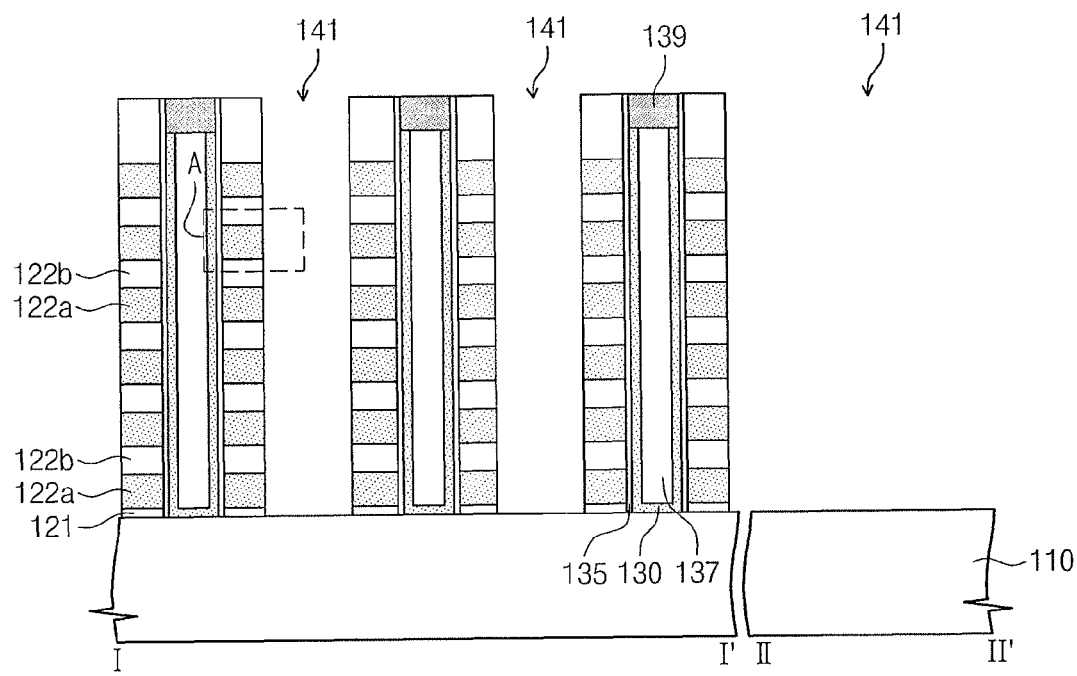
Figure 26B:
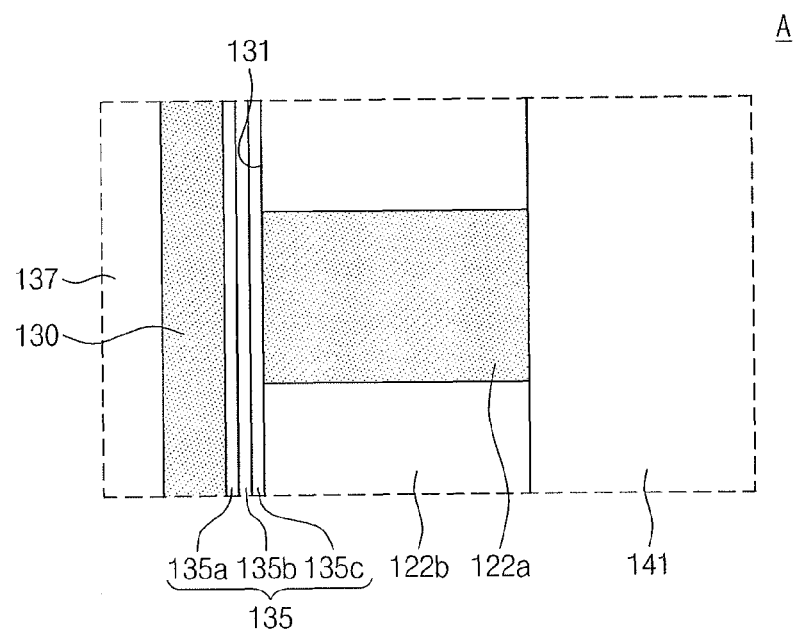

Referring to FIGS. 26A and 26B, the buffer dielectric layer 121, the first mold layers 122a, and the second mold layers 122b may be successively patterned to form the separation trenches 141, which are spaced apart from each other to expose the substrate 110, and each of which extends parallel to the first direction.

Figure 27A:
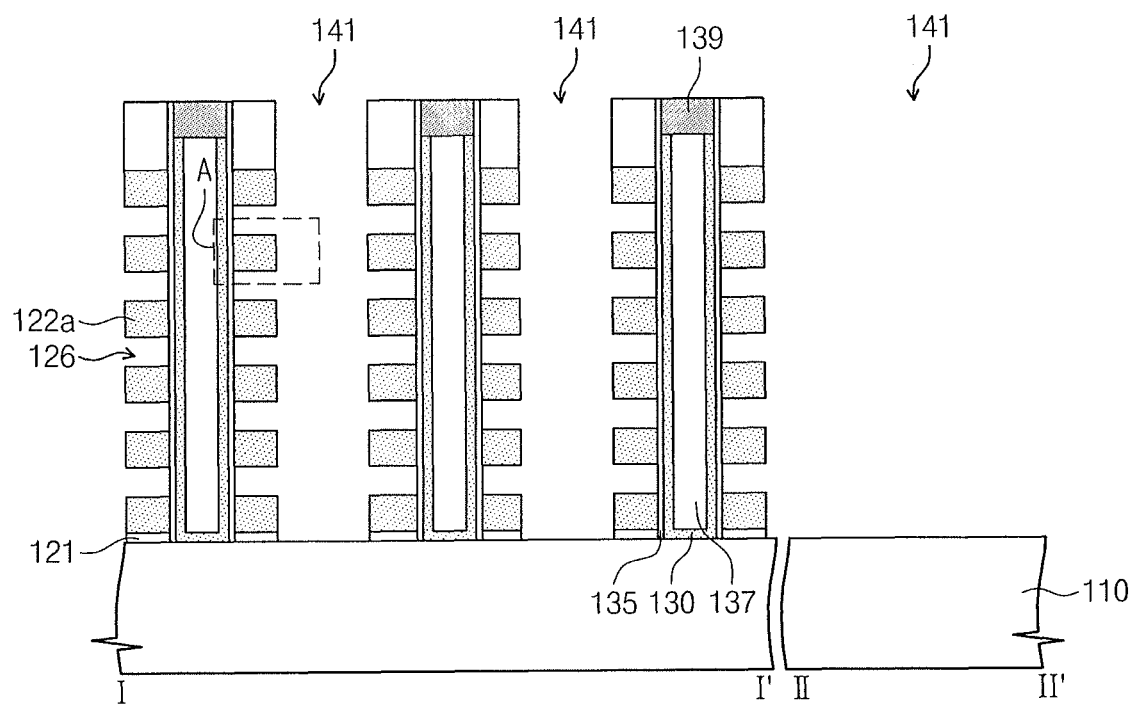
Figure 27B:
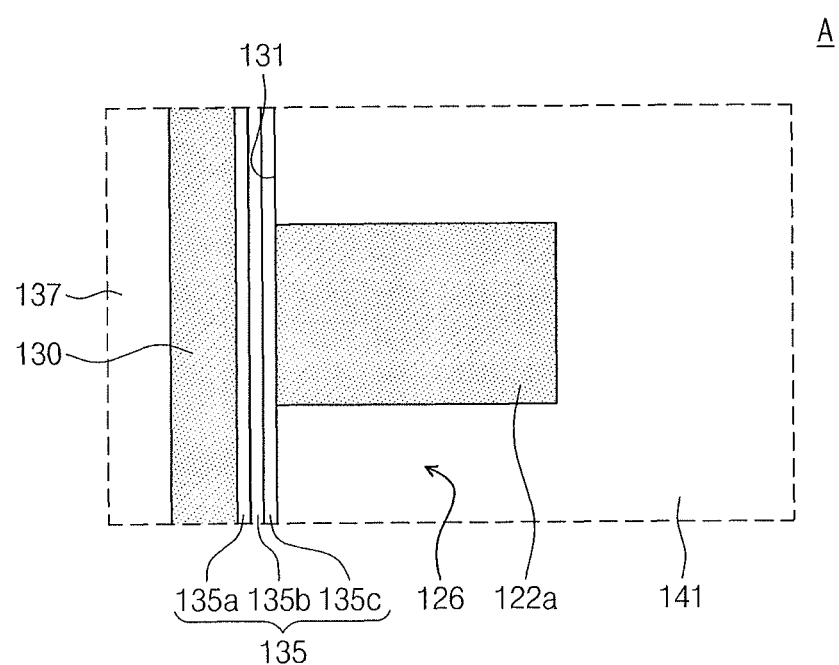

Referring to FIGS. 27A and 27B, the second mold layers 122b exposed by the separation trenches 141 may be selectively removed to form insulating regions 126. The insulating regions 126 may be regions that are formed by removing the second mold layers 122b. The first mold layers 122a may be formed of un-doped poly-silicon and the second mold layers 122b may be formed of doped poly-silicon, and the removal of the second mold layers 122b may be performed, in a wet etching manner, using etching solution containing nitric, acetic, and hydrofluoric acid and de-ionized (DI)

water. Each of the insulating regions 126 may be formed to partially expose the sidewalls of the vertical pillars 130.

Figure 28A:
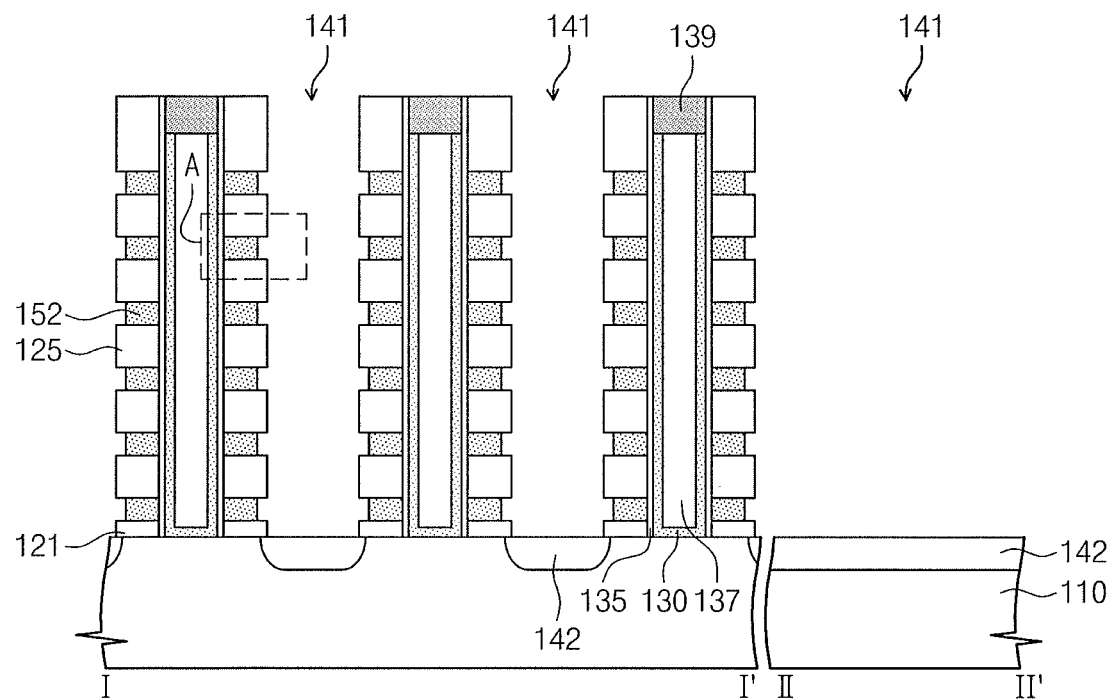
Figure 28B:
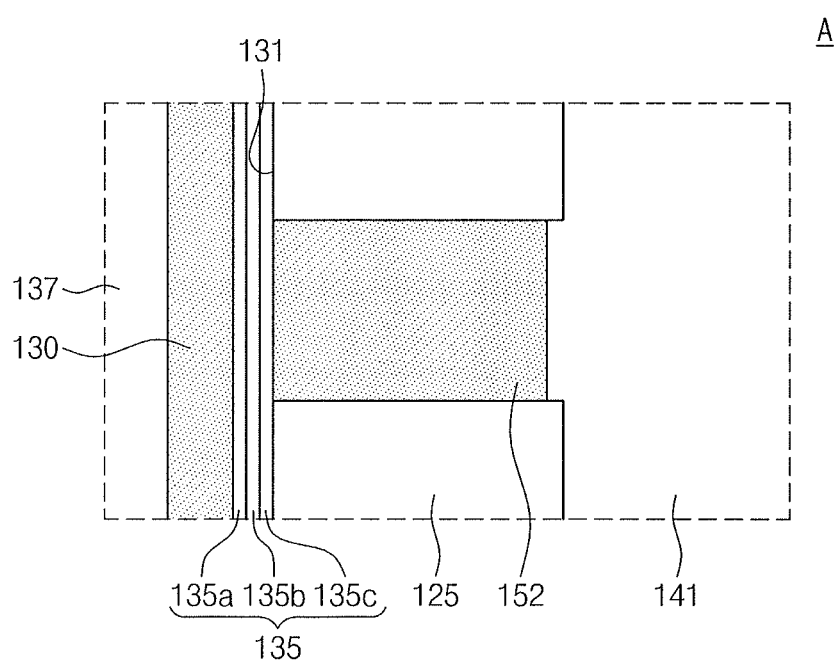

Referring to FIGS. 28A and 28B, the inter-gate insulating patterns 125 may be formed in the insulating regions 126, respectively, through the separation trenches 141. The inter-gate insulating patterns 125 may be formed of or include silicon oxide. The first mold layers 122a may be recessed from outer side surfaces of the inter-gate insulating patterns 125, and the silicon layers 152 may be formed. The silicon layers 152 may be formed of poly-silicon or amorphous silicon.

The common source regions 142 may be formed in the substrate 110 exposed by the separation trench 141. In example embodiments, the common source regions 142 may be formed, for example, using an ion implantation process, to have the second conductivity type and a high impurity concentration.

Figure 29A:
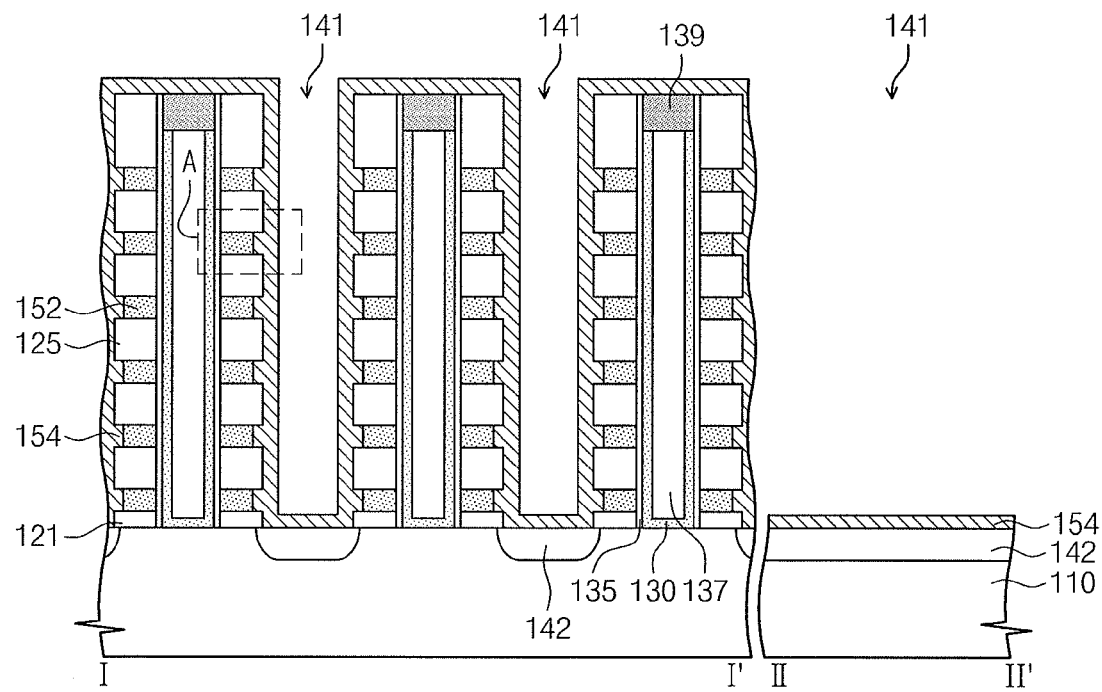
Figure 29B:
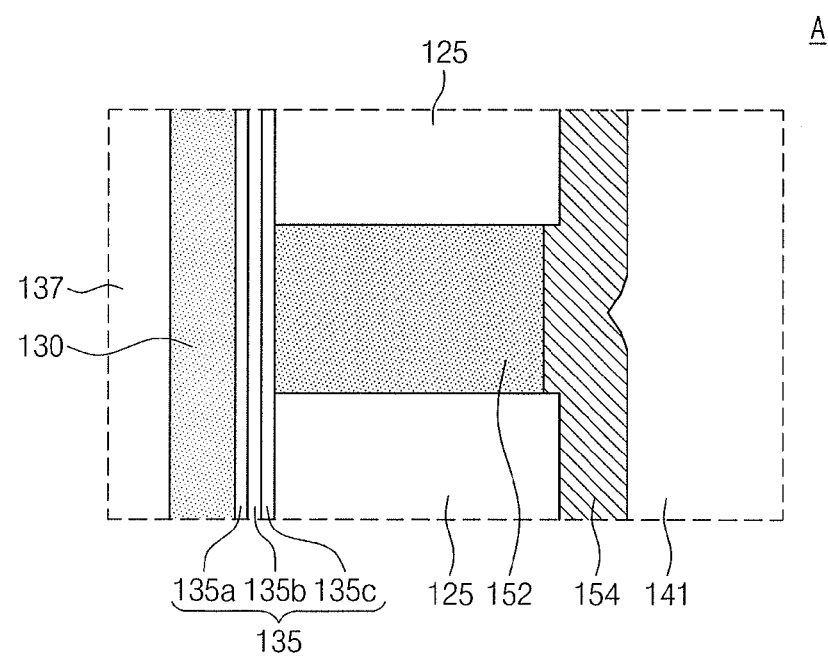

Referring to FIGS. 29A and 29B, the first metal layer 154 may be formed on the top surfaces of the common source regions 142 and on the sidewalls of the inter-gate insulating patterns 125 and the silicon layer 152. The first metal layer 154 may include a first element M (e.g., nickel, cobalt, titanium, or tungsten). The first metal layer 155 may be formed using, for example, a CVD, ALD, or sputtering process.

Figure 30A:
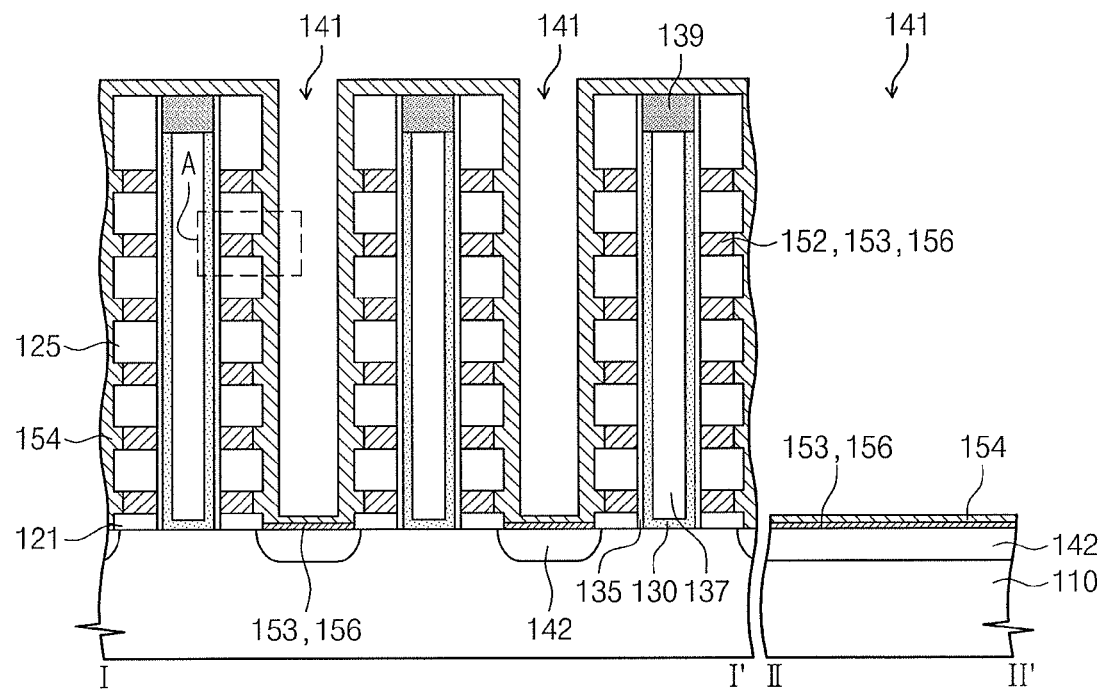
Figure 30B:
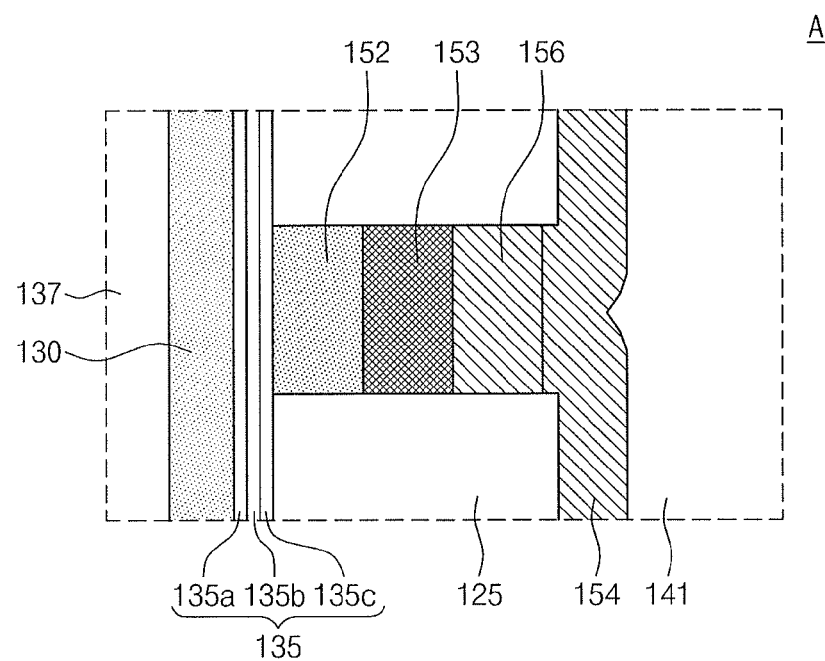

Referring to FIGS. 30A and 30B, a first thermal treatment process may be performed. The first thermal treatment process may be performed at a temperature of 250-600° C. The first thermal treatment process may be a furnace annealing process. A portion of the silicon layer 152 may be reacted with the first metal layer 154 during the first thermal treatment process, and the first silicide layer 153 and the second silicide layer 156 may be formed. The first silicide layer 153 may be adjacent to the silicon layer 152, and the second silicide layer 156 may be adjacent to the first metal layer 154. The first silicide layer 153 may be a mono metal silicide layer (MSi) having a fully transformed phase, and the second silicide layer 156 may be a metal silicide layer having a partially transformed phase ($M_xSi$ and $x>1$, for example, $M_2Si$). Thicknesses of the first and second silicide layers 153 and 156 may be changed by controlling a diffusion property (e.g., diffusion length) of metallic element constituting the first metal layer 154. For example, the diffusion property of metallic element constituting the first metal layer 154 may be controlled by adjusting process conditions of temperature and reaction duration in the first thermal treatment process.

Figure 31A:
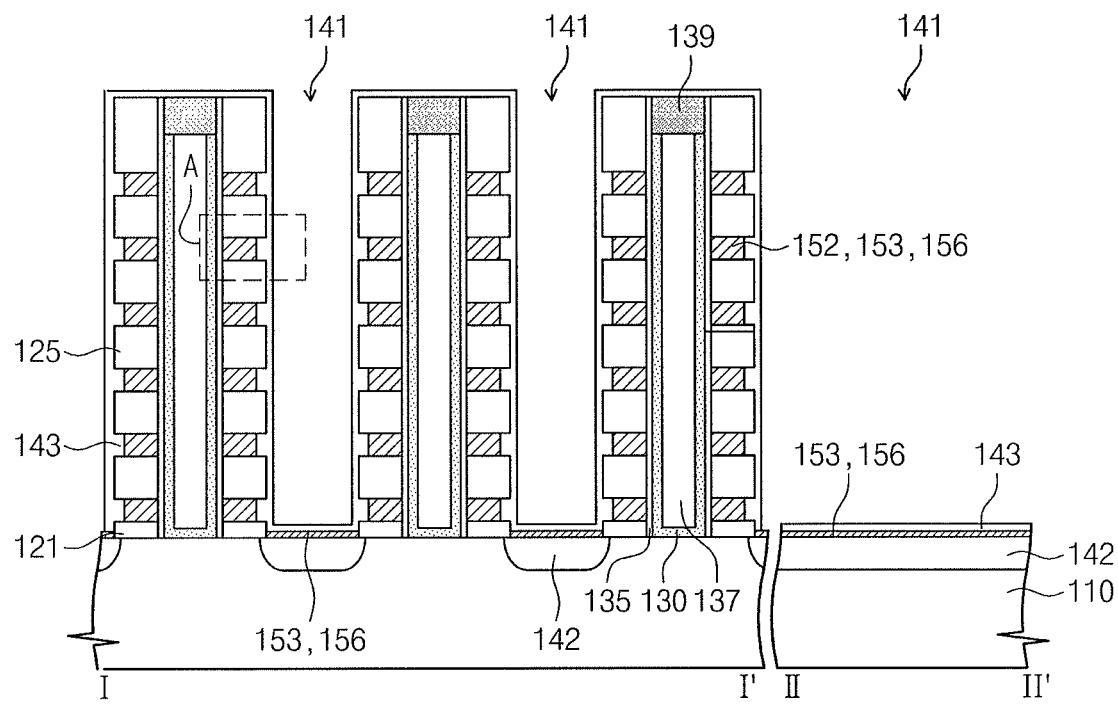
Figure 31B:
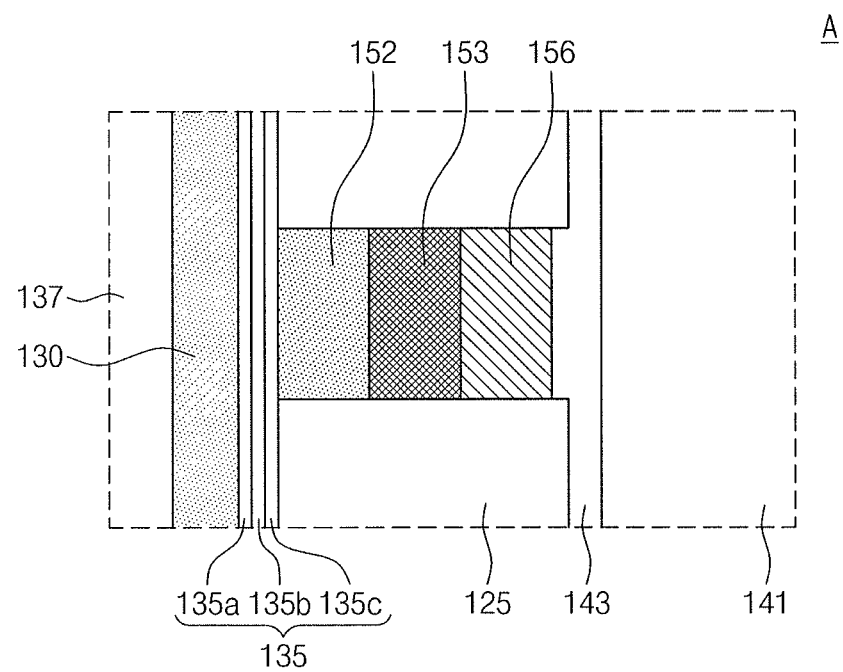

Referring to FIGS. 31A and 31B, the other portion of the first metal layer 154 may not be participated in the reaction with the silicon layer and may remain as a residue. The residue of the first metal layer 154 may be removed using, for example, aqua regia (containing nitric and hydrochloric acid) or sulfuric acid solution.

Thereafter, the insulating spacer 143 may be formed on the sidewall of the separation trench 141. The formation of the insulating spacer 143 may include depositing a silicon oxide layer or a silicon nitride layer on an inner surface of the separation trench 141 and then anisotropically etching the same.

Figure 32A:
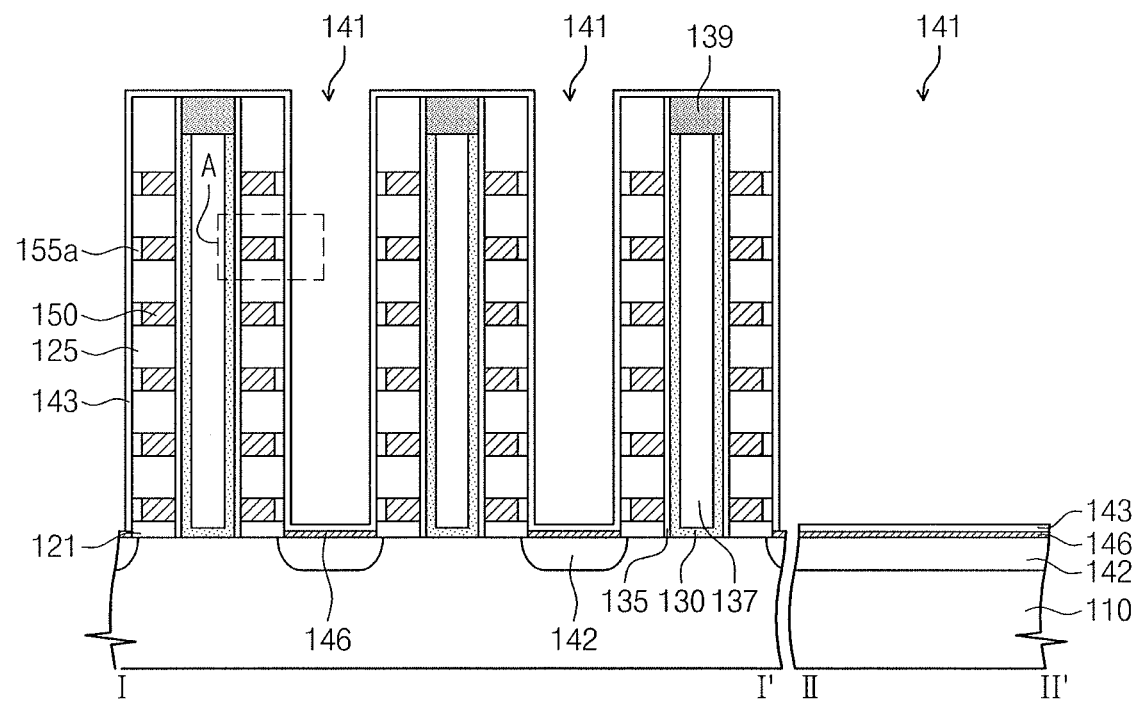
Figure 32B:
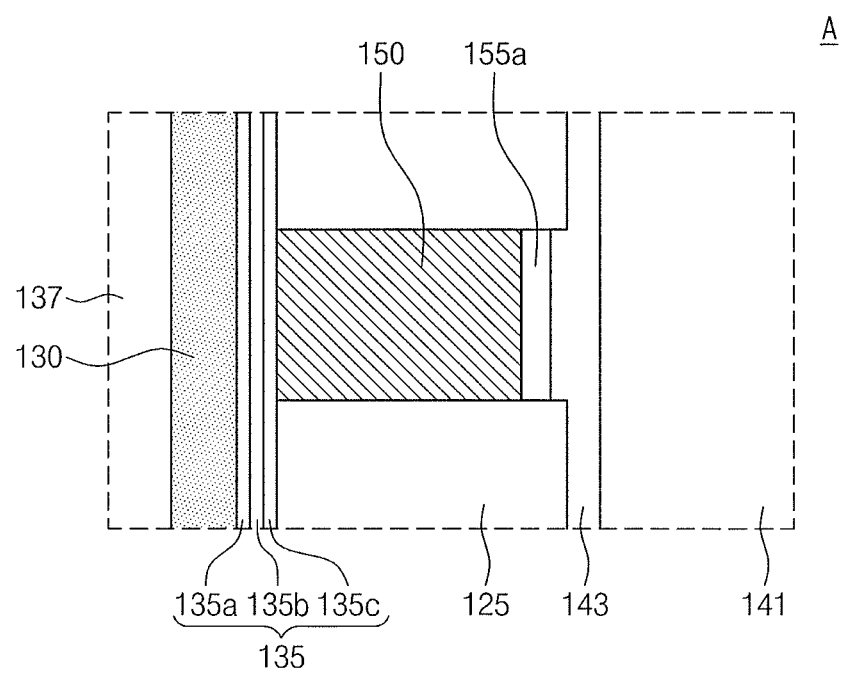

Referring to FIGS. 32A and 32B, the gate pattern 150 may be formed using, for example, the method described with reference to FIGS. 13A and 13B. Further, the air gap 155a may be formed between the gate pattern 150 and the insulating spacer 143. The gate pattern 150 may be spaced apart from the insulating spacer 143 with the air gap 155a interposed therebetween. Each of the gate electrodes G1-G6 may include the gate pattern 150.

The common contact layers 146 may be formed on the substrate 110 exposed by the separation trench 141 using, for example, a silicidation process. The common contact layers 146 may be silicide layers having the mono metal silicide phase.

Figure 33A:
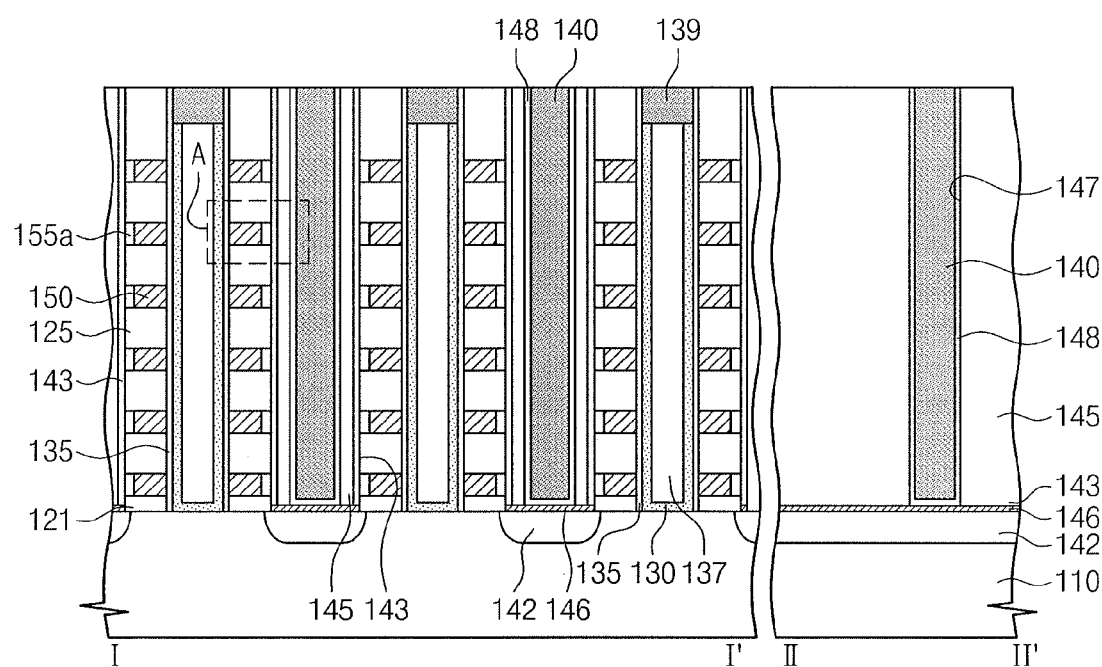
Figure 33B:
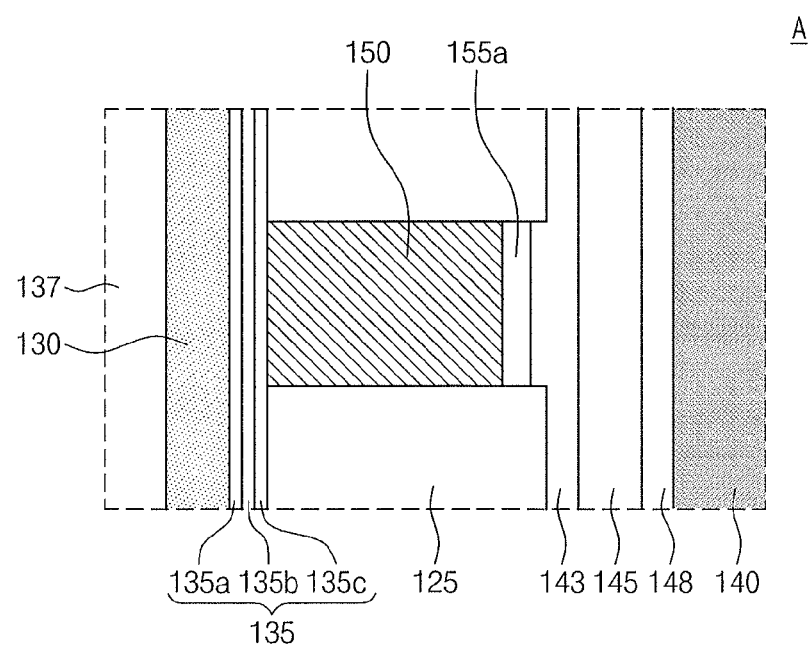

Referring to FIGS. 33A and 33B, the device isolation pattern 145 may be formed to fill the separation trench 141. The device isolation pattern 145 may be formed to extend parallel to the first direction. The device isolation pattern 145 may include a silicon oxide layer. In certain embodiments, the device isolation pattern 145 may be formed to have a top surface coplanar with the uppermost one of the inter-gate insulating patterns 125.

Referring back to FIGS. 23A and 23B, the strapping plugs 140, the strapping line 160, and the bit lines BL may be formed by the process of the previous embodiments described above.

In example embodiments, as shown in FIG. 14C, the gate pattern 150 may include the first sub-gate pattern 150a and the second sub-gate pattern 150b. The silicidation process may be performed in such a way that a portion of the silicon layer 152 and the first metal layer 154 are participated in the reaction for forming the metal silicide layer, and the other portion of the silicon layer 152 may remain.

In the present embodiment, the diffusion barrier structure 150 may be formed using a process different from that described with reference to FIGS. 15A through 21B.

Hereinafter, other structures of the data storing element 135 will be exemplarily described with reference to FIGS. 34A through 34I. FIGS. 34A through 34I illustrate enlarged sectional views, each of which illustrates the portion A of FIG. 4C or FIG. 22C.

In example embodiments, each of the vertical pillars 130 may be a pillar-shaped structure including a semiconductor material. The vertical pillars 130 may be used as active channels of the cell strings.

Figure 34A:
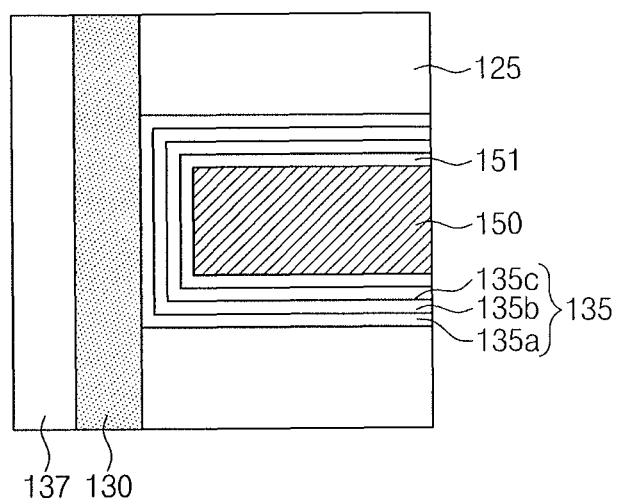
FIGS. 34A through 34I illustrate enlarged sectional views, each of which illustrates the portion A of FIG. 4C or FIG. 22C.

As an example, as shown in FIG. 34A, the data storing element 135 may include the blocking insulating layer 135c adjacent to the gate pattern 150, the tunnel insulating layer 135a adjacent to the vertical pillars 130, and the charge storing layer 135b therebetween. The data storing element 135 may be extended into a region between the gate pattern 150 and the inter-gate insulating patterns 125. The blocking insulating layer 135c may include a high-k dielectric (e.g., aluminum oxide or hafnium oxide). The blocking insulating layer 135c may be a multi-layered structure including a plurality of thin-films. For example, the blocking insulating layer 135c may include an aluminum oxide layer and/or a hafnium oxide layer, and a stacking order or position of the aluminum oxide layer and the hafnium oxide layer may be variously changed. The charge storing layer 135b may be a charge trap layer or an insulating layer containing conductive nano particles. The charge trap layer may include, for example, a silicon nitride layer. The tunnel insulating layer 135a may include a silicon oxide layer.

Figure 34B:
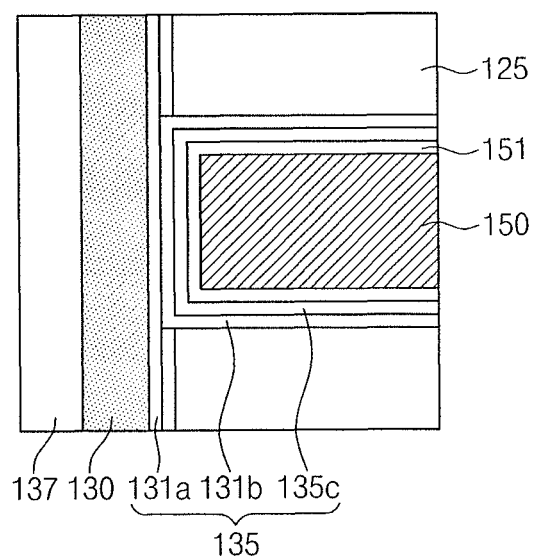
Figure 34C:
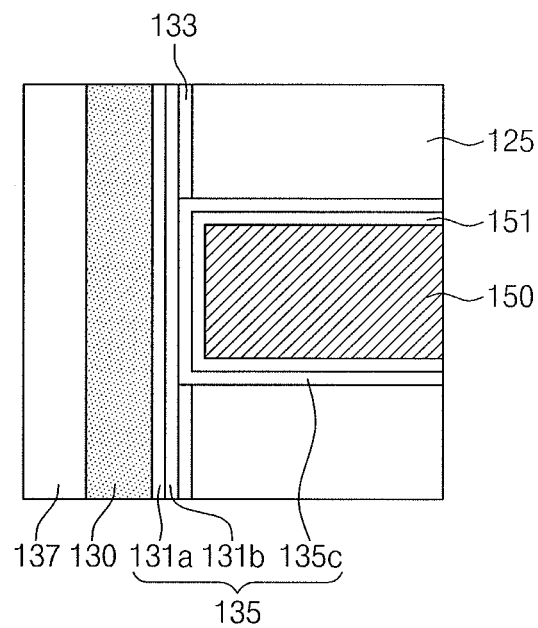
Figure 34D:
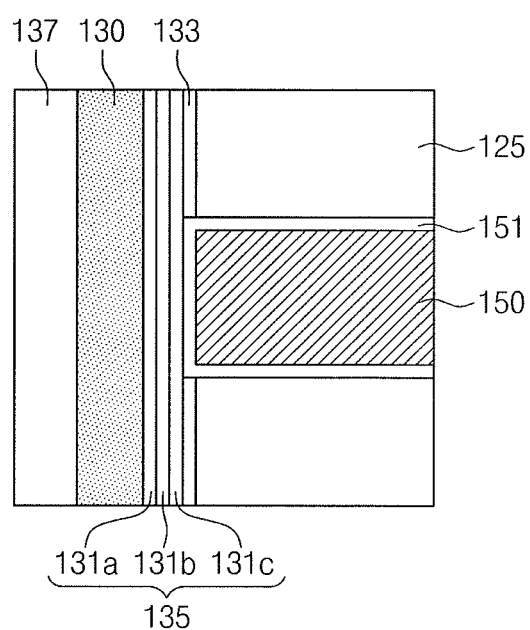

In other embodiments, as shown in FIGS. 34B through 34D, at least a portion of the data storing element 135 may be extended between the inter-gate insulating patterns 125 and the vertical pillars 130. As shown in FIG. 34B, the tunnel insulating layer 135a may be extended into a region between the inter-gate insulating patterns 125 and the vertical pillar 130, and the charge storing layer 135b and the blocking insulating layer 135c may be extended into a region between the inter-gate insulating patterns 125 and the gate pattern 150. As shown in FIG. 34C, the tunnel insulating layer 135a and the charge storing layer 135b may be extended into a region between the inter-gate insulating patterns 125 and the vertical pillar 130, and the blocking insulating layer 135c may be extended into a region between the inter-gate insulating patterns 125 and the gate pattern 150. As shown in FIG. 34D, the tunnel insulating layer 135a, the charge storing layer 135b, and the blocking insulating layer 135c may be extended into a region between the inter-gate insulating patterns 125 and the vertical pillar 130.

Figure 34E:
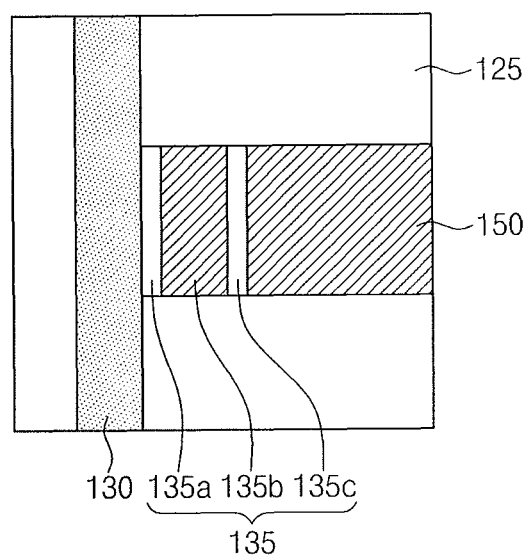

Unlike the above examples, as shown in FIG. 34E, the charge storing layer 135b may include a polysilicon layer, and the charge storing layer 135b and the blocking insulating layer 135c may be provided in a localized region between the gate pattern 150 and the vertical pillars 130.

Figure 34F:
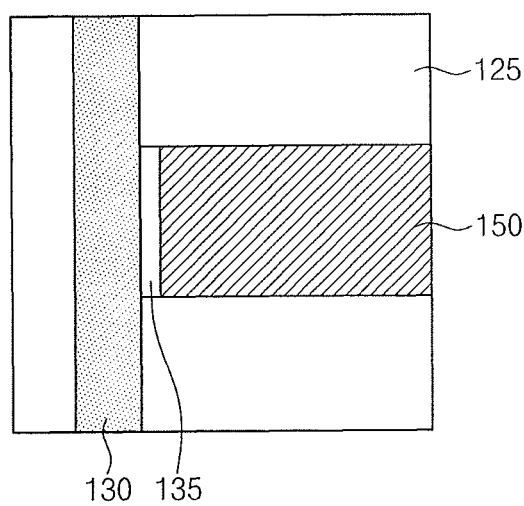
Figure 34G:
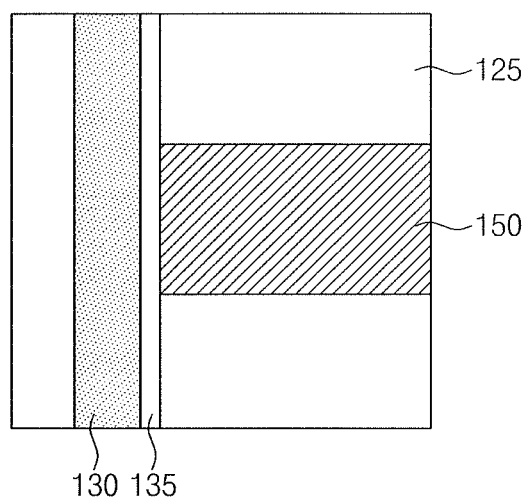
Figure 34H:
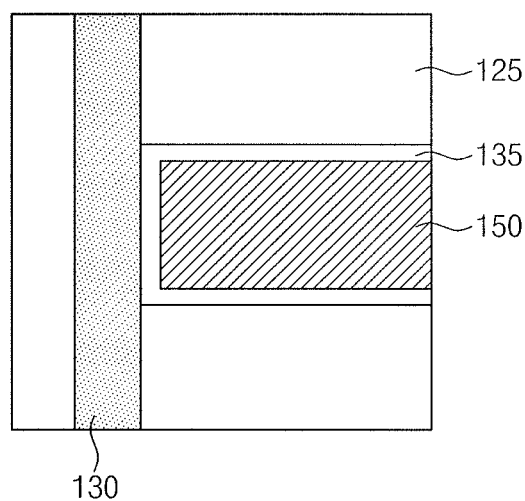

In another aspect, the vertical pillars 130 may be conductive pillars. The vertical pillars 130 may include at least one of conductive materials, e.g., doped semiconductors, metals, conductive metal nitrides, silicides, or nanostructures (such as carbon nanotube or graphene). As shown in FIG. 34F, the data storing element 135 may be locally disposed between the gate pattern 150 and the vertical pillars 130. As shown in FIGS. 34G and 34H, the data storing element 135 may be extended between the inter-gate insulating patterns 125 and the vertical pillars 130 or between the inter-gate insulating patterns 125 and the gate pattern 150, and the data storing element 135 may be variable resistance pattern. The variable resistance pattern may include at least one of materials exhibiting a variable resistance property. Hereinafter, examples of a variable resistance pattern used as the data storing element 135 will be explained below.

As an example, the data storing element 135 may include a material (for example, a phase-changeable material), whose electric resistance may be changed using thermal energy applied thereto. The thermal energy may be generated by an electric current passing through an electrode adjacent to the data storing element 135. The phase-changeable material may be a material including at least one of antimony (Sb), tellurium (Te), or selenium (Se). For example, the phase-changeable material may include a chalcogenide formed of tellurium (Te) having about 20 to about 80 atomic percent concentration, antimony (Sb) having about 5 to about 50 atomic percent concentration, and germanium (Ge) having the remaining concentration. In addition, the phase-changeable material may further include impurities of at least one of N, O, C, Bi, In, B, Sn, Si, Ti, Al, Ni, Fe, Dy, or La. In certain embodiments, the variable resistance pattern may be formed of one of GeBiTe, InSb, GeSb, and GaSb.

As other example, the data storing element 135 may be configured to have a layered structure whose electric resistance may be changed using a spin transferring phenomenon of an electric current flowing therethrough. For example, the data storing element 135 may be a layered structure exhibiting a magneto-resistance property and may be configured to include at least one ferromagnetic material and/or at least one antiferromagnetic material.

As still other example, the data storing element 135 may include at least one of Perovskite compounds or transition metal oxides. For example, the data storing element 135 may include at least one of niobium oxide, titanium oxide, nickel oxide, zirconium oxide, vanadium oxide, PCMO((Pr,Ca) MnO$_3$), strontium-titanium oxide, barium-strontium-titanium oxide, strontium-zirconium oxide, barium-zirconium oxide, or barium-strontium-zirconium oxide.

Figure 34I:
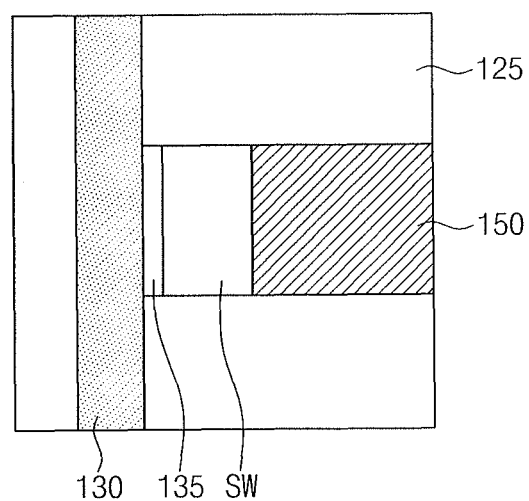

According to example embodiments, as shown in FIG. 34I, a switching element SW may be interposed between the data storing element 135 and the gate pattern 150. The switching element SW may be formed of a material exhibiting a self-rectifying property or a nonlinear current-voltage property. For example, the switching element SW may be a pn-junction diode.

In the cases of the previous embodiments described with reference to FIGS. 23A through 33B, the data storing element 135 may have one of the structures illustrated in FIGS. 34F, 34G, and 34I.

Figure 35:
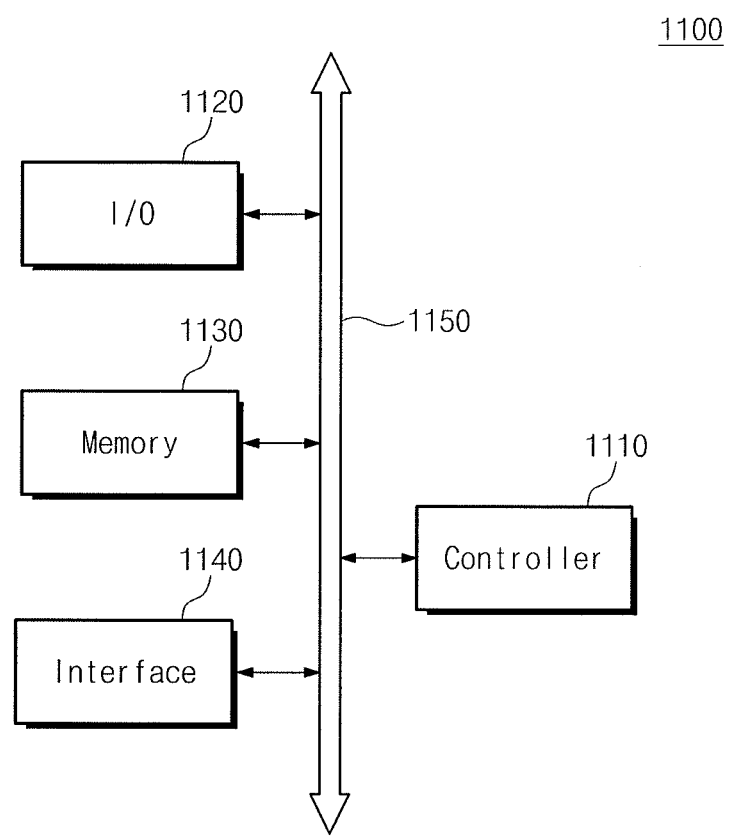
FIG. 35 illustrates a schematic block diagram of an example of electronic systems including a semiconductor device according to example embodiments.

FIG. 35 illustrates a schematic block diagram of an example of electronic systems including a semiconductor device according to example embodiments.

Referring to FIG. 35, an electronic system 1100 according to example embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted. The memory device 1130 may be configured to include one of semiconductor devices according to example embodiments.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast dynamic random-access memory (DRAM) device and/or a fast static random-access memory (SRAM) device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 36:
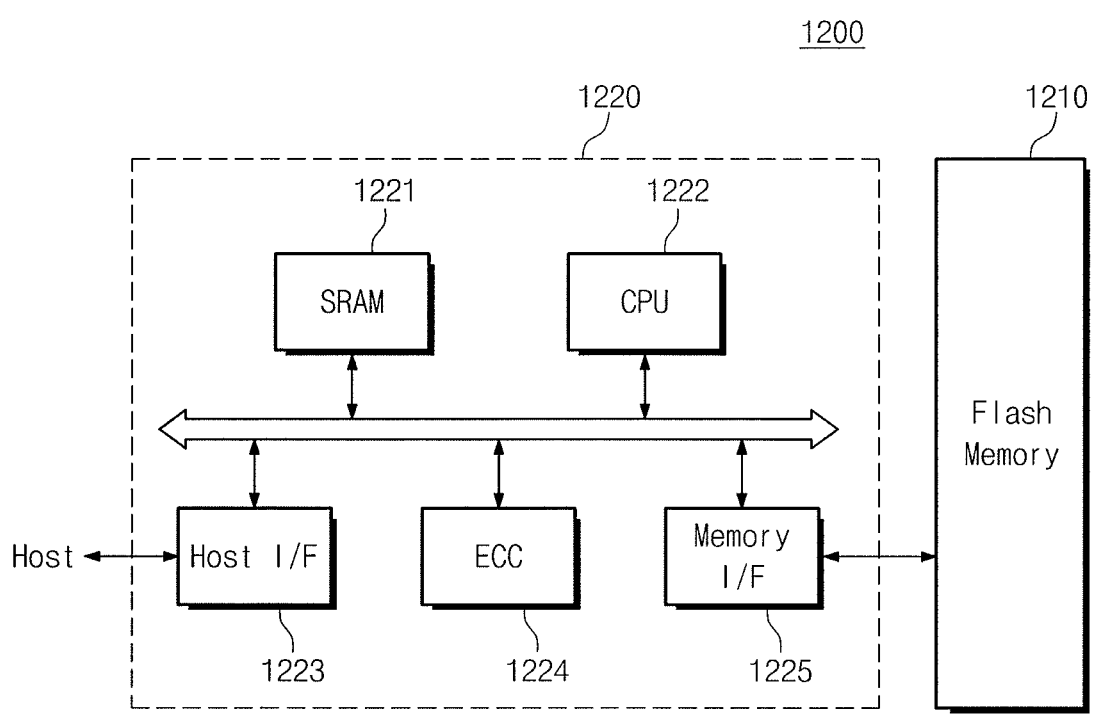
FIG. 36 illustrates a schematic block diagram of an example of memory systems including the semiconductor devices according to the embodiments.

FIG. 36 illustrates a schematic block diagram of an example of memory systems including the semiconductor devices according to the embodiments.

Referring to FIG. 36, a memory system 1200 according to example embodiments may include a memory device 1210. The memory device 1210 may include at least one of the semiconductor devices according to the afore-described embodiments. In other embodiments, the memory device 1210 may further include a semiconductor memory device, which is of a different type from the semiconductor memory devices according to the afore-described embodiments. For example, the memory device 1210 may further include a nonvolatile memory device and/or a SRAM device. The memory system 1200 may include a memory controller 1220 that controls data communication between a host and the memory device 1210. The memory device 1210 and/or the memory controller 1220 may be configured to include at least one of the semiconductor devices according to example embodiments.

The memory controller 1220 may include a processing unit 1222 that controls overall operations of the memory system 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. In an embodiment, the memory system 1200 may be provided in the form of solid state disks (SSD), instead of hard disks of computer systems.

Figure 37:
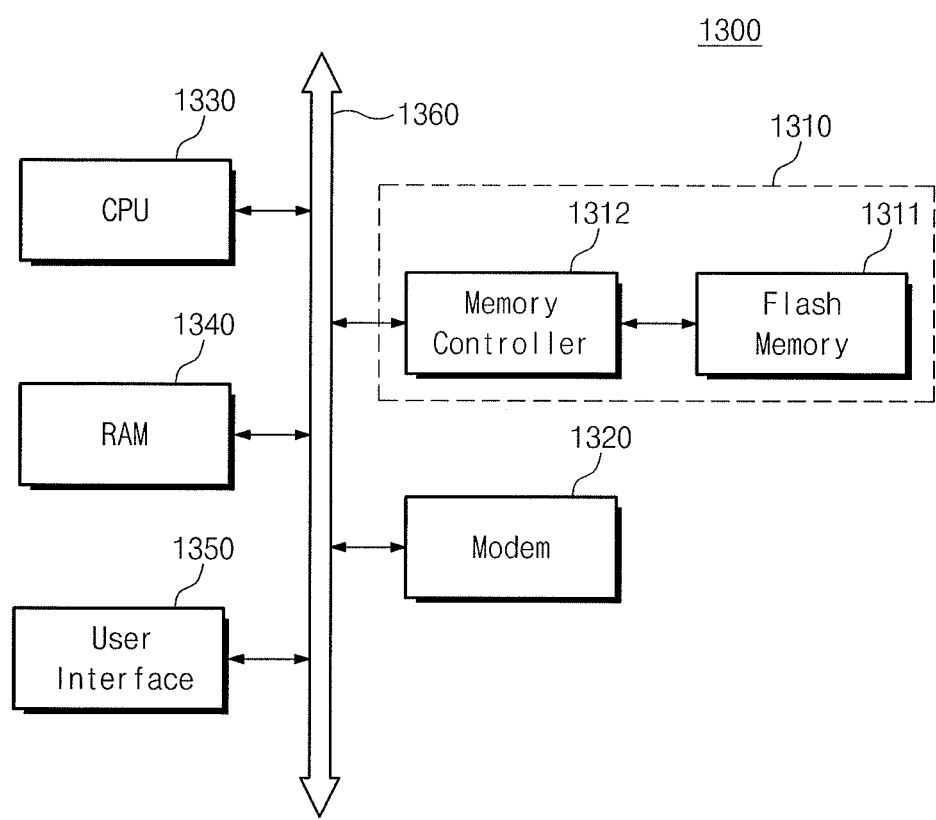
FIG. 37 illustrates a schematic block diagram of an example of information processing systems including a semiconductor device according to example embodiments.

FIG. 37 illustrates a schematic block diagram of an example of information processing systems including a semiconductor device according to example embodiments.

Referring to FIG. 37, an information processing system 1300 includes a memory system 1310, which may include at least one of the semiconductor devices according to example embodiments. In certain embodiments, the information processing system 1300 may be used to realize a mobile device or a desktop computer. The information processing system 1300 also includes a modem 1320, a central processing unit (CPU) 1330, a random-access memory (RAM) 1340, and a user interface 1350, which may be electrically connected to the memory system 1310 via a system bus 1360. The memory system 1310 may have the same configuration as that of the memory system 1200 described above. The memory system 1310 may include a memory device 1311 and a memory controller 1312 controlling an overall operation of the memory device 1311. Data processed by the CPU 1330 and/or input from the outside may be stored in the memory system 1310. The memory system 1310 may be provided as a solid state drive SSD, and the information processing system 1300 may be able to reliably store a large amount of data in the memory system 1310. The increase in reliability enables the memory system 1310 to conserve resources for error correction and realize a high speed data exchange function. Although not shown in the drawing, it will be apparent to those of skill in the art that the information processing system 1300 may be also configured to include an application chipset, a camera image processor (CIS), and/or an input/output device.

According to example embodiments, a vertical-type semiconductor device may include a diffusion barrier structure that is configured to prevent a conductive material from being diffused from a gate electrode into a device isolation pattern. Owing to the presence of the diffusion barrier structure, it is possible to improve electric insulating properties of inter-gate insulating patterns, an insulating spacer, and/or a device isolation pattern, and improve leakage current properties between the gate electrodes and between the gate electrodes and strapping plugs.

By way of summation and review, to realize a high density VNAND device, it may be necessary to increase the number of layers constituting a mold stack. To reduce a technical difficulty of a fabrication process, it may be necessary to reduce a total thickness of the mold stack, for example, by reducing a thickness of each word line (WL), which may result in a technical issue, such as an increase in sheet resistance of the word line. Thus, a low resistance material such as silicide (e.g., $NiSi_x$, $CoSi_x$, $TiSi_x$, or $WSi_x$) may be considered as a material for the word line.

A layer of $SiO_2$ or SiN, metal elements (e.g., Ni, Co, or Ti) contained in the silicide have diffusivity higher than that of tungsten, and the use of such a material may lead to several technical problems that do not occur when tungsten is used for the word line. For example, an insulating layer of $SiO_2$ or SiN may be used to prevent an electric current flow between the word lines, but the metal elements may diffuse into the insulating layer, and a leakage current between WLs or between a WL and a contact may increase, which may lead to a failure in an insulation property of the insulating layer (e.g., breakdown voltage drop).

For a VNAND device including WLs made of silicide, the silicide or the metallic element therein may diffuse into a spacer insulating layer, when a subsequent process is performed and a product is used. NiSi may diffuse into the word line of the fabricated product. The silicide and the metallic element may diffuse into the insulating layer, and the VNAND device may suffer from deterioration in product property (e.g., leakage current).

Example embodiments may provide vertical-type semiconductor devices with improved reliability.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    gate structures on a substrate, the gate structures extending parallel to a first direction and being spaced apart from each other by a separation trench interposed therebetween, each of the gate structures including insulating patterns stacked on the substrate and a gate electrode interposed therebetween;
    vertical pillars connected to the substrate through the gate structures;
    an insulating spacer in the separation trench covering a sidewall of each of the gate structures; and
    a diffusion barrier structure between the gate electrode and the insulating spacer, wherein the diffusion barrier structure includes an air gap between the gate electrode and the insulating spacer.

2. The device as claimed in claim 1, further comprising:
    a common source region in a portion of the substrate located below the separation trench; and
    a strapping plug in the separation trench extending from the common source region to a top level of the gate structures, wherein the insulating spacer is between the sidewalls of the gate structures and the strapping plug.

3. The device as claimed in claim 2, wherein the strapping plug is a bar-shaped structure extending in the first direction, when viewed in a plan view.

4. The device as claimed in claim 2, wherein the strapping plug includes a metal nitride layer and a tungsten layer on the metal nitride layer.

5. The device as claimed in claim 1, wherein the insulating spacer includes a silicon oxide layer, a silicon oxynitride layer, a silicon nitride layer, and/or an aluminum oxide layer.

6. The device as claimed in claim 1, wherein the gate electrode includes a conductive layer.

7. The device as claimed in claim 6, wherein the conductive layer has a side surface that is laterally spaced apart from sidewalls of the insulating patterns.

8. The device as claimed in claim 6, wherein the conductive layer includes a barrier layer and a layer that is made of metal silicide or tungsten and is in contact with the barrier layer.

9. The device as claimed in claim 8, wherein the diffusion barrier structure has a portion that is farther from the sidewalls of the insulating patterns than a side surface of the barrier layer adjacent to the sidewalls of the insulating patterns.

10. The device as claimed in claim 1, wherein the diffusion barrier structure is self-aligned with the gate electrode.

11. A semiconductor device, comprising:
vertical stacks of alternating insulating patterns and electrodes on a substrate;
pillars connected to the substrate through the stacks;
a trench interposed horizontally between the stacks;
an insulator in the trench covering a sidewall of each of the stacks; and
a spacer between each electrode and the insulator, wherein the spacer includes an air gap between at least one of the electrodes and the insulator.

* * * * *